US010264199B2

(12) United States Patent
Takayanagi et al.

(10) Patent No.: US 10,264,199 B2
(45) Date of Patent: Apr. 16, 2019

(54) SOLID-STATE IMAGING DEVICE, METHOD FOR PRODUCING SOLID-STATE IMAGING DEVICE, AND ELECTRONIC APPARATUS USING PHOTOELECTRIC CONVERSION ELEMENTS

(71) Applicant: Brillnics Inc., Grand Cayman (KY)

(72) Inventors: Isao Takayanagi, Tokyo (JP); Shunsuke Tanaka, Tokyo (JP); Kazuya Mori, Tokyo (JP); Katsuhiko Ariyoshi, Tokyo (JP); Shinichiro Matsuo, Tokyo (JP)

(73) Assignee: BRILLNICS INC., Grand Cayman (KY)

( * ) Notice: Subject to any disclaimer, the term of this patent is extended or adjusted under 35 U.S.C. 154(b) by 119 days.

(21) Appl. No.: 15/326,122

(22) PCT Filed: Jul. 9, 2015

(86) PCT No.: PCT/JP2015/069775
§ 371 (c)(1),
(2) Date: Jan. 13, 2017

(87) PCT Pub. No.: WO2016/009942
PCT Pub. Date: Jan. 21, 2016

(65) Prior Publication Data
US 2017/0230598 A1 Aug. 10, 2017

(30) Foreign Application Priority Data
Jul. 15, 2014 (JP) .................................. 2014-145255

(51) Int. Cl.
*H04N 5/378* (2011.01)
*H01L 27/146* (2006.01)
(Continued)

(52) U.S. Cl.
CPC ......... *H04N 5/378* (2013.01); *H01L 27/1464* (2013.01); *H01L 27/1469* (2013.01);
(Continued)

(58) Field of Classification Search
CPC ....................................................... H04N 5/379
See application file for complete search history.

(56) References Cited

U.S. PATENT DOCUMENTS 6,303,923 B1 * 10/2001 Wadsworth ....... H01L 27/14634
250/208.1
6,452,149 B1 * 9/2002 Yamashita ........ H01L 27/14643
250/208.1
(Continued)

FOREIGN PATENT DOCUMENTS

CN 102386195 A 3/2012
JP 2011-204915 A 10/2011
(Continued)

OTHER PUBLICATIONS

Aoki, J., et al., "A Rolling-Shutter Distortion-Free 3D Stacked Image Sensor with-160dB Parasitic Light Sensitvity In-Pixel Storage Node", ISSCC 203, Session 27, Image Sensors, 27.3, pp. 482-484.
(Continued)

*Primary Examiner* — Cynthia Segura
(74) *Attorney, Agent, or Firm* — Westerman, Hattori, Daniels & Adrian, LLP

(57) ABSTRACT

A solid state imaging device has: a photosensitive part containing a plurality of charge transfer parts that transfer, in column units, the signal charges of a plurality of photoelectric conversion elements disposed in a matrix; a conversion/ output unit that converts, to an electrical signal, the signal charges forwarded by the charge transfer parts; a peripheral circuit part that performs a predetermined process with
(Continued)

respect to the electrical signals from the conversion/output part; a relay part that relays the forwarding to the peripheral circuit part of the electrical signal from the conversion/output part; a first substrate where a photosensitive part and the conversion/output part are formed; and a second substrate where the peripheral circuit part is formed. The first and second substrates are stacked together, and the relay part electrically connects the conversion/output part formed at the first substrate to the peripheral circuit part formed at the second substrate.

17 Claims, 40 Drawing Sheets

(51) Int. Cl.
    *H01L 27/148* (2006.01)
    *H04N 5/374* (2011.01)
    *H04N 5/372* (2011.01)
    *H04N 5/369* (2011.01)

(52) U.S. Cl.
    CPC .... *H01L 27/1485* (2013.01); *H01L 27/14623* (2013.01); *H01L 27/14634* (2013.01); *H01L 27/14636* (2013.01); *H01L 27/14643* (2013.01); *H01L 27/14689* (2013.01); *H01L 27/14812* (2013.01); *H01L 27/14818* (2013.01); *H01L 27/14887* (2013.01); *H04N 5/372* (2013.01); *H04N 5/374* (2013.01); *H04N 5/379* (2018.08)

(56) References Cited

U.S. PATENT DOCUMENTS

| | | | | |
|---|---|---|---|---|
| 2004/0095495 A1* | 5/2004 | Inokuma | H04N 5/2253 | 348/308 |
| 2006/0220673 A1* | 10/2006 | Hiranuma | H01L 23/498 | 326/27 |
| 2007/0063234 A1* | 3/2007 | Itonaga | H01L 27/14632 | 257/291 |
| 2008/0042046 A1* | 2/2008 | Mabuchi | H01L 27/14634 | 250/208.1 |
| 2008/0088014 A1* | 4/2008 | Adkisson | H01L 27/14618 | 257/737 |
| 2008/0117322 A1* | 5/2008 | Tokuoka | H01L 27/14837 | 348/311 |
| 2010/0002121 A1 | 1/2010 | Fujioka | | |
| 2010/0140732 A1* | 6/2010 | Eminoglu | H01L 27/14634 | 257/447 |
| 2011/0215435 A1* | 9/2011 | Wakimoto | H01L 21/78 | 257/504 |
| 2011/0233702 A1 | 9/2011 | Takahashi et al. | | |
| 2012/0056251 A1 | 3/2012 | Kudoh | | |
| 2012/0057056 A1* | 3/2012 | Oike | H01L 27/14634 | 348/294 |
| 2012/0248580 A1 | 10/2012 | Matsugai et al. | | |
| 2012/0307030 A1* | 12/2012 | Blanquart | H01L 27/14601 | 348/76 |
| 2013/0092820 A1 | 4/2013 | Takemoto | | |
| 2013/0100326 A1* | 4/2013 | Ueno | H03F 3/72 | 348/300 |
| 2013/0107091 A1* | 5/2013 | Teshima | H04N 5/365 | 348/300 |
| 2014/0077063 A1* | 3/2014 | Cho | H01L 27/14618 | 250/208.1 |
| 2014/0176770 A1* | 6/2014 | Kondo | H01L 27/14634 | 348/294 |
| 2015/0163403 A1* | 6/2015 | Wakabayashi | H04N 5/378 | 348/308 |
| 2015/0194457 A1* | 7/2015 | Soda | H01L 27/14636 | 257/231 |
| 2015/0326811 A1* | 11/2015 | Nishida | H04N 5/378 | 348/308 |
| 2016/0014363 A1* | 1/2016 | Kito | H04N 5/378 | 348/308 |
| 2016/0344959 A1* | 11/2016 | Mabuchi | H01L 27/14632 | |
| 2017/0162625 A1* | 6/2017 | Takayanagi | H01L 27/14 | |
| 2017/0214864 A1* | 7/2017 | Izuha | H04N 5/341 | |

FOREIGN PATENT DOCUMENTS

| | | |
|---|---|---|
| JP | 2012-204810 A | 10/2012 |
| JP | 2013-90127 A | 5/2013 |

OTHER PUBLICATIONS

International Search Report dated Oct. 13, 2015, issued in counterpart application No. PCT/JP2015/069775. (1 page).
Office Action dated Dec. 25, 2018, issued in counterpart Taiwanese Application No. 104122694. (9 pages).
Office Action dated Dec. 25, 2018, issued in counterpart Chinese Application No. 201580038284.6, with English translation. (16 pages).

* cited by examiner

FIG. 7
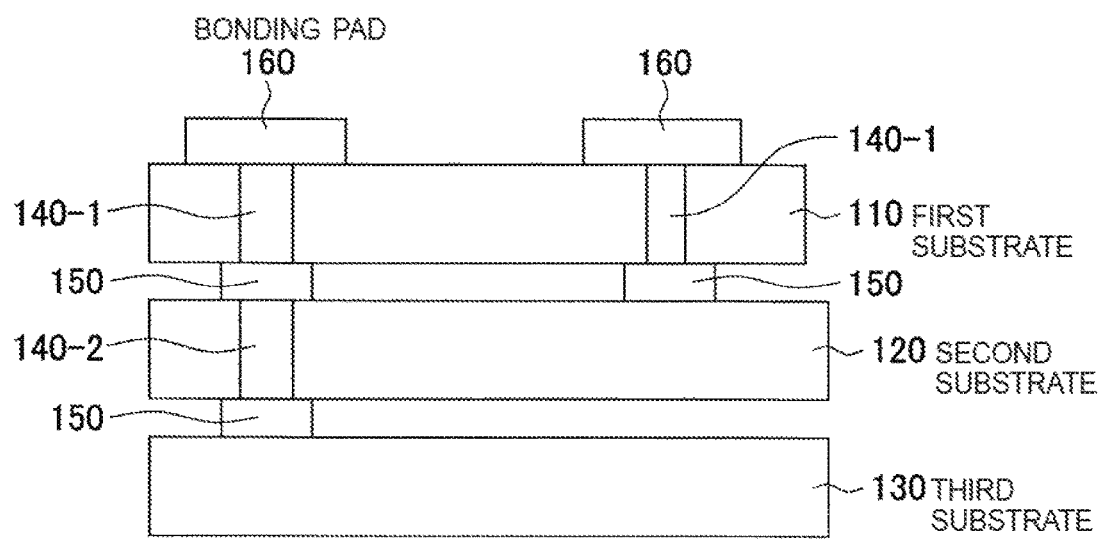
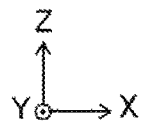

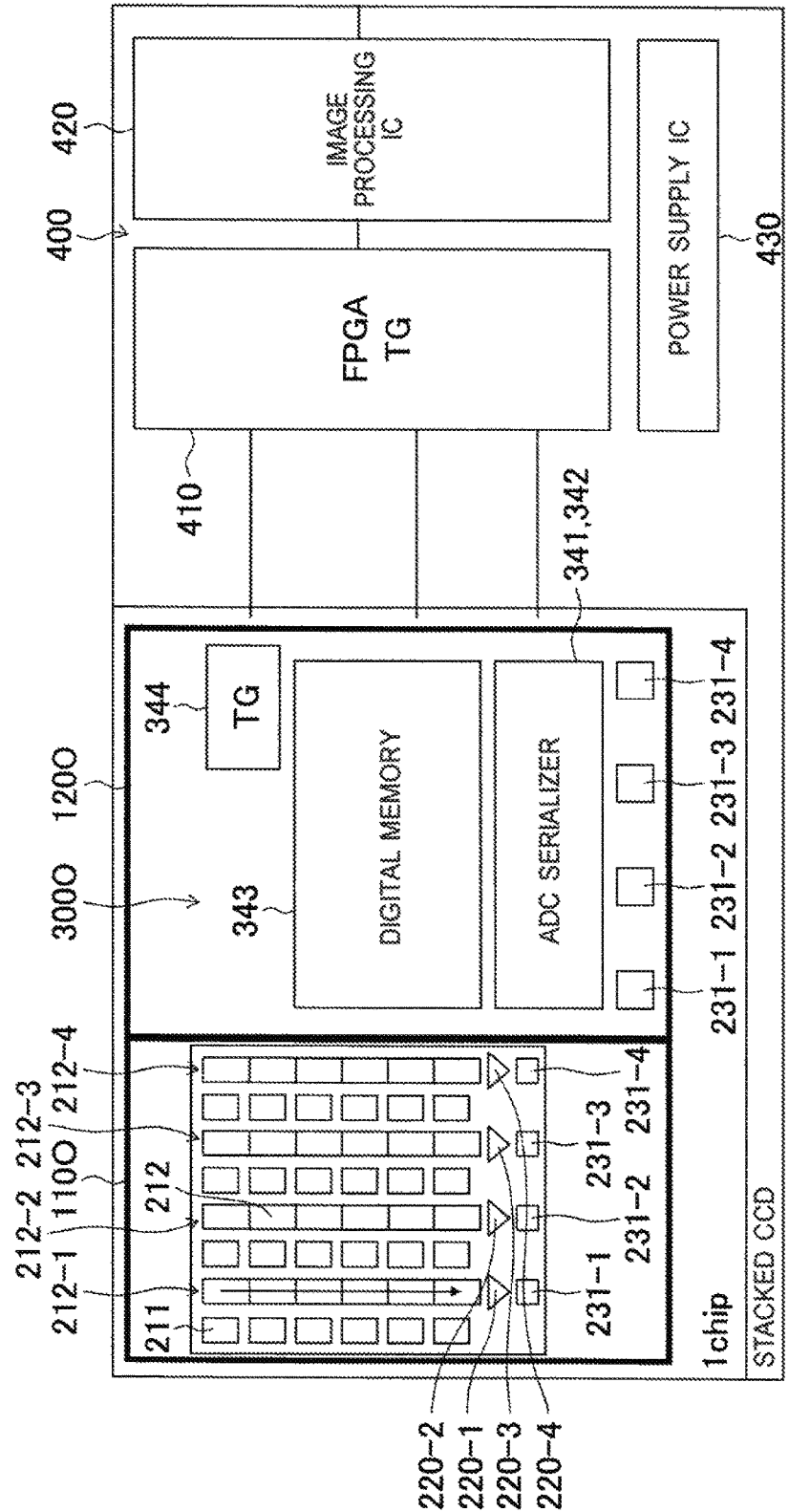

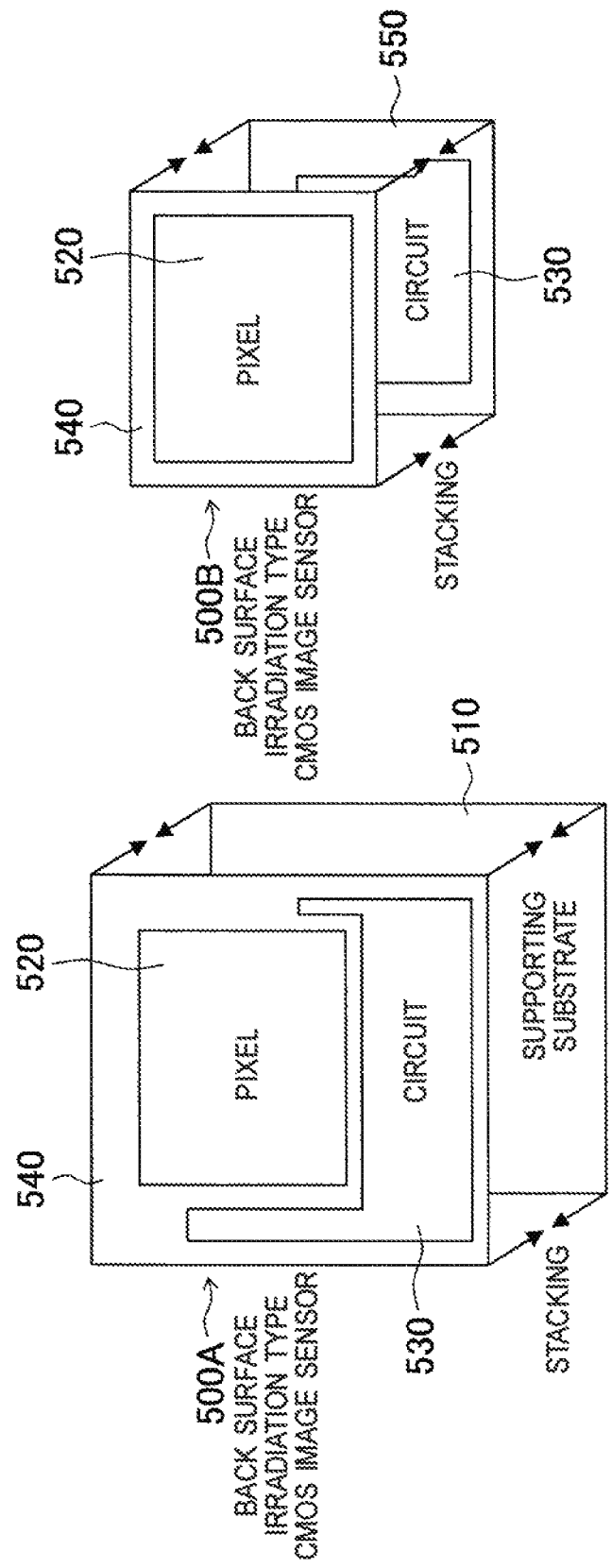

SOLID-STATE IMAGING DEVICE, METHOD FOR PRODUCING SOLID-STATE IMAGING DEVICE, AND ELECTRONIC APPARATUS USING PHOTOELECTRIC CONVERSION ELEMENTS

TECHNICAL FIELD

The present invention relates to a solid-state imaging device using a photoelectric conversion element which detects light and generates a charge, a method for producing a solid-state imaging device, and an electronic apparatus.

BACKGROUND ART

As a solid-state imaging device (image sensor) using a photoelectric conversion element which detects light and generates a charge, a CCD (charge coupled device) image sensor and CMOS (complementary metal oxide semiconductor) image sensor have been put to practical use. CCD image sensors and CMOS image sensors are widely applied as portions of digital cameras, video cameras, monitoring cameras, medical endoscopes, personal computers (PC), mobile phones and other portable terminal devices (mobile devices), and other various types of electronic apparatuses.

A CCD image sensor and CMOS image sensor use photodiodes for the photoelectric conversion elements, but differ in methods of transferring photoelectrically converted signal charges. A CCD image sensor transfers signal charges to an output part by a vertical transfer part (vertical CCD, VCCD) and horizontal transfer part (horizontal CCD, HCCD) then converts them to electrical signals which it then amplifies. Contrary to this, a CMOS image sensor amplifies charges converted for each pixel including a photodiode and outputs them as readout signals.

Below, the basic configurations of a CCD image sensor and CMOS image sensor will be explained.

FIG. 1 is a view showing the basic configuration of an interline transfer (IT) type CCD image sensor.

An IT (interline transfer) type CCD image sensor 1 basically includes a photosensitive part 2, horizontal transfer part (horizontal CCD) 3, and output part 4. The photosensitive part 2 has a plurality of pixel portions 21 which are arranged in a matrix and convert incident light to signal charges having charge amounts in accordance with the light quantity thereof and vertical transfer parts (vertical CCD) 22 as shielded charge transfer parts which vertically transfer the signal charges of the plurality of pixel portions 21 in unit of columns. The horizontal CCD 3 horizontally transfers one line's worth of the signal charges which are shifted from the plurality of vertical CCDs 22 in order in a horizontal scanning period. The output part 4 includes a charge detection-use floating diffusion layer, that is, a "floating diffusion (FD)", for converting the transferred signal charges to signal voltages and outputs the signals obtained in the FD to a not shown signal processing system.

In this IT type CCD image sensor 1, the vertical CCD functions as an analog memory, repeats a line shift and a horizontal transfer by the horizontal CCD 3, and outputs the signals (frame signals) of all pixels in order from the output part 4.

This IT type CCD image sensor 1 has a structure enabling progressive reading (progressive scanning), but transfers the signal charges by the horizontal CCD 3, so high speed transfer is difficult.

FIG. 2 is a view showing the basic configuration of a frame interline transfer (FIT) type CCD image sensor.

The FIT (frame interline transfer) type CCD image sensor 1A is configured with shielded charge storage parts (storage parts) 5 arranged between the output stages of the vertical CCD 22 of the photosensitive part 2 in the IT type CCD image sensor 1 and the horizontal CCD 3. In the FIT type CCD image sensor 1A, all signal charges are transferred at the same time from the vertical CCD 22 of the photosensitive part 2 which received the signal charges (bundle) from the pixel portions 21 to the completely shielded storage parts 5 by high speed frame transfer.

In this way, in the FIT type CCD image sensor 1A, the signal charges read out from the pixel portions 21 in the photosensitive part 2 are transferred at the same time to the storage parts 5 by the vertical CCD 22. Therefore, compared with the IT type CCD image sensor 1 in FIG. 1, higher speed transfer is possible. However, an FIT type CCD image sensor 1A forms storage parts 5, therefore the chip area becomes about two times larger than an IT type CCD image sensor.

Note that, the CCD image sensor explained above features the possibility of global shutter reading simultaneously starting storage of photocharges for all pixels.

FIG. 3 is a view showing the basic configuration of a CMOS image sensor.

A CMOS image sensor 13 basically includes a photosensitive part comprised of a pixel array part 6, a row decoder (or row scanning circuit) 7, a column decoder (or horizontal scanning circuit) 8, an output part (output amplifier) 9, and column switches CSW. Further, in FIG. 3, LSL indicates row scanning lines, LSG indicates signal reading lines, and LTR indicates a transfer line.

In the CMOS image sensor 13, the pixel array part is configured arranging a plurality of pixels including photodiodes in a matrix. In the CMOS image sensor 1B, the pixels PXL in the pixel array part 6 are controlled by each row by row control signals (pulse signals) supplied from the row decoder 7. A signal which is output from a pixel PXL to the output signal line LSG is transmitted through a column switch CSW to the transfer line LTR by the column scan by the column decoder 8 and is output to the outside by the output part 9.

This CMOS image sensor 1B is structured so that high speed transfer of signals is possible, but global shutter reading cannot be carried out.

In this way, the CMOS image sensor basically is structured so that global shutter reading cannot be carried out, but a CMOS image sensor that employs a multilayer structure and enables global shutter reading has been proposed (see for example NPLT 1).

FIG. 4 is a view showing an example of the configuration of a CMOS image sensor employing a stacked architecture.

A CMOS image sensor 1C in FIG. 4 employs a stacked architecture in which a first substrate 11 and a second substrate 12 sandwich a shield layer 13. On the first substrate 11, a photodiode (photoelectric conversion element) array part 6-1 and a part 7-1 of the row scanning circuit 7 are formed. Further, on the second substrate 12, a storage node array 6-2, the remaining part 7-2 of the row scanning circuit 7, column buffers CBUF, horizontal scan circuit (column decoder) 8, output part 9, etc. are formed.

The characteristic feature of this CMOS image sensor 1C resides in elimination of the defect of general CMOS image sensors, i.e. the defect of the inability of global shutter reading.

CITATION LIST

Non-Patent Literature

NPLT 1: ISSCC 2013/SESSION 27/IMAGE SENSORS 27.3 "A Rolling-Shutter Distortion-Free 3D Stacked Image Sensor with-160 dB Parasitic Light Sensitivity In-Pixel Storage Node"

SUMMARY OF INVENTION

Technical Problem

The basic configurations of a CCD image sensor and CMOS image sensor were explained above. The CCD image sensor explained above has the characteristic feature of enabling global shutter reading for simultaneously starting storage of photocharges for all pixels.

However, although an IT type CCD image sensor 1 can perform progressive reading, it has the disadvantage it transfers signal charges by the horizontal CCD 3, so high speed transfer is difficult.

An FIT type CCD image sensor 1A can perform higher speed transfer compared with an IT type CCD image sensor 1. However, it forms storage parts 5, therefore the chip area becomes about 2 times larger than that of an IT type CCD image sensor.

Contrary to this, the CCD image sensor 1B in FIG. 3 can perform high speed transfer of signals, but has the disadvantage that global shutter reading is not possible.

The CMOS image sensor 1C in FIG. 4 has the characteristic feature of the elimination of the defect that the global shutter reading is impossible, but has the following disadvantage. The CMOS image sensor 1C, as disclosed in NPLT 1, has a configuration of selecting 4 pixels for reading. Therefore, global shutter reading in the exact meaning is not realized. In this way, in the CMOS image sensor 1C, strictly speaking, global shutter reading cannot be realized and simultaneous reading cannot be carried out, therefore it is difficult to completely eliminate motion blur at the time of shooting a moving body. Further, in the CMOS image sensor 1C, a parasitic capacitance increases due to pixel coupling, and a drop of detection gain is caused. Due to these matters, in the CMOS image sensor 1C, there is a tradeoff between global shutter reading and read gain, therefore many pixels become connected and readout is difficult. In other words, the CMOS image sensor 1C is restricted in addition of pixels. In the CMOS image sensor 1C, it is necessary to form bump structures in the pixel array in order to form a multilayer structure, therefore restriction of layout and dark current, white flaws, and other deterioration of pixel characteristics are liable to be caused. Further, the CMOS image sensor 1C has the defect that the kTC noise increases.

The present invention provides a solid-state imaging device in which high speed reading becomes possible with a small chip area, there is little restriction in layout, and white flaws and other deterioration of pixel characteristics can be suppressed, a method for producing the solid-state imaging device, and an electronic apparatus.

Solution to Problem

A solid-state imaging device of a first aspect of the present invention has a photosensitive part including a plurality of photoelectric conversion elements which are arranged in a matrix and a plurality of charge transfer parts which transfer the signal charges of the plurality of photoelectric conversion elements in unit of columns or rows, a conversion/output part, arranged in accordance with the number of columns or rows, which converts the signal charges transferred in the charge transfer parts to electrical signals and outputs the results, a peripheral circuit part which performs predetermined processing with respect to the electrical signals from the conversion/output part, a relay part which relays transfer of the electrical signals from the conversion/output part to the peripheral circuit part, a first substrate on which the photosensitive part and the conversion/output part are formed, and a second substrate on which the peripheral circuit part is formed, wherein at least the first substrate and the second substrate are stacked, and the relay part electrically connects the conversion/output part formed on the first substrate and the peripheral circuit part formed on the second substrate by a connecting part which passes through the substrates outside of the photosensitive region in the photosensitive part.

A method for producing a solid-state imaging device of a second aspect of the present invention has a step of forming, on a first substrate, a photosensitive part including a plurality of photoelectric conversion elements which are arranged in a matrix and a plurality of charge transfer parts which transfer signal charges of the plurality of photoelectric conversion elements in unit of columns or rows and a conversion/output part, arranged in accordance with the number of columns or rows, which converts the signal charges transferred in the charge transfer parts to electrical signals and outputs the results, a step of forming, on a second substrate, at least a peripheral circuit part which performs predetermined processing with respect to the electrical signals from the conversion/output part, and a step of, in a state where at least the first substrate and the second substrate are stacked, electrically connecting the conversion output part formed on the first substrate and the peripheral circuit part formed on the second substrate by a connecting part which passes through the substrates outside of the photosensitive region in the photosensitive part.

An electronic apparatus of a third aspect of the present invention has a solid-state imaging device, an optical system forming an image in a photosensitive part in the solid-state imaging device, and a signal processing part for processing output signals of the solid-state imaging device, wherein the solid-state imaging device has a photosensitive part including a plurality of photoelectric conversion elements which are arranged in a matrix and a plurality of charge transfer parts which transfer signal charges of the plurality of photoelectric conversion elements in unit of columns or rows, a conversion/output part, arranged in accordance with the number of columns or rows, which converts the signal charges transferred in the charge transfer parts to electrical signals and outputs the results, a peripheral circuit part which performs predetermined processing with respect to the electrical signals from the conversion/output part, a relay part which relays transfer of the electrical signals from the conversion/output part to the peripheral circuit part, a first substrate on which the photosensitive part and the conversion/output part are formed, and a second substrate on which the peripheral circuit part is formed, wherein at least the first substrate and the second substrate are stacked, and the relay part electrically connects the conversion/output part formed on the first substrate and the peripheral circuit part formed on the second substrate by a connecting part which passes through the substrates outside of the photosensitive region in the photosensitive part.

Advantageous Effect of Invention

According to the present invention, high speed reading becomes possible using a small chip area. In addition, there is little restriction in layout, and it becomes possible to suppress white flaws and another deterioration of pixel characteristics. Further, according to the present invention, it becomes possible to form a pixel portion by a CCD process having a good dark current characteristic. Further, miniaturization of pixels for global shutter becomes possible. Further, according to the present invention, a drive interface can be simplified. Further it is also possible to eliminate the horizontal CCD, therefore reduction of the consumed power becomes possible. Further, according to the present invention, increase of functions such as digital output conversion and on-chip signal processing becomes possible.

BRIEF DESCRIPTION OF DRAWINGS

FIG. 7 is a view schematically showing a second example of a stacked substrate structure of the solid-state imaging device according to the present embodiment.

FIG. 27 is a view for explaining an example of the configuration of a solid-state imaging device according to a third embodiment of the present invention.

FIGS. 28A and 28B are views showing comparative examples comprised of examples of the stacked structure of a back-surface irradiation type CMOS image sensor.

DESCRIPTION OF EMBODIMENTS

Below, embodiments of the present invention will be explained with reference to the drawings.

First Embodiment

Figure 5:
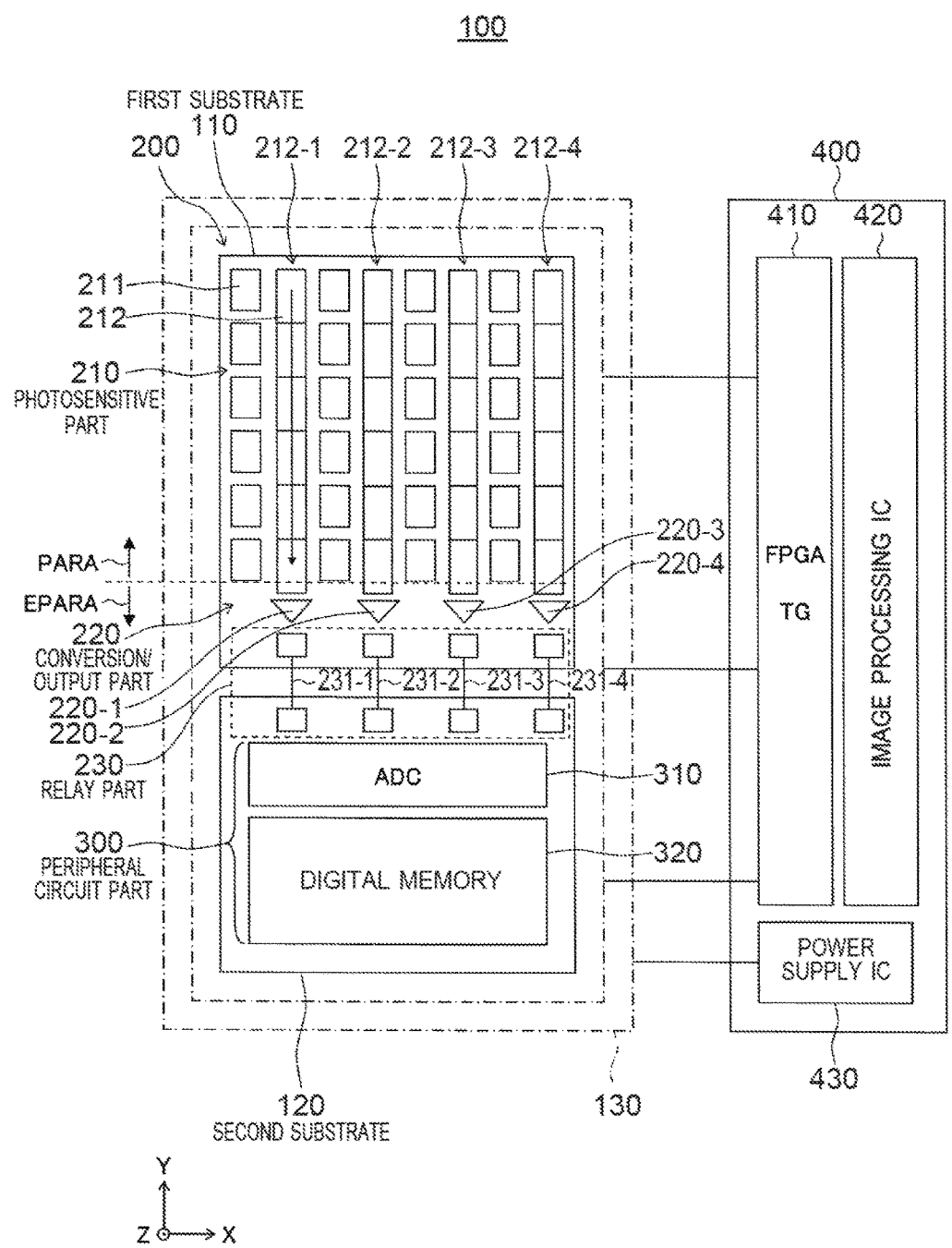
FIG. 5 is a view showing an example of the configuration of a solid-state imaging device according to a first embodiment of the present invention spread out flat.
Figure 6:
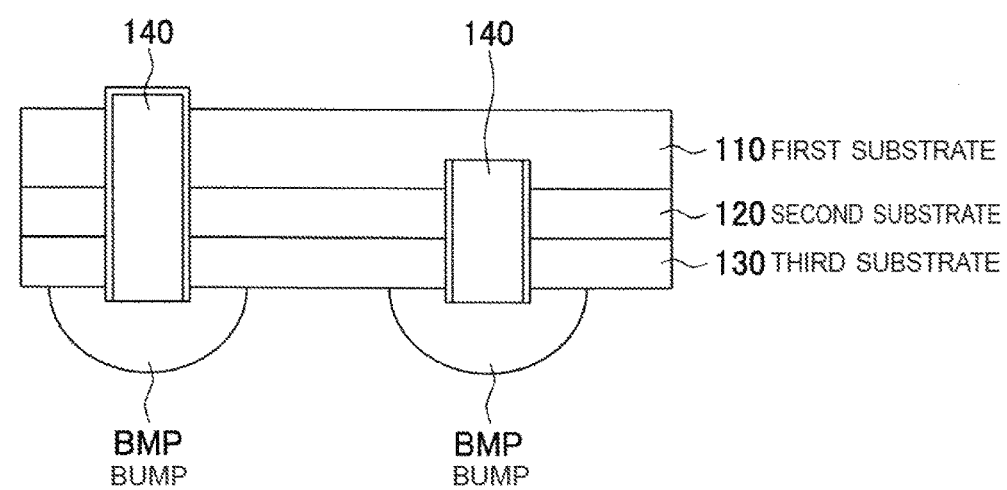
FIG. 6 is a view schematically showing a first example of a stacked substrate structure of the solid-state imaging device according to the present embodiment.
Figure 8:
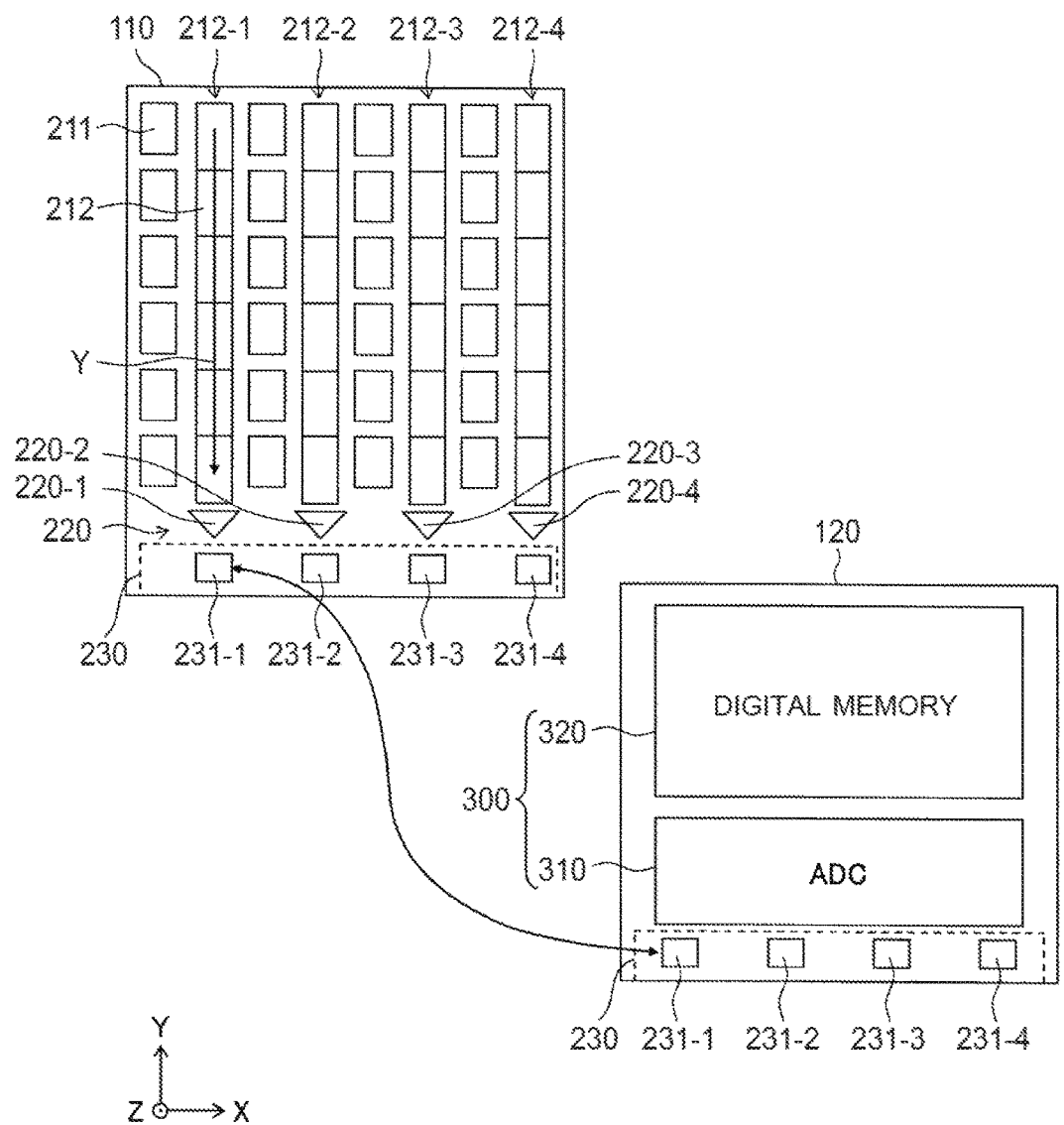
FIG. 8 is a view for explaining the actual relationship of arrangement of a photosensitive part on the first substrate and a peripheral circuit part on the second substrate which are stacked in the solid-state imaging device according to the first embodiment.

FIG. 5 is a view showing an example of the configuration of a solid-state imaging device according to a first embodiment of the present invention spread out flat. FIG. 6 is a view schematically showing a first example of a stacked substrate structure of the solid-state imaging device according to the present embodiment. FIG. 7 is a view schematically showing a second example of the stacked substrate structure of the solid-state imaging device according to the present embodiment. FIG. 8 is a view for explaining the relationship of arrangement between a photosensitive part on the first substrate and a peripheral circuit part on the second substrate which are stacked in the solid-state imaging device according to the first embodiment.

The solid-state imaging device 100 can be applied to an image sensor similar to for example an FIT (frame interline transfer) type CCD image sensor. However, the present solid-state imaging device 100 does not have the charge storage part (storage part) and horizontal transfer part (HCCD) which are provided in a usual FIT type CCD image sensor.

The solid-state imaging device 100 is structured having a first substrate 110, second substrate 120, and third substrate 130 stacked together. In the solid-state imaging device 100, for example, as shown in FIG. 6 and FIG. 7, the second substrate 120 is stacked on the third substrate 130, and the first substrate 110 is stacked on the second substrate 120. Note that, the stacked substrates are for example adhered to each other as shown in FIG. 6 or joined by pressure bonding or microbumps as shown in FIG. 7. Further, electrical connection among the substrates is realized by through-vias (Through Silicon Via: TSV) 140 or joint parts 150 such as microbumps and pressure bonding.

In the example in FIG. 6, electrical connection among the substrates is realized through the through-vias 140 which penetrate through the stacked first substrate 110, second substrate 120, and third substrate 130. Bumps BMP are joined to the exposed portions of the through-vias 140 on the third substrate 130 side.

In the example in FIG. 7, a through-via 140-1 is formed in the first substrate 110, and a through-via 140-2 is formed in the second substrate 120. The through-via 140-1 in the first substrate 110 and the through-via 140-2 in the second substrate 120 are joined by joint parts 150 formed by pressure bonding or microbumps. Further, bonding pads 160 are joined to the upper surface side exposed parts of the through-vias 140-1 in the first substrate 110.

Note that, in the present embodiment, the first substrate 110 is formed with an imaging element part 200 which is provided with the functions of storing and transferring the signal charges obtained by imaging, converting the signal charges to electrical signals, and outputting the results. The second substrate 120 is formed with a peripheral circuit part 300 which performs predetermined processing with respect to the electrical signals obtained by the imaging element part 200.

In FIG. 5 and FIG. 8, as the peripheral circuit part 300 formed (mounted) on the second substrate 120, an analog-to-digital converter (ADC) 310 for converting an analog electrical signal (analog data) output from the first substrate 110 side and relayed by the relay part 230 to a digital signal (digital data) and a digital memory 320 for storing the digital data after conversion is illustrated.

In the present embodiment, as the imaging element part 200, a photosensitive part 210 having an imaging function and a conversion/output part 220 for converting the signal charges transferred in the column direction in the photosensitive part 210 to electrical signals (voltage signals) are formed on the first substrate 110. Further, in the present embodiment, between the first substrate 110 and the second substrate 120, the relay part 230 for relaying transfer of electrical signals from the conversion/output part 220 to the peripheral circuit part 300 is basically formed over the two substrates.

The solid-state imaging device 100 has a signal processing and power supply portion (hereinafter, referred to as a signal processing part) 400 which controls drive of the photosensitive part 210 and the conversion/output parts 220 and so on and performs predetermined processing with respect to the electrical signals which are output from the peripheral circuit part 300. The signal processing part 400 in FIG. 5 includes a timing generator 410 formed by FPGA or the like, an image processing circuit (image processing IC) 420 and a power supply circuit (power supply IC) 430.

Note that, the signal processing part 400, including a timing generator 410, image processing circuit (image processing IC) 420, and power supply circuit (power supply IC) 430, may be mounted on a different substrate or on a second substrate 120 or third substrate 130 and then stacked. By configuring it in this way, it becomes also possible to incorporate a small-sized camera system in a single package.

The photosensitive part 210 formed on the first substrate 110 includes pixel portions 211 each including a photoelectric conversion element comprised of a photodiode (PD) arranged in a matrix (m rows and n columns) and a plurality of charge transfer parts comprised of vertical transfer parts (vertical CCD: VCCD) 212 (−1 to −4) which transfer the signal charges of the photoelectric conversion elements of the plurality of pixel portions 211 in unit of columns (or rows) In the photosensitive part 210, the vertical transfer parts 212 are shielded by not shown light shielding films and are driven for transfer by 2-phase, 4-phase, or other such transfer pulses by the signal processing part 400. The signal charges by the pixel portions 211 are transferred in the column direction.

Note that, in FIG. 5 and FIG. 8, for simplification of the drawings, examples are shown in which the pixel portions 211 and vertical transfer parts 212 are arranged in a matrix comprised of six rows and four columns (matrix where m=6 and n=4). In FIG. 5 and FIG. 8, four columns of the vertical transfer parts 212-1 to 212-4 are arranged. Further, the vertical transfer parts 212-1 to 212-4 transfer the signal charges in the Y-direction in the orthogonal coordinate systems shown in FIG. 5 and FIG. 8.

The conversion/output part 220 formed on the first substrate 110 converts the signal charges which are transferred by the plurality of vertical transfer parts 212-1 to 212-$n$ (n=4 in the present embodiment) in the photosensitive part 210 to electrical signals and outputs the results to the relay part 230. In the conversion/output part 220, corresponding to the n (4 in the present example) columns of vertical transfer parts 212-1 to 212-4 formed on the first substrate 110, four conversion/output parts 220-1 to 220-4 are arranged.

Figure 9:
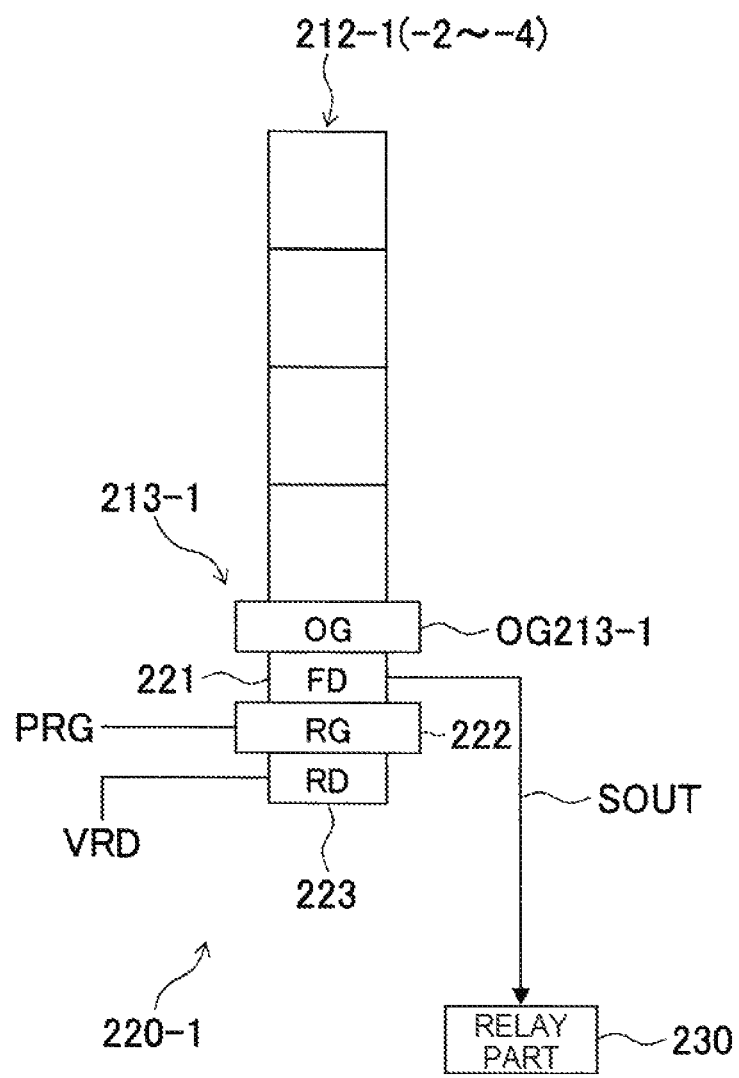
FIG. 9 is a view showing an example of the basic configuration of a conversion/output part according to the present embodiment.

FIG. 9 is a view showing an example of the basic configuration of the conversion/output part according to the present embodiment. FIG. 9 shows an example of the configuration of the conversion/output part 220-1 of one column. Also, the conversion output parts 220-2 to 220-4 of the other columns have the same configuration as in FIG. 5.

The conversion/output part 220-1 is connected to an output gate OG213-1 in an output end part 213-1 of the vertical transfer part 212-1. The conversion/output part 220-1 in FIG. includes a floating diffusion (FD: floating diffusion layer) 221, reset gate (RG) 222, and reset drain 223.

In the conversion/output part 220-1, a reset drain voltage VRD is applied to the reset drain 223, and a reset pulse PRG is applied to the reset gate 222 in a detection cycle of the signal charge. Further, the signal charge stored in the floating diffusion 221 is converted to a signal voltage as an electrical signal and is transmitted as an CCD output signal SCAN to the relay part 230.

The relay part 230 relays transfer of the electrical signals which are transferred by the plurality of vertical transfer parts 212 in the photosensitive part 210 formed on the first substrate 110 and are converted by the conversion/output parts 220-1 to 220-4 to the peripheral circuit part 300 formed on the second substrate 120. The relay part 230 in the present embodiment electrically connects the conversion/output parts 220-1 to 220-4 formed on the first substrate 110 and the peripheral circuit part 300 formed on the second substrate 120 by connecting parts 231 (−1 to −4) which pass through the substrates in a region EPARA out of a photosensitive region PARA in the photosensitive part 210. In the present embodiment, the connecting parts 231-1 to 231-4 are for example formed by through-vias (TSV). Note that, in the following explanation, the connecting parts will be sometimes referred to as through-vias as well.

In the present embodiment, in the relay part 230, as will be explained below, a source-follower circuit which amplifies the electrical signals from the conversion output parts 220-1 to 220-4 is formed on at least one of the regions corresponding to the outside of the photosensitive regions in the first substrate 110 and second substrate 120.

Schematic Example of Configuration of Stacked First Substrate and Second Substrate and Relay Part Here, an explanation will be given of a plurality of schematic examples of the configurations of a stacked first substrate and second substrate and relay part having a source-follower circuit.

First Example of Configuration

Figure 10:
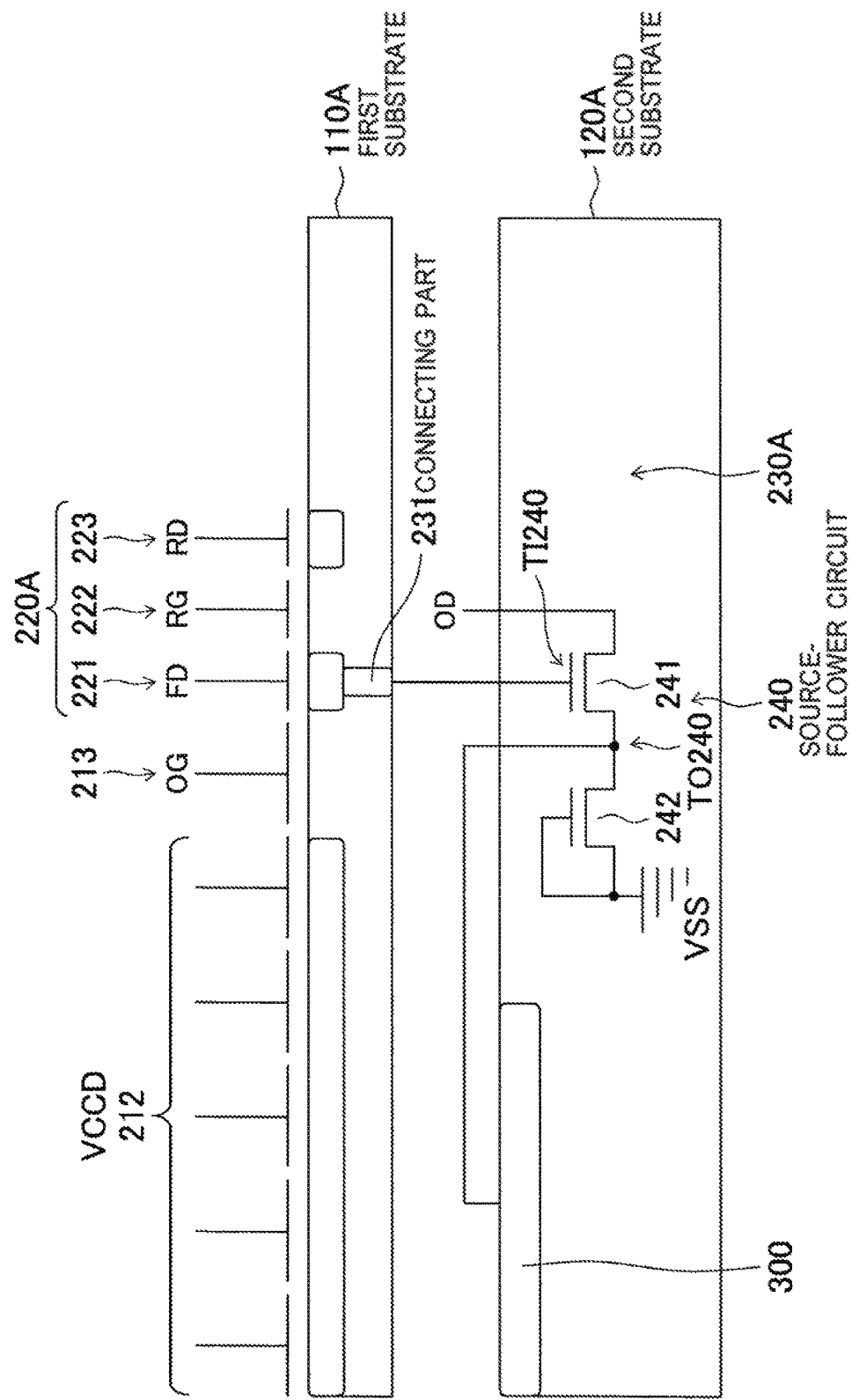
FIG. 10 is a simplified cross-sectional view for explaining a schematic first example of the configuration of a stacked first substrate and second substrate and a relay part according to the present embodiment.

FIG. 10 is a simplified cross-sectional view for explaining a schematic first example of the configuration of a stacked first substrate and second substrate and a relay part according to the present embodiment.

In this first example of the configuration, a source-follower circuit 240 is formed at the second substrate 120A. The source-follower circuit 240 includes an amplifying part 241 and a current source part 242 which are connected in series between a power supply part OD and a reference potential. The amplifying part 241 and current source part 242 are formed by MOSFETs. An input end TI240 of the source-follower circuit 240 is formed by the gate of the MOSFET forming the amplifying part 241, and an output end TO240 of the source-follower circuit 240 is formed by the connection side (source side) with the current source part 242.

The relay part 230A in this first example of the configuration connects the floating diffusion (FD) 221 of the conversion/output part 220A formed on the first substrate 110A and the input end TI240 of the amplifying part 241 in the source-follower circuit 240 formed in the second substrate 120A through the connecting parts 231 (−1 to −4). Further, the source-follower circuit 240 outputs the amplified signal from the output end TO240 side of the amplifying part 241 connected to the current source part 242 to the peripheral circuit part 300.

In the present example, basically, the vertical transfer part (vertical CCD) 212 is adjacent to the pixel portion 211, therefore progressive reading is possible. Further, the source-follower circuit 240 is arranged corresponding to the vertical transfer parts (vertical CCD) 212, and the peripheral circuit part 300 including the ADC 310 and digital memory 320 is arranged on the second substrate 120A, therefore high speed transfer of the read out signal charges to the memory while maintaining simultaneity becomes possible.

Second Example of Configuration

Figure 11:
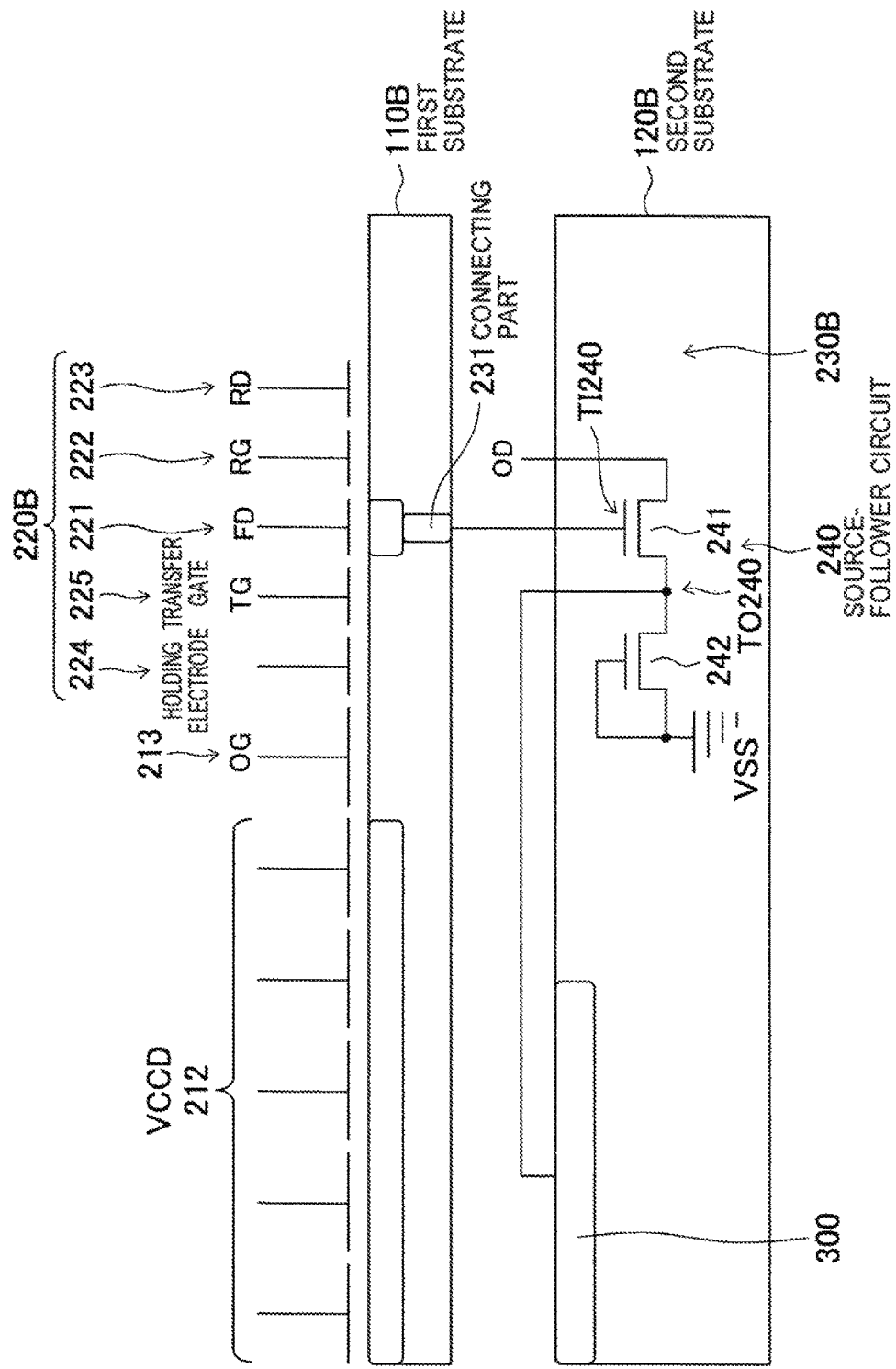
FIG. 11 is a simplified cross-sectional view for explaining a schematic second example of the configuration of a stacked first substrate and second substrate and a relay part according to the present embodiment.

FIG. 11 is a simplified cross-sectional view for explaining a schematic second example of the configuration of the stacked first substrate and second substrate and the relay part according to the present embodiment.

The difference of this second example of the configuration from the first example of the configuration explained above is as follows. The second example of the configuration is configured so that, in the conversion/output part 220B, a holding electrode 224 is provided for each vertical transfer part (vertical. CCD) 212, and the floating diffusion (FD) 221 is connected through the holding electrode 224 by the transfer gate (TG) 225.

Also, in the present example, basically, the vertical transfer parts (vertical CCD) 212 are adjacent to the pixel portions 211, so progressive reading is possible. Further, the source-follower circuit 240 is arranged corresponding to the vertical transfer parts (vertical CCD) 212, and the peripheral circuit part 300 including the ADC 310 and digital memory 320 is arranged on the second substrate 120B, therefore high speed transfer of the read out signal charges to the memory while maintaining simultaneity becomes possible. Note that, it is also possible to configure the system so as to provide a line buffer part separately from the floating diffusion (FD) 221. According to this configuration, the drop in the detection sensitivity due to the drop of the capacity of the FD part can be suppressed. This configuration, as will be explained later related to FIG. 23 to FIG. 26, is effective in a case where vertical transfer parts (vertical CCD) 212 in a plurality of columns are regarded as one group, and one FD part and through-via (TSV) are formed by bundling them in unit of groups.

Third Example of Configuration

Figure 12:
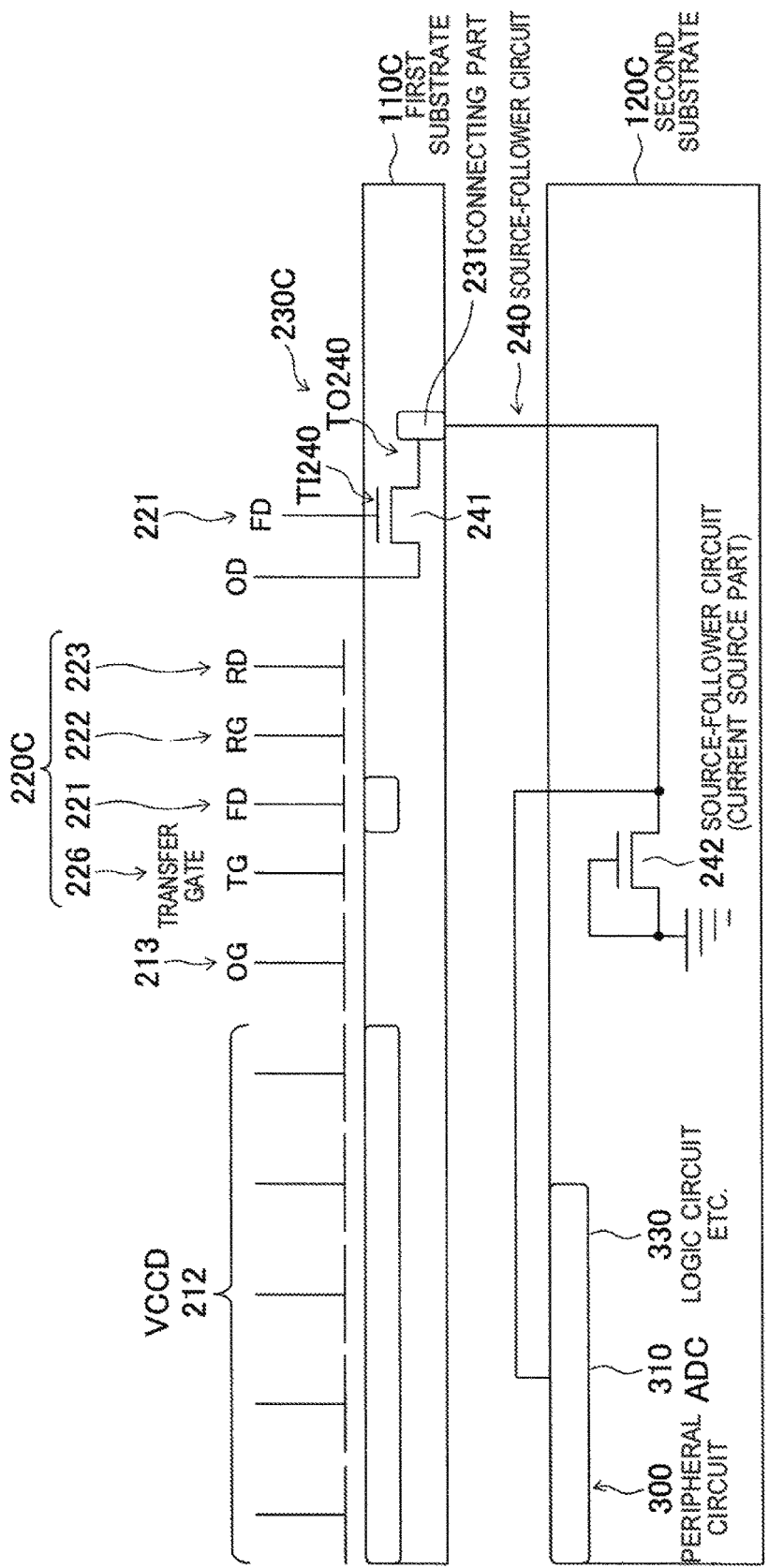
FIG. 12 is a simplified cross-sectional view for explaining a schematic third example of the configuration of a stacked first substrate and second substrate and a relay part according to the present embodiment.

FIG. 12 is a simplified cross-sectional view for explaining a schematic third example of the configuration of the stacked first substrate and second substrate and the relay part according to the present embodiment.

The difference of this third example of the configuration from the first example of the configuration explained above is as follows. In the third example of the configuration, the amplifying part 241 in the source-follower circuit 240 is formed in the first substrate 110C, and the current source part 242 is formed in the second substrate 120C. In the relay part 230C, the floating diffusion (FD) 221 of the conversion/output part 220C formed on the first substrate 110C and the input end (gate) TI240 of the amplifying part 241 of the source-follower circuit 240 are connected. Further, the output end TO240 of the amplifying part 241 and the current source part 242 formed in the second substrate 120C are connected through the connecting part 231. Further, in the third example of the configuration, in the conversion/output part 220C, a transfer gate (TG) 226 is formed between the output gate OG213 and the floating diffusion (FD) 221.

In the third example of the configuration as well, progressive reading is possible. Further, the floating diffusion (FD) 221 and the source-follower circuit 240 are arranged corresponding to the vertical transfer parts (vertical CCD) 212 and are connected to the source-follower circuit 240 on the first substrate 110, therefore the drop of the detection sensitivity due to a further drop of the capacity of the floating diffusion (FD) part can be suppressed, and low noise/high speed reading becomes possible.

Concrete Example of Configuration of Stacked First Substrate and Second Substrate and Relay Part Here, an explanation will be given of a concrete example of the configuration of the first substrate 110C, second substrate 120C, and relay part in the third example of the configuration shown above in brief. Note that, there are also other examples of the configuration accompanied by less change which were explained above or will be, explained later. However, these basically have the same structures as that explained here.

Figure 13:
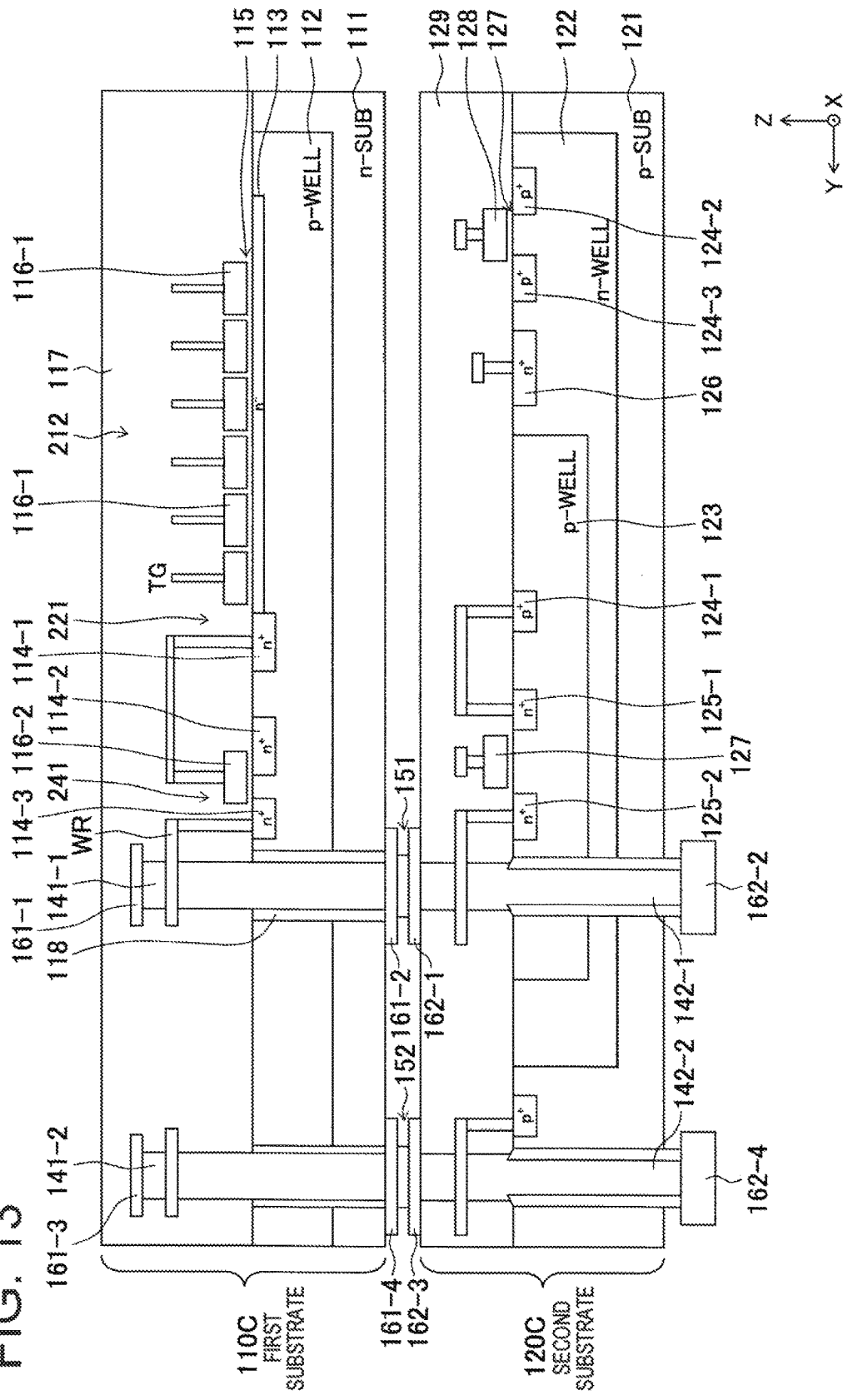
FIG. 13 is a simplified cross-sectional view for explaining a concrete first example of the configuration of a stacked first substrate and second substrate and a relay part according to the present embodiment.
Figure 14:
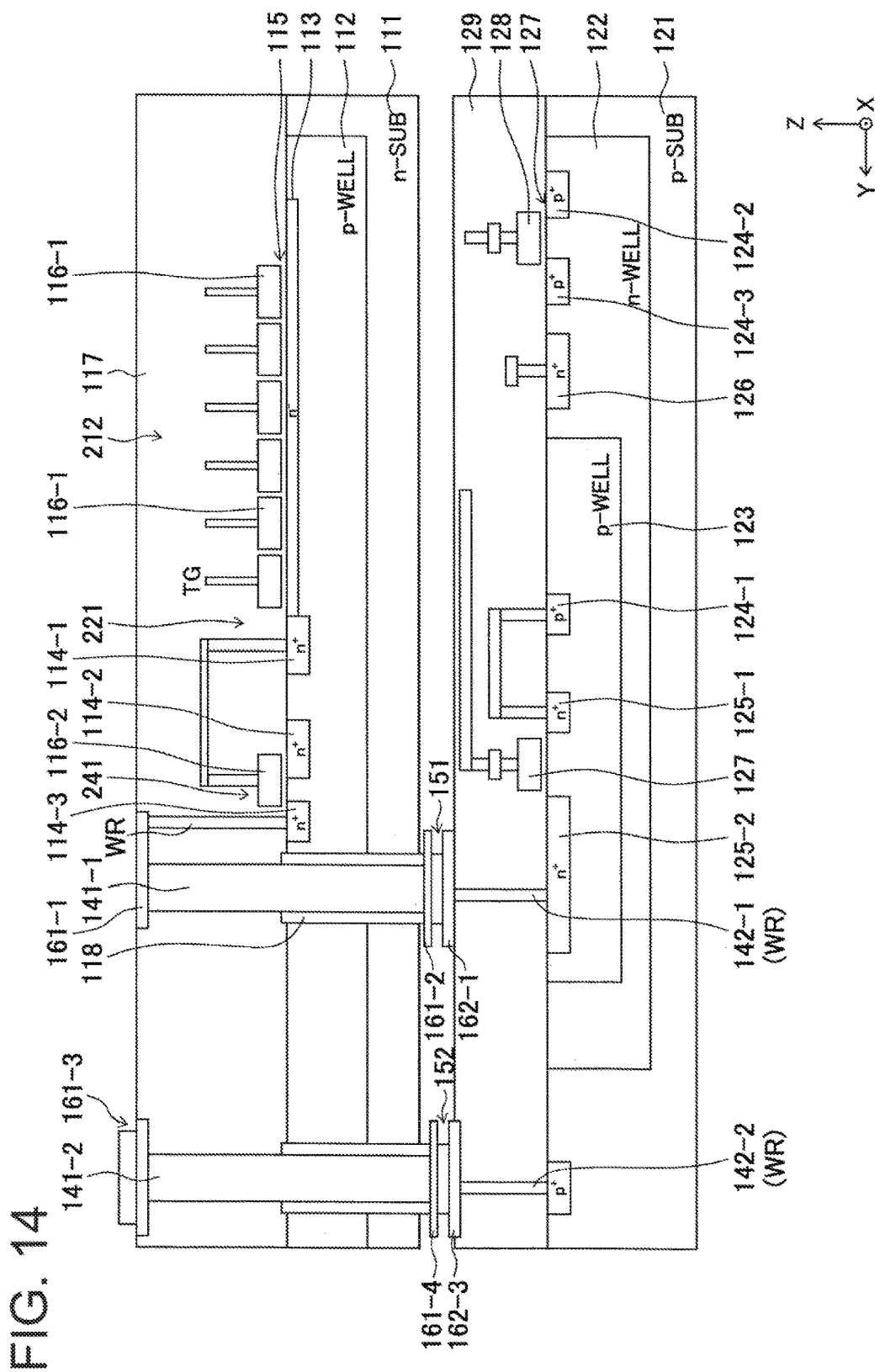
FIG. 14 is a simplified cross-sectional view for explaining a concrete second example of the configuration of a stacked first substrate and second substrate and a relay part according to the present embodiment.

FIG. 13 is a simplified cross-sectional view for explaining a concrete first example of the configuration of the stacked first substrate and second substrate and the relay part according to the present embodiment. FIG. 14 is a simplified cross-sectional view for explaining a concrete second example of the configuration of the stacked first substrate and second substrate and the relay part according to the present embodiment. FIG. 13 and FIG. 14 show portions in the third example of the configuration corresponding to one column of the vertical transfer parts 212 and the conversion/output part 220 and relay part 230 corresponding to that.

In the present embodiment, the first substrate 110C is formed by a first conductivity type substrate, for example, n-type substrate 111, and the second substrate 120C is formed by a second conductivity type substrate, for example, p-type substrate 121. In the first substrate 110C, a p-well 112 is formed in the n-type substrate (n-SUB) 111, and an $n^-$ layer 113 is followed in the surface part of the p-well 112. In one end part of the Y-direction of the $n^-$ layer 113, an $n^+$ layer 114-1 for forming the floating diffusion (FD) 221 and $n^+$ layers 114-2 and 114-3 for forming the drain and source of the amplifying part 241-use transistor in the source-follower circuit 240 to the gate of which the $n^+$ layer 114-1 for forming the floating diffusion (FD) 221 is connected are formed. The $n^+$ layer 114-3 is formed so as to be connected to the through-via 141-1 as the relay part through a wiring layer WR. In the upper part of the $n^-$ layer 113 and upper parts of the $n^+$ layers 114-2 and 114-3, transfer electrodes (transfer gates) 116-1 of the vertical transfer parts 212 and a gate electrode 116-2 for the amplifying part 241 are formed at predetermined intervals through a gate insulation film 115. Further, above the n-type substrate 111, p-well 112, $n^-$ layer 113, $n^+$ layers 114-1, 114-2, and 114-3, gate insulation film 115, and transfer electrodes 116-1 and 116-2, an insulation film 117 is formed so as to cover them.

A through-via (penetration electrode) 141-1 which penetrates from the insulation film 117 through the p-well 112 and n-type substrate 111 and is joined with a through-via 142-1 on the second substrate 120 side which will be explained later by a joint part 151 is formed (buried). Note that, an insulation film 118 is formed on the wall portions of the p-well 112 and n-type substrate 111 in which the through-via 141-1 is formed. In the end part of the through-via 141-1, bonding pads 161-1 and 161-2 are connected. The bonding pad 161-2 is arranged in the external portion on the surface side of the first substrate 110C which faces the second substrate 120C and is joined to the bonding pad 162-1 which is connected to the through-via 242-1 on the second substrate 120C side by the joint part 151.

Note that, in the example in FIG. 13, the end part of the through-via 141-1 to which the bonding pad 161-1 is connected is inside the insulation film 117. On the other hand, in the example in FIG. 14, the bonding pad 161-1 is configured so as to be exposed at the external portion on the surface side of the first substrate 110C which does not face the second substrate 120C.

In the second substrate 120C, an n-well 122 is formed in the p-type substrate (P-SUB) 121, and a p-well 123 is formed in the n-well 122. In the surface part of the p-well 123, a $p^+$ layer 124-1 and $n^+$ layers 125-1 and 125-2, which serve as the drain and source of the current source part 242-use transistor of the source-follower circuit 240, are formed. In the example in FIG. 13, the $n^+$ layer 125-2 is formed so as to be connected to the through-via 142-1 as the relay part through the wiring layer WR. In the example in FIG. 14, the $n^+$ layer 125-2 is formed directly under the bonding pad 162-1 as the relay part through the through-via 142-2 or wiring layer WR. Further, in the surface part of the n-well 122, $p^+$ layers 124-2 and 124-3 and $n^-$ layer 126 etc. for forming a peripheral circuit are formed. In the upper parts of the $n^+$ layers 125-1 and 125-2 and upper parts of the $p^+$ layers 124-2 and 124-3, gate electrodes 128 are formed through a gate insulation film 127. Further, above the p-type substrate 121, n-well 122, p-well 123, $p^+$ layers 124-1, 124-2, and 124-3, $n^+$ layers 125-1 and 125-2, $n^+$ layer 126, gate insulation film 127, and gate electrodes 128 etc., an insulation film 129 is formed so as to cover them.

The first substrate 110C and the second substrate 120C having the above configurations are stacked in a manner so that the bonding pad 161-2 which is connected to the through-via 141-1 exposed on the bottom surface side of the n-type substrate 111 in the first substrate 110 and the bonding pad 162-1 which is connected to the through-via 142-1 exposed on the surface (upper surface) side of the insulation film 129 of the second substrate 120C are joined by the joint part 151. In other words, they are formed so that the second substrate 120 is superimposed on the back surface of the first substrate 110. Note that, the vertical transfer parts 212 formed on the first substrate 110 are shielded by the light shielding films made of metal layers or other light shielding materials.

Further, in the examples in FIG. 13 and FIG. 14, the through-vias 142-1 and 142-2 penetrating through the first substrate 110C and second substrate 120C are formed. On the wall portions of the p-well 112 and n-type substrate 111 in the first substrate 110 having the through-vias 141-1 and 141-2 formed therein and on the p-type substrate 121 in the second substrate 120, insulation films are formed.

In the present embodiment, as explained above, the first substrate 110C is configured by the n-type substrate 111. Therefore, in the first substrate 110C on which the pixel portion 211 is formed, a vertical overflow drain (VOD) structure is employed.

Figure 15:
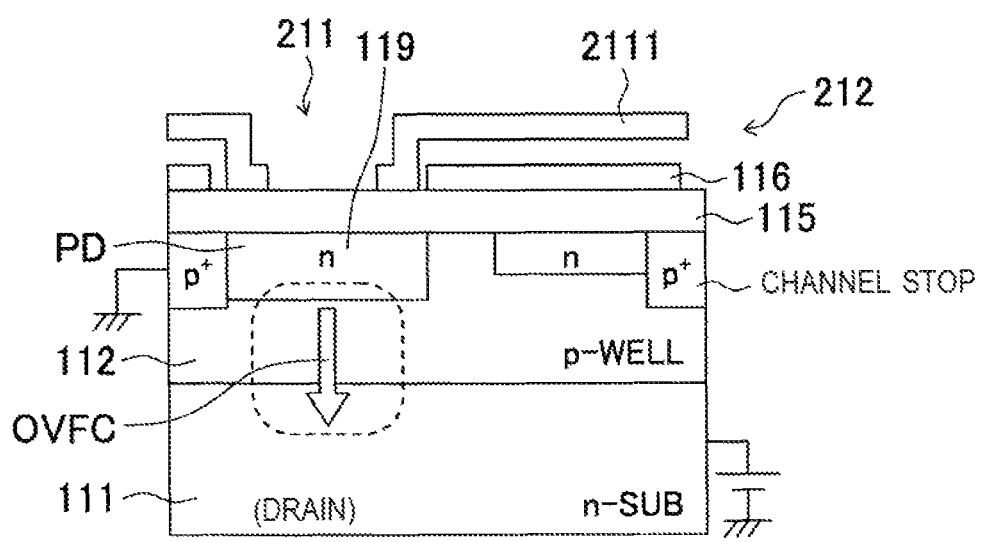
FIG. 15 is a view for explaining the configuration and principle of a vertical overflow drain which is employed in a pixel portion formed on the first substrate according to the present embodiment.

FIG. 15 is a view for explaining the configuration and principle of the vertical overflow drain employed in the pixel portion followed on the first substrate according to the present embodiment. In FIG. 15, notation 2111 indicates a light shielding film, and OVFC indicates an overflow channel.

The vertical overflow drain VOD is realized as in the following way. A PD (Photoelectric conversion element) of the pixel Portion 211 and the vertical transfer Part (VCCD) 212 are formed in the p-well 112 and a positive voltage is applied to the n-type substrate 111 by bringing the p-well 112 to the reference potential, so an inverse bias state is retained. This inverse bias forms a potential barrier against the diffusion of electrons from the n-type substrate 111 and completely blocks entry of optically generated electrons and thermally generated electrons into the PD or vertical transfer part (VCCD) 212. Due to this, crosstalk of signals is improved to a level not posing a problem, and smear is rapidly reduced. Further, a dark current noise component caused by thermal diffusion current from the n-type substrate 111 is completely suppressed.

Next, a principle of discharge of excessive electrons in the vertical overflow drain VOD will be explained. A pn junction depletion layer between the p-well 112 and the n-type substrate 111 is enlarged by an inverse bias voltage. If an impurity layer of the p-well 112 directly under the PD is thin and low in concentration, a so-called punch-through state by which the junction depletion layer reaches the n-layer 119 of PD is easily realized. That is, the p-well 112 becomes completely depleted and rises in potential. At this time, if the n-layer is in an electron-filled state, electrons are strongly drawn onto the n-type substrate 111. Even when strong light strikes and excessive electrons are generated in the PD, the electrons are all swept from the n-layer 119 to the n-type substrate 111 over the raised potential of the p-well 112, therefore occurrence of blooming can be completely prevented.

Here, the explanation will be returned back to the schematic example of the configuration of the stacked first substrate and second substrate and the relay part.

Fourth Example of Configuration

Figure 16:
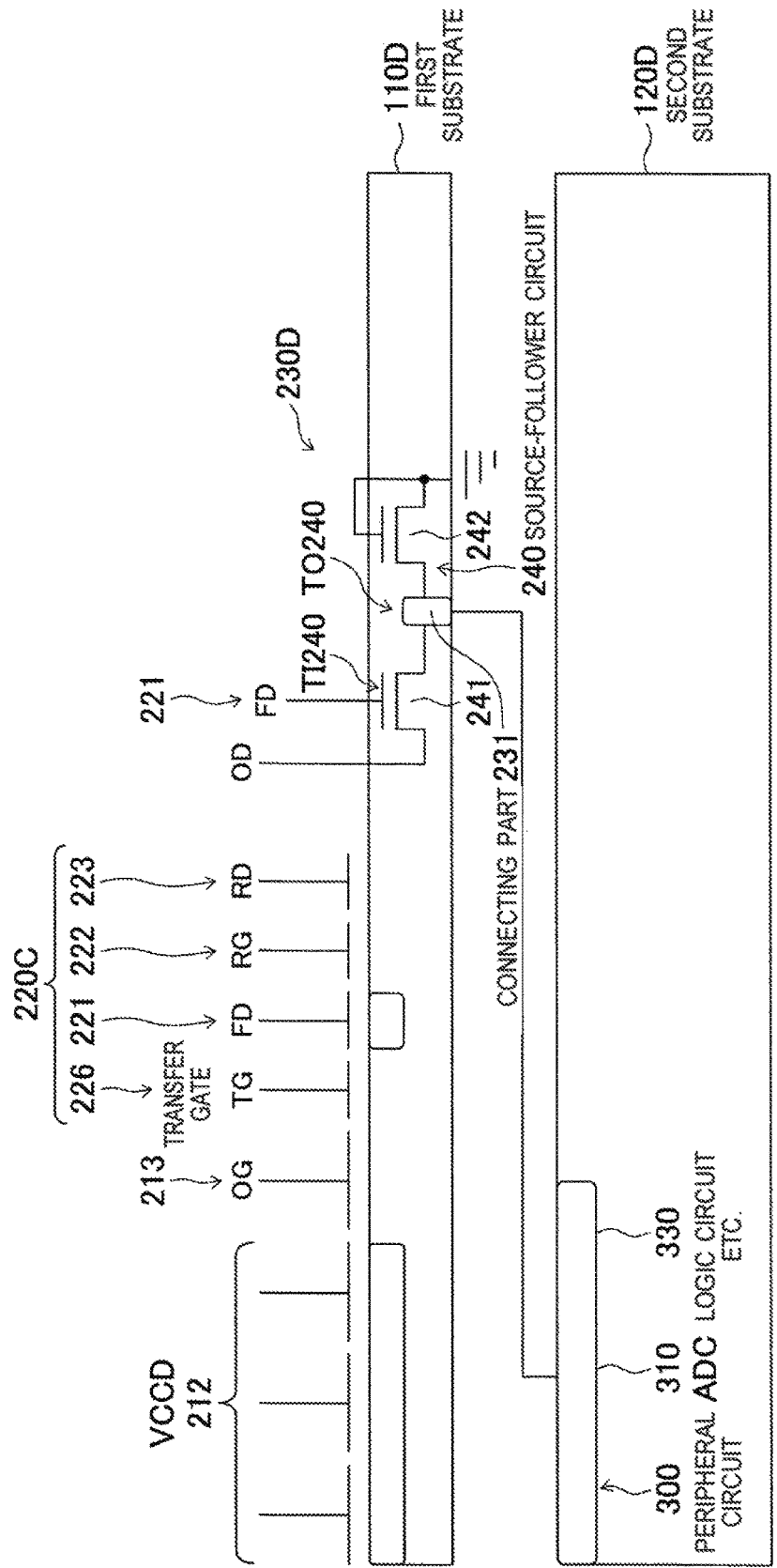
FIG. 16 is a simplified cross-sectional view for explaining a schematic fourth example of the configuration of a stacked first substrate and second substrate and a relay part according to the present embodiment.

FIG. 16 is a simplified cross-sectional view for explaining a schematic fourth example of the configuration of the stacked first substrate and second substrate and the relay part according to the present embodiment.

The difference of this fourth example of the configuration from the third example of the configuration explained above is as follows. In the fourth example of the configuration, the amplifying part 241 of the source-follower circuit 240 is formed in a first substrate 110D, and the current source part 242 is formed in the first substrate 110D. In a relay part 230D, the floating diffusion (FD) 221 of the conversion/output part 220C formed on the first substrate 110D and the input end (gate) TI240 of the amplifying part 241 in the source-follower circuit 240 are connected. Further, the output end TO240 of the amplifying part 241 and the peripheral circuit part 300, including the ADC 310, logic circuit 330, etc., which are formed on the second substrate 120D are connected through the connecting part 231.

In the fourth example of the configuration as well, progressive reading is possible. Further, corresponding to the vertical transfer parts (vertical CCD) 212, the floating diffusion (FD) 221 and the amplifying part 241 and current source part 242 in the source-follower circuit 240 are arranged. The influence of the noise superimposed over the signal generated in the connecting part 231 is reduced, and further lower noise/higher speed reading become possible.

Fifth Example of Configuration

Figure 17:
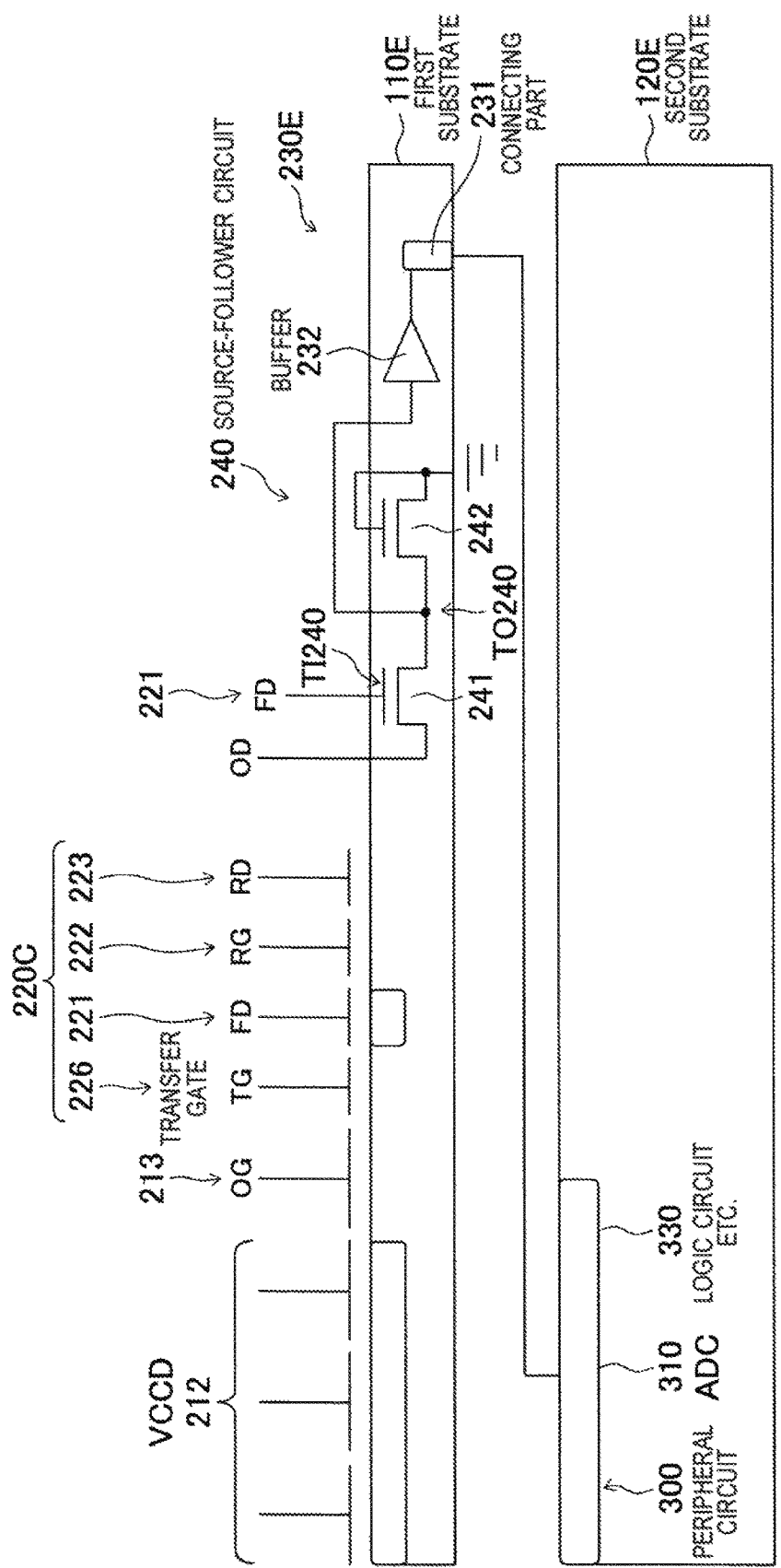
FIG. 17 is a simplified cross-sectional view for explaining a schematic fifth example of the configuration of a stacked first substrate and second substrate and a relay part according to the present embodiment.

FIG. 17 is a simplified cross-sectional view for explaining a schematic fifth example of the configuration of the stacked first substrate and second substrate and the relay part according to the present embodiment.

The difference of this fifth example of the configuration from the fourth example of the configuration explained above is as follows. In the fifth example of the configuration as well, the amplifying part 241 in the source-follower circuit 240 is formed in a first substrate 110E and the current source part 242 is formed in the first substrate 110E. In a relay part 230E in the fifth example of the configuration, the floating diffusion (FD) 221 of the conversion/output part 220C formed on the first substrate 110E and the input end (gate) TI240 of the amplifying part 241 in the source-follower circuit 240 are connected. A buffering amplifying part 232 which buffers the electrical signals output by the source-follower circuit 240 is formed (connected) between the output end TO240 of the amplifying part 241 and the connecting part 231. Further, the connecting part 231 is connected to the peripheral circuit part 300 formed on the second substrate 120E.

In the fifth example of the configuration as well, progressive reading is possible. Further, the floating diffusion (FD) 221, amplifying part 241 and current source part 242 of the source-follower circuit 240, and buffer amplifying part 232 are formed corresponding to the vertical transfer parts (vertical CCD) 212, and further lower noise/higher speed reading become possible.

Sixth Example of Configuration

Figure 18:
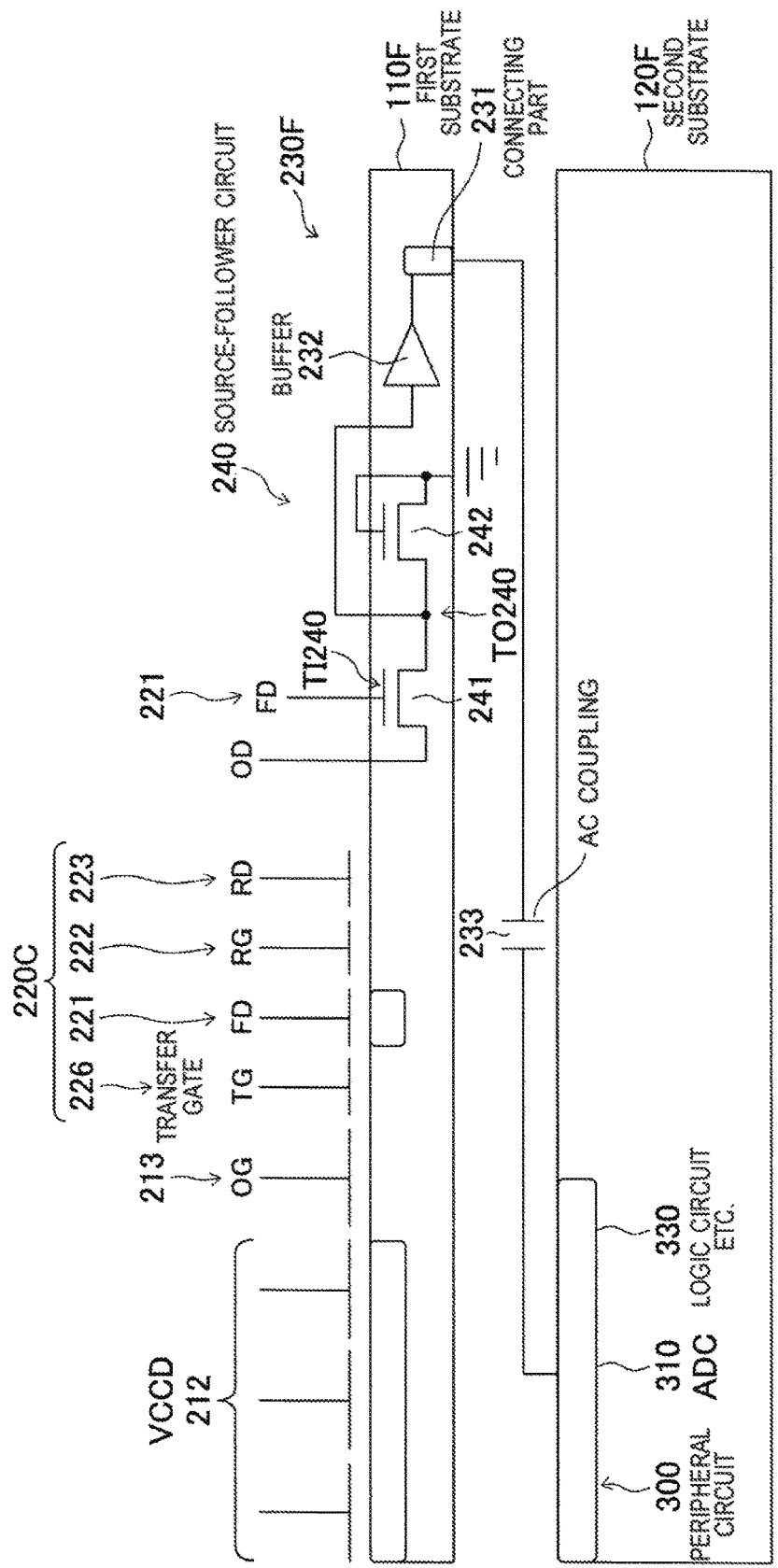
FIG. 18 is a simplified cross-sectional view for explaining a schematic sixth example of the configuration of a stacked first substrate and second substrate and a relay part according to the present embodiment.

FIG. 18 is a simplified cross-sectional view for explaining a schematic sixth example of the configuration of the stacked first substrate and second substrate and the relay part according to the present embodiment.

The difference of this sixth example of the configuration from the fifth example of the configuration explained above is as follows. In a relay part 230F in the sixth example of the configuration, the connecting part 231 is electrically connected to the peripheral circuit part 300 formed on the second substrate 120F by AC coupling by the AC coupling part 233.

In the sixth example of the configuration as well, progressive reading is possible. Further, the floating diffusion (FD) 221, amplifying part 241 and current source part 242 of the source-follower circuit 240, and buffer amplifying part 232 are formed corresponding to the vertical transfer parts (vertical CCD) 212, and further lower noise/higher speed reading become possible.

Seventh Example of Configuration

Figure 19:
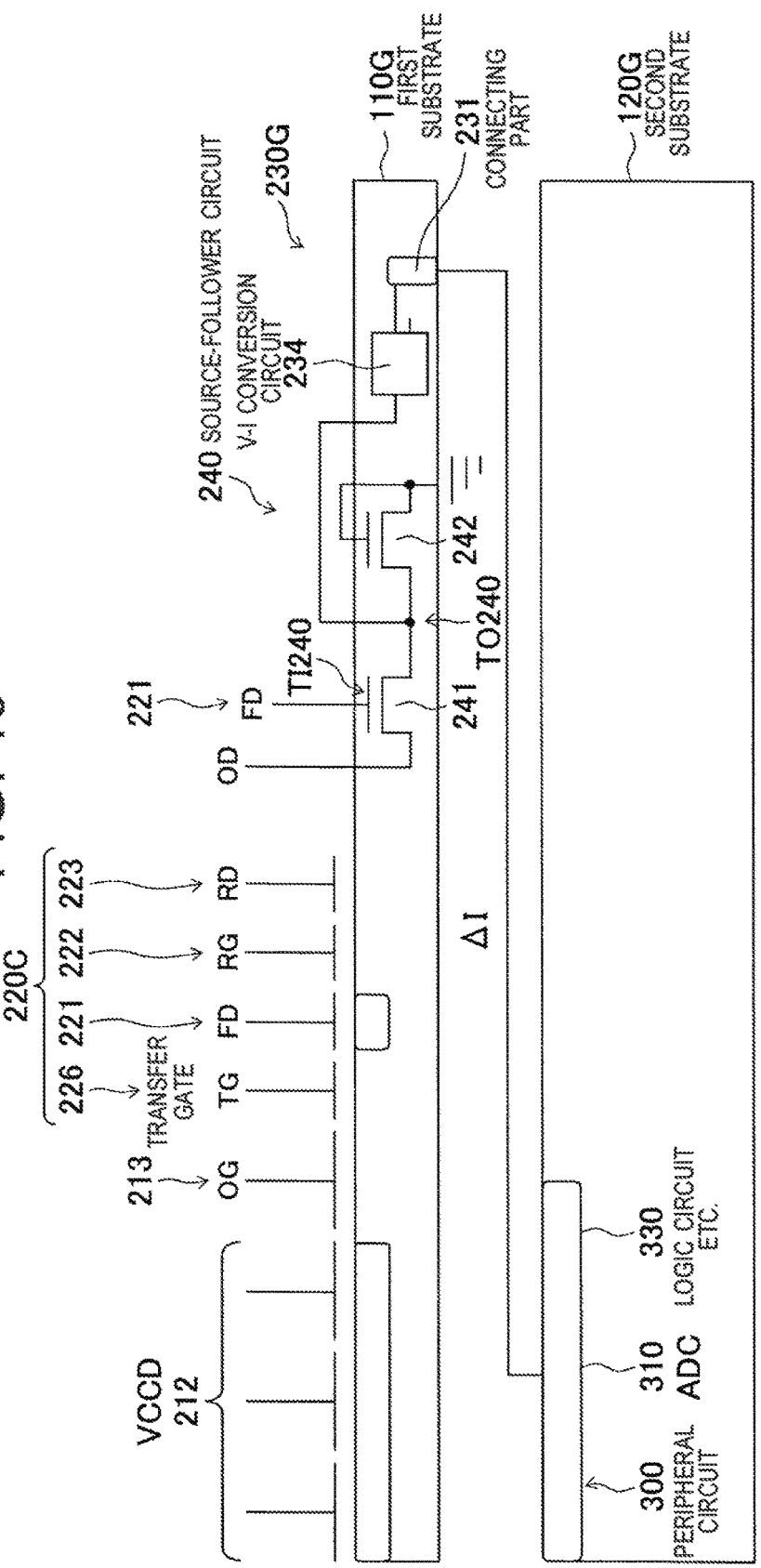
FIG. 19 is a simplified cross-sectional view for explaining a schematic seventh example of the configuration of a stacked first substrate and second substrate and a relay part according to the present embodiment.

FIG. 19 is a simplified cross-sectional view for explaining a schematic seventh example of the configuration of the stacked first substrate and second substrate and the relay part according to the present embodiment.

The difference of this seventh example of the configuration from the fourth example of the configuration explained above is as follows. In the seventh example of the configuration as well, the amplifying part 241 of the source-follower circuit 240 is formed in a first substrate 110G, and the current source part 242 is formed in the first substrate 110G. In a relay part 230G in the seventh example of the configuration, the floating diffusion (FD) 221 of the conversion/output part 220C formed on the first substrate 110E and the input end (gate) TI240 of the amplifying part 241 in the source-follower circuit 240 are connected. Between the output end TO240 of the amplifying part 241 and the connecting part 231, a voltage-to-current (V-I) conversion circuit 234 for converting the electrical signal output by the source-follower circuit 240 from a voltage signal to a current signal is formed (connected). Further, the connecting part 231 is connected to the peripheral circuit part 300 formed on the second substrate 120G.

In the seventh example of the configuration, the floating diffusion (FD) 221, amplifying part 241 and current source part 242 of the source-follower circuit 240, and voltage-to-current (V-I) conversion circuit 234 are arranged corresponding to the vertical transfer parts (vertical CCD) 212, therefore the structure is not influenced much at all by the noise in the connecting part 231, so further lower noise/higher speed reading become possible.

Eighth Example of Configuration

Figure 20:
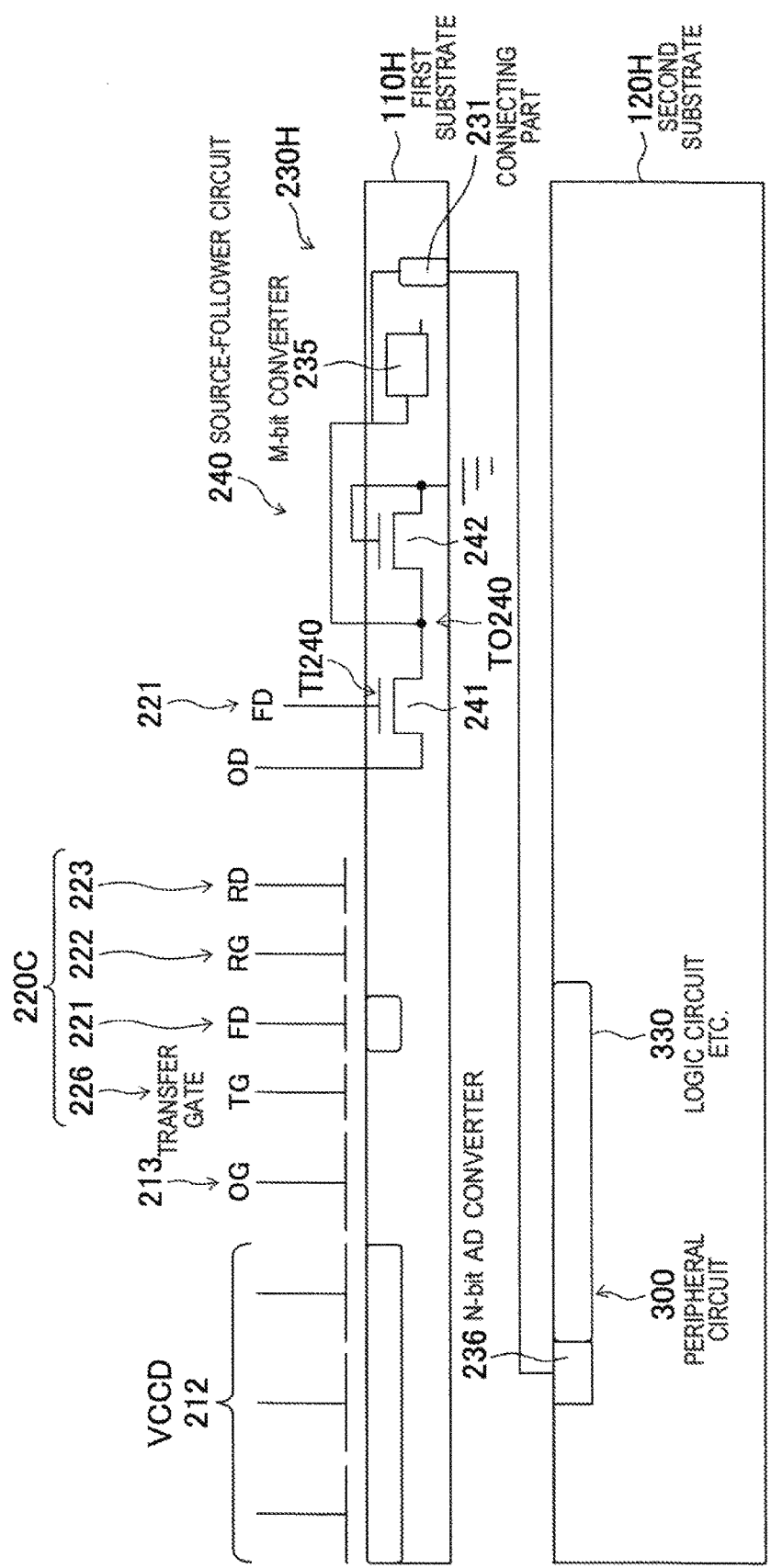
FIG. 20 is a simplified cross-sectional view for explaining a schematic eighth example of the configuration of a stacked first substrate and second substrate and a relay part according to the present embodiment.

FIG. 20 is a simplified cross-sectional view for explaining a schematic eighth example of the configuration of the stacked first substrate and second substrate and the relay part according to the present embodiment The difference of this eighth example of the configuration from the fourth example of the configuration explained above is as follows. In the eighth example of the configuration as well, the amplifying part 241 of the source-follower circuit 240 is formed in a first substrate 110H, and the current source part 242 is formed in the first substrate 110H. In a relay part 230H in the eighth example of the configuration, the floating diffusion (FD) 221 of the conversion/output part 220C formed on the first substrate 110H and the input end (gate) TI240 of the amplifying part 241 in the source-follower circuit 240 are connected. The output end TO240 of the amplifying part 241 and the connecting part 231 are connected, and an N-bit ADC 235 forming the first ADC is connected to the output end TO240 of the amplifying part 241 on the first substrate 110H side. Further, on the second substrate 120H side, an N-bit ADC 236 as the second ADC for converting the output signal of the source-follower circuit 240 which is transferred through the connecting part 231 from an analog signal to a digital signal is connected to the input stage of the peripheral circuit part 300.

The eighth example of the configuration is configured so that the electrical signals are transmitted in the form of voltage or current in the first substrate 110H and second substrate 120H, and the signal processing by the ADC 235 and ADC 236 can be carried out on the two or more substrates. In this way, in the eighth example of the configuration, the signal processing of M-bits is carried out in the first substrate 110H, therefore the influence of noise accompanied with inter-substrate transmission becomes smaller in the input conversion and thus more precise conversion becomes possible.

Ninth Example of Configuration

Figure 21:
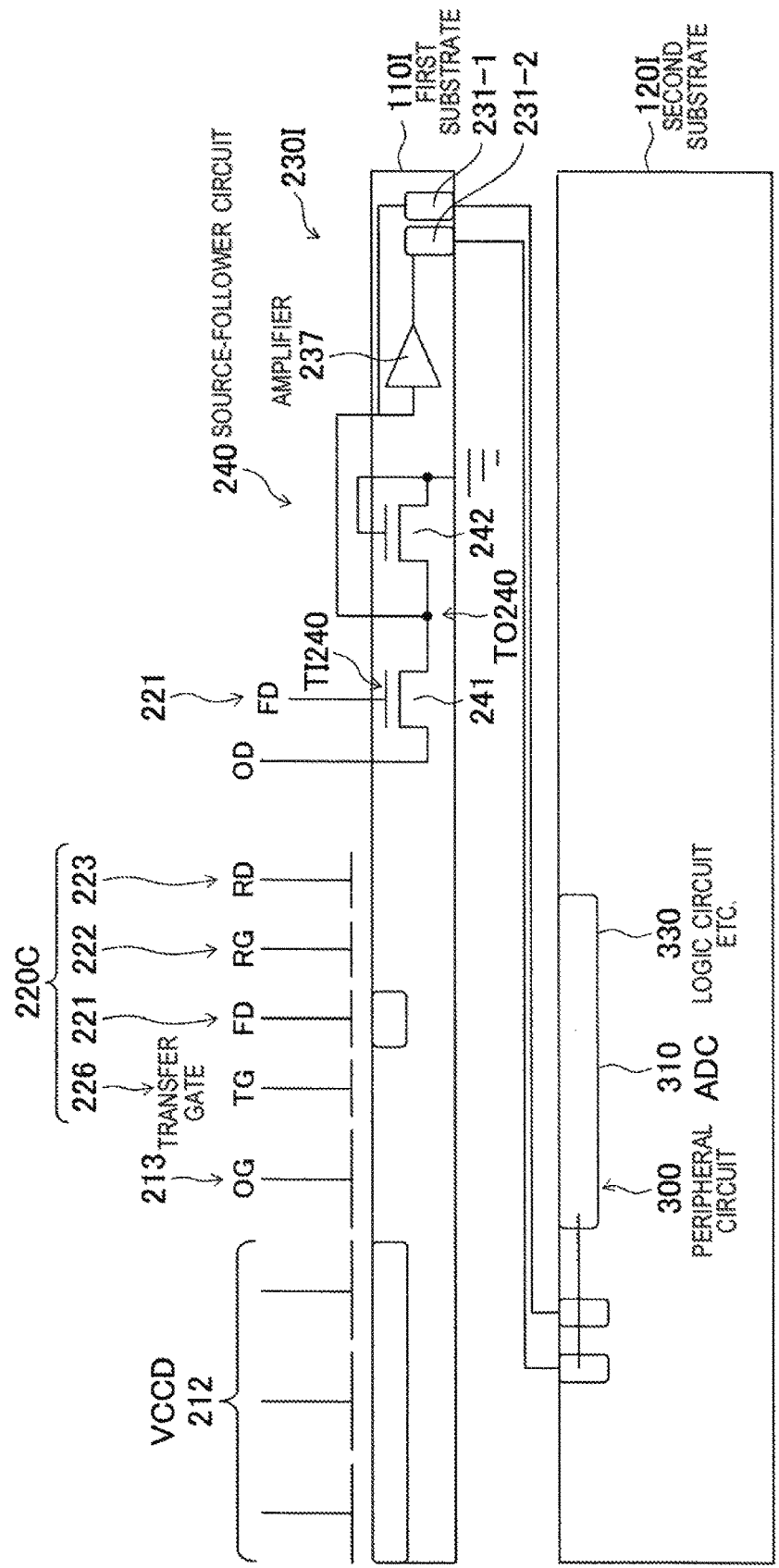
FIG. 21 is a simplified cross-sectional view for explaining a schematic ninth example of the configuration of a stacked first substrate and second substrate and a relay part according to the present embodiment.

FIG. 21 is a simplified cross-sectional view for explaining a schematic ninth example of the configuration of the stacked first substrate and second substrate and the relay part according to the present embodiment.

The difference of this ninth example of the configuration from the fourth example of the configuration explained above is as follows. In the ninth example of the configuration as well, the amplifying part 241 of the source-follower circuit 240 is formed in a first substrate 110I, and the current source part 242 is formed in the first substrate 110I. In a relay part 230I in the ninth example of the configuration, the floating diffusion (FD) 221 of the conversion/output part 220C formed on the first substrate 110I and the input end (gate) TI240 of the amplifying part 241 in the source-follower circuit 240 are connected. The output end TO240 of the amplifying part 241 and the first connecting part 231-1 are connected, the amplifier 237 as the second amplifying part is connected to the output end TO240 of the amplifying part 241 on the first substrate 110I side, and the output of the amplifier 237 is connected to the second connecting part 231-2. Further, on the second substrate 120I side, the output signal of the source-follower circuit 240 and the output signal of the amplifier 237 which are transferred through the connecting parts 231-1 and 231-2 to the input stage of the peripheral circuit part 300 are supplied to the peripheral circuit part 300.

The ninth example of the configuration is formed so that the output of the amplifier 237 on the first substrate 110I is transferred to the second substrate 120I side, a feedback system is configured by voltage or current, and the signal processing can be carried out by for example the ADC in the peripheral circuit part 300. In this way, in the ninth example of the configuration, in the feedback system including the substrate wiring, the influence of noise accompanied with transmission becomes smaller in the input conversion, therefore more precise conversion becomes possible.

10th Example of Configuration

Figure 22:
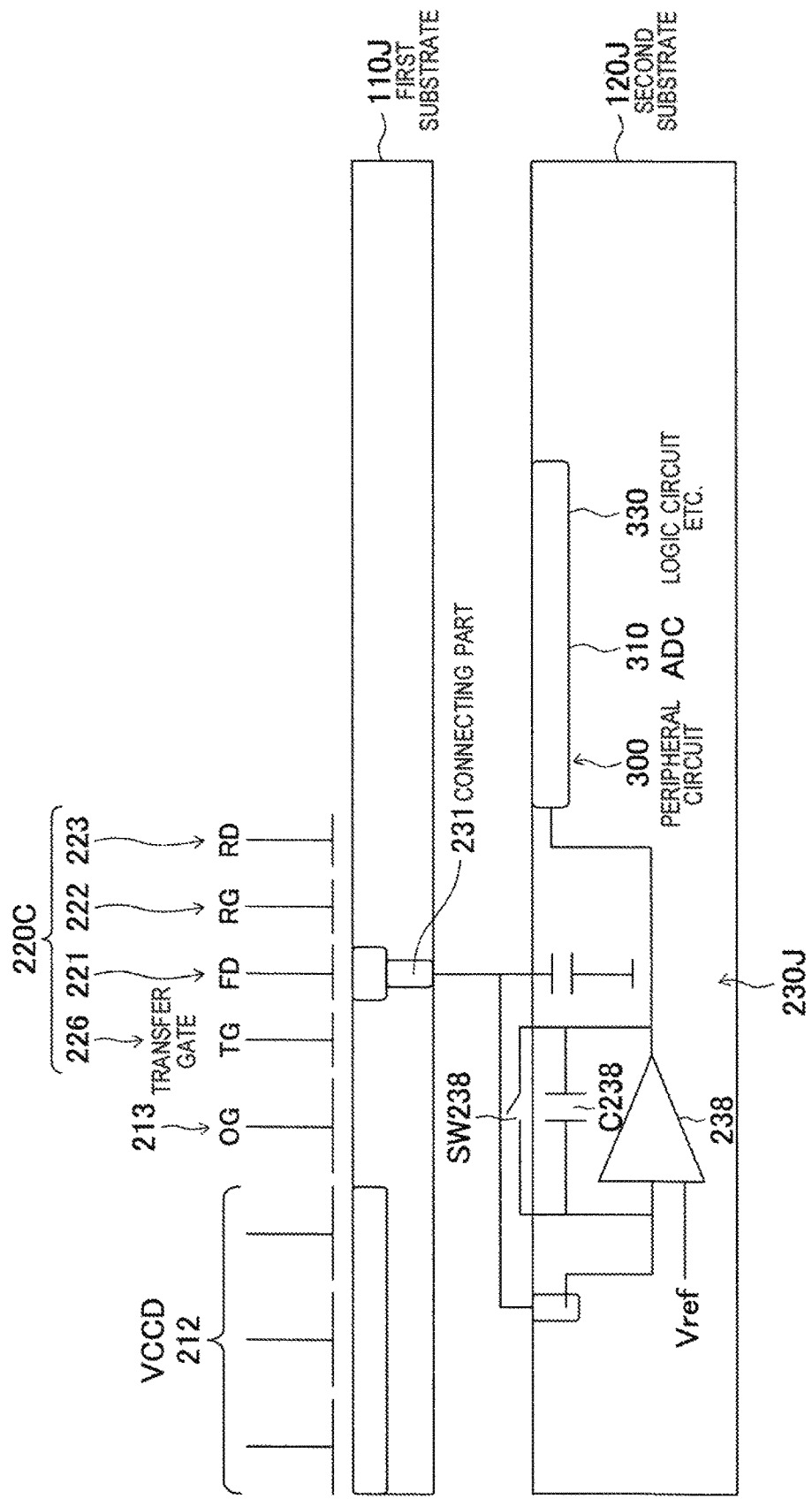
FIG. 22 is a simplified cross-sectional view for explaining a schematic 10th example of the configuration of a stacked first substrate and second substrate and a relay part according to the present embodiment.

FIG. 22 is a simplified cross-sectional view for explaining a schematic 10th example of the configuration of the stacked first substrate and second substrate and the relay part according to the present embodiment.

The difference of this 10th example of the configuration from the first to ninth examples of the configuration etc, explained above is as follows. FIG. 22 is shown so as to be compared with the third example of the configuration in FIG. 12 as one example. However, in the 10th example of the configuration, basically, in a relay part 230J, a feedback type amplifier 238 is applied in place of the source-follower circuit as a means for amplifying the electrical signal by the conversion/output part 220C. Between one input and the output of the feedback type amplifier 238, a capacitor C238 and reset-use switch SW238 are connected in parallel.

The relay part 230J in this 10th example of the configuration connects the floating diffusion (FD) 221 of the conversion/output part 220C formed on a first substrate 110J and one input terminal of the feedback type amplifier 238 formed in a second substrate 120J through the connecting part 231. To the other input terminal of the feedback type amplifier 238, a reference voltage Vref is supplied. Further, the feedback type amplifier 238 on the second substrate 120J feedback-amplifies the pixel signal in the floating diffusion 221 on the first substrate 110J and supplies the amplified signal to the ADC 310 etc. in the peripheral circuit part 300.

In the 10th example of the configuration, the feedback amplification system in the floating diffusion (FD) can reduce the deterioration of the noise characteristic due to the drop of the conversion gain accompanied with the increase of capacity by connection with the second substrate 120J according to the arrangement of the feedback type amplifier 238. For this reason, the 10th example of the configuration is given a structure not influenced much at all by the noise in the connecting part 231, and further lower noise/higher speed reading becomes possible.

As described above, according to the first embodiment, the first substrate 110 is formed with the photosensitive part 210 which, includes the pixel portions 211, including photodiodes (PD) as the photoelectric conversion elements, arranged in a matrix and the vertical transfer parts 212 as the plurality of charge transfer parts which transfer the signal charges, of the photoelectric conversion elements in the plurality of pixel portions 211 in unit of columns. Further, on the first substrate 110, the conversion/output part 220 which converts the signal charges to electrical signals and outputs the results to the output end parts of the vertical transfer parts 212 is formed for each of the vertical transfer parts (or each of a plurality of vertical transfer parts). In the input stage of the conversion/output part 220, the output gate OG213 is formed. The conversion/output part 220 has the floating diffusion (FD) 221, reset gate (RG) 222, and reset drain (RG) 223 formed therein and has the transfer gates 225 and 226 and line buffer part formed therein according to need. On the second substrate 120, a peripheral circuit part 300 such as the ADC 310, digital memory 230, and logic circuit 330 for performing predetermined processing with respect to the electrical signals obtained by the imaging element part 200 is formed. Between the first substrate 110 and the second substrate 120, the relay part 230 including the source-follower circuit 240 for relaying transfer of the electrical signals by the conversion/output part 220 to the peripheral circuit part 300 is formed basically over the two substrates or on one substrate. Otherwise, the relay part 230J including the feedback type amplifier 238 which relays transfer of the electrical signals between the first substrate 110 and the second substrate 120 by the conversion/output part 220 to the peripheral circuit part 300 is basically formed on the second substrate 120J. Further, by the relay part 230, the floating diffusion (FD) 221 or line buffer part of the conversion/output part 220 formed on the first substrate 110 is connected to the input end of the amplifying part 241 of the source-follower circuit 240, and the output signals of the amplifying part 241 are supplied to the peripheral circuit part 300. The connection between the first substrate 110 and the second substrate 120 is electrically realized by a connecting part passing through the substrates, for example, a through-via 140 in the region EPARA on the outside of the photosensitive region PARA in the photosensitive part 210.

Accordingly, according to the first embodiment, the following effects can be obtained. According to the first embodiment, progressive reading from the pixel portions 211 to the vertical transfer parts (vertical CCD) 212 is possible. The signal charges read out by the progressive reading are converted to electrical signals in the conversion/output part 220, then pass through the source-follower circuit 240 or feedback type amplifier 238 and are transferred to the peripheral circuit part 300 formed on the second substrate. In the present embodiment, the pixel array on the first substrate is formed by the usual CCD array and a new structure is not needed. For this reason, it becomes possible to provide an image sensor capable of high speed transfer with a high SN ratio and capable of progressive reading according to the present embodiment. Further, the connecting part of the stacked substrates is formed outside of the pixel array (out of the photosensitive region of the photosensitive part 210), therefore formation of an image sensor with a little restriction on layout and free from deterioration of pixel characteristics such as white flaw becomes possible. In other words, according to the first embodiment, it becomes possible to realize an image sensor capable of high speed driving with global reading without forming a special structure in the pixel array, that is, without causing deterioration of the SN ratio. Further, by the formation of the relay part 230 including the connecting part outside of the pixel array, formation of pixels without causing a drop of the sensitivity and increase of dark current becomes possible.

Further, in the first example of the configuration in FIG. 10, the source-follower circuit 240 is arranged corresponding to the vertical transfer parts (vertical CCD) 212, and the peripheral circuit part 300 including the ADC 310 and digital memory 320 is formed on the second substrate 120A, therefore it becomes possible to transfer the read out signal charges to the memory at a high speed while maintaining simultaneity.

In the second example of the configuration in FIG. 11, further, by providing the floating diffusion (ED) part and the line buffer part separately, the drop of the detection sensitivity due to the drop of the capacity of the FD part can be suppressed.

In the third example of the configuration in FIG. 12, on the first substrate 110, the floating diffusion (FD) 221 and the amplifying part 241 of the source-follower circuit 240 are arranged corresponding to the vertical transfer parts (vertical CCD) 212 and are connected to the source-follower circuit 240 on the first substrate 110, therefore the drop of the detection sensitivity due to the further drop of the capacity of the floating diffusion (FD) part can be suppressed, and low noise/high speed reading becomes possible.

In the fourth example of the configuration in FIG. 16, on the first substrate 110D, the floating diffusion (FD) 221, and the amplifying part 241 and current source part 242 of the source-follower circuit 240 are arranged corresponding to the vertical transfer parts (vertical CCD) 212, therefore the influence of the noise superimposed over the signals generated in the connecting part 231 is reduced, and further lower noise/higher speed reading becomes possible.

In the fifth example of the configuration in FIG. 17, on the first substrate 110E, the floating diffusion (FD) 221, the amplifying part 241 and current source part 242 of the source-follower circuit 240, and the buffer amplifying part 232 are arranged corresponding to the vertical transfer parts (vertical CCD) 212, therefore further lower noise/higher speed reading becomes possible.

In the sixth example of the configuration in FIG. 18, on the first substrate 110F, the floating diffusion (FD) 221, the amplifying part 241 and current source part 242 of the source-follower circuit 240, and the buffer amplifying part 232 are arranged corresponding to the vertical transfer parts (vertical CCD) 212 and further the connecting part 231 and the peripheral circuit part 300 are AC-coupled, therefore further lower noise/higher speed reading becomes possible.

In the seventh example of the configuration in FIG. 19, on the first substrate 110G, the floating diffusion (YD) 221, the amplifying part 241 and current source part 242 of the source-follower circuit 240, and the voltage-to-current (V-I) conversion circuit 234 are arranged corresponding to the vertical transfer parts (vertical CCD) 212, therefore the structure becomes one not influenced much at all by the noise in the connecting part 231 and thus further lower noise/higher speed reading becomes possible.

The eighth example of the configuration in FIG. 20 is configured so that the electrical signals are transmitted in the form of voltage or current between the first substrate 110H and the second substrate 120H, and the signal processing by the ADC 235 and ADC 236 can be carried out on two or more substrates, therefore the signal processing of M-bits is carried out on the first substrate 110H and thus the influence of noise accompanied with the inter-substrate transmission becomes small in the input conversion, so higher precise conversion becomes possible.

The ninth example of the configuration in FIG. 21 is configured so that the output of the amplifier 237 on the first substrate 110I is transferred to the second substrate 120I side, the feedback system is configured by voltage or current, and the signal processing can be carried out by for example the ADC in the peripheral circuit part 300, therefore the influence of noise accompanied with transmission becomes small in the input conversion in the feedback system including the substrate wiring, so more precise conversion becomes possible.

In the 10th example of the configuration in FIG. 22, in the feedback amplification system with the floating diffusion (FD) the deterioration of the noise characteristic due to the drop of the conversion gain accompanied with the increase of capacity due to the connection with the second substrate 120J can be made smaller by the arrangement of the feedback type amplifier 238, therefore there is little influence due to noise in the connecting part 231, and further lower noise/higher speed reading becomes possible.

Second Embodiment

Figure 23:
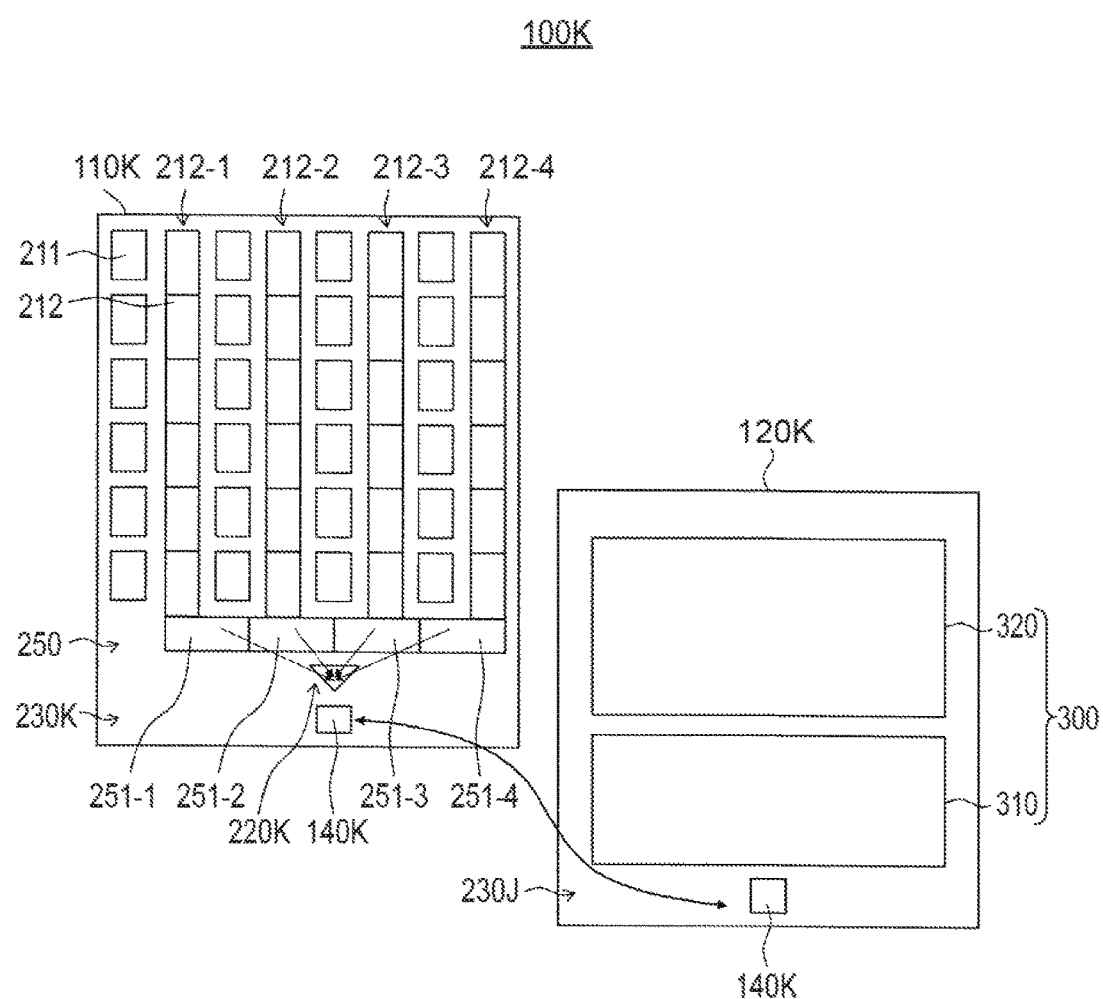
FIG. 23 is a view for explaining an example of the configuration of a solid-state imaging device according to a second embodiment of the present invention.

FIG. 23 is a view for explaining an example of the configuration of a solid-state imaging device according to a second embodiment of the present invention.

The difference of a solid-state imaging device 100K according to the second embodiment from the solid-state imaging device 100 in the first embodiment explained above is as follows. The solid-state imaging device 100K in the second embodiment includes a relay selecting part 250 which selectively connects a plurality of vertical transfer parts 212-1 to 212-4 and the conversion/output part 220 (and connecting part 231).

In the second embodiment, a plurality of selection electrodes 251-1, 251-2, 251-3, and 251-4 are arranged on the first substrate 110K. Further, on the first substrate 110K and second substrate 120K, one common conversion/output part 220K and through-via (TSV) 140K as the connecting part are formed for a plurality of selection electrodes 251-1 to 251-4.

In FIG. 23, at the through-via 140K on the first substrate 110K side, the signal charges which are transferred through the vertical transfer parts 212-1 to 212-4 and are selected by either of the selection electrodes 251-1 to 251-4 are supplied as the electrical signals after being converted in the conversion/output part 220K.

The basic operations in the configuration of FIG. 23 are carried out in the following way. On the first substrate 110K side, the signal charges of the vertical transfer part 212-1 selected by the selection electrode 251-1 are converted to electrical signals in the conversion/output part 220K and are transferred through the through-via 140K to the second substrate 120K side. On the first substrate 110K side, the signal charges of the vertical transfer part 212-2 selected by the selection electrode 251-2 are converted to electrical signals in the conversion/output part 220K and are transferred through the through-via 140K to the second substrate 120K side. On the first substrate 110K side, the signal charges of the vertical transfer part 212-3 selected by the selection electrode 251-3 are converted to electrical signals in the conversion/output part 220K and are transferred through the through-via 140K to the second substrate 120K side. On the first substrate 110K side, the signal charges of the vertical transfer part 212-4 selected by the selection electrode 251-4 are converted to electrical signals in the conversion/output part 220K and are transferred through the through-via 140K to the second substrate 120K side.

The above description covers the basic operations. It is also possible to configure the device so that the selection electrodes 251-1 to 251-4 are selected one by one. However, for example, two or more selection electrodes may be simultaneously selected, or a predetermined selection electrode may not be selected in a predetermined operation, and so on. Various embodiments are possible. By performing such driving, while maintaining progressive reading, it becomes possible to easily perform signal addition or signal thinning in the horizontal direction without causing even a drop of the detection sensitivity. That is, in the second embodiment, addition or thinning of signal charges of the parallel plurality of vertical (charge) transfer parts 212-1 to 212-4 is possible.

Further, in the second embodiment, pluralities of columns are defined as groups (four adjoining columns are defined as one group in the example in FIG. 23) and single through-vias (TSV) 140K are formed by bundling the columns in units of groups, therefore the number of through-vias can be decreased. This is also advantageous in layout. That is, in the second embodiment, provision of a sensor executing progressive reading from the pixel portions 211 at a high speed becomes possible, and the connecting parts, that is, the through-vias (TSV), are formed with a repetition pitch larger than that for the vertical transfer parts (vertical CCD), therefore the formation of through-vias (TSV) etc. as the connecting parts becomes easy.

Example of Configuration of Relay Selecting Part 250

Next, a concrete example of the configuration of the relay selecting part 250 will be explained.

Figure 24:
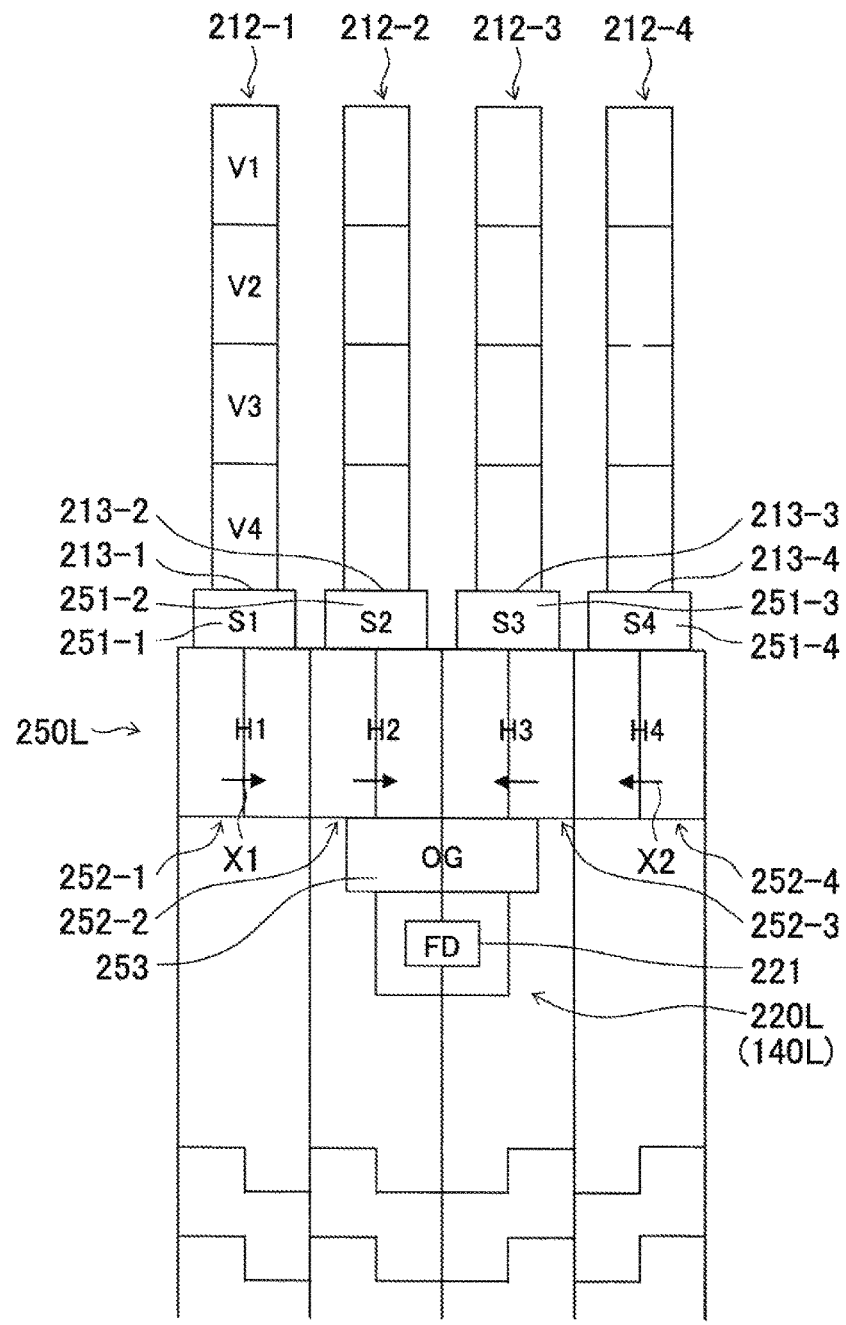
FIG. 24 is a view showing a first example of the configuration of a relay selecting part on the first substrate side according to the second embodiment.

FIG. 24 is a view showing a first example of the configuration of the relay selecting part on the first substrate side according to the second embodiment. In a relay selecting part 250L in FIG. 24, a conversion/output part 220L (through-via (TSV) 140L) is formed at substantially the central part of the X-direction (horizontal direction) of the four columns of vertical transfer parts (VCCD) 212-1 to 212-4, that is, at the position between the array position of the vertical transfer part 212-2 in the second column and the array position of the vertical transfer part 212-3 in the third column. Further, the vertical transfer parts 212-1 to 212-4 in FIG. 24 are exemplified as 4-phase drives using driving pulses V1 to V4.

The relay selecting part 250L in FIG. 24 includes the selection electrodes 251-1 (S1) to 251-4 (S4), horizontal transfer parts (HCCD) 252-1 to 252-4, and open gate (OG) 253.

The selection electrodes 251-1 (S1) to 251-4 (S4) are arranged in the output end parts 213-1 to 213-4 of the vertical transfer parts (VCCD) 212-1 to 212-4. The selection electrodes 251-1 (S1) to 251-4 (S4) function as the gates of the transistors configuring the output gates etc. and are controlled to a potential so as to become a conductive state at the time of selection.

The horizontal transfer parts (HCCD) 252-1 to 252-4 are arranged so that they are positioned in the output parts of the individually corresponding selection electrodes 251-1 (S1) to 251-4 (S4) and are configured as the HCCDs which are different in the transfer direction directed to the OG 253 arranged at the center.

The horizontal transfer part 252-1 is arranged on the output side of the selection electrode 251-1 in the first column. The horizontal transfer part 252-1 is driven by the driving pulse H1, transfers the signal charges from the vertical transfer part 212-1 toward the right direction in FIG. 24, that is, the horizontal direction X1, and further transfers the same to the adjoining horizontal transfer part 252-2.

The horizontal transfer part 252-2 is arranged on the output side of the selection electrode 251-2 in the second column. The horizontal transfer part 252-2 is driven by the driving pulse H2, transfers the signal charges from the vertical transfer part 212-2 or the signal charges of the vertical transfer part 212-1 from the horizontal transfer part 252-1 toward the right direction in FIG. 24, that is, the horizontal direction X1, and further transfers the same to the OG 253 which is connected to its own stage.

The horizontal transfer part 252-4 is arranged on the output side of the selection electrode 251-4 in the fourth column. The horizontal transfer part 252-4 is driven by the driving pulse H4, transfers the signal charges from the vertical transfer part 212-4 toward the left direction in FIG. 24, that is, the horizontal direction X2, and further transfers the same to the adjoining horizontal transfer part 252-3.

The horizontal transfer part 252-3 is arranged on the output side of the selection electrode 251-3 in the third column. The horizontal transfer part 252-3 is driven by the driving pulse H3, transfers the signal charges from the vertical transfer part 212-3 or the signal charges of the vertical transfer part 212-4 from the horizontal transfer part 252-4 toward the left direction in FIG. 24, that is, the horizontal direction X2, and further transfers the same to the OG 253 which is connected to its own stage.

The OG 253 is arranged between the signal charge supply portion of the horizontal transfer part 252-2 and signal charge supply portion of the horizontal transfer part 252-3 and the floating diffusion (FD) 221 of the conversion/output part 220L and is controlled to the conductive state to thereby transfer the signal charges which are selected by the selection electrodes 251-1 (S1) to 251-4 (S4) and are transferred through the horizontal transfer Parts 252-1 to 252-4 to the floating diffusion (FD) 221.

In this first example of the configuration as well, a configuration selecting the selection electrodes 251-1 to 251-4 one by one is also possible. However, for example two or more selection electrodes may be simultaneously selected, or a predetermined selection electrode may not be selected in a predetermined operation, and so on. Various embodiments are possible. Due to this, addition or thinning of the signal charges of the parallel plurality of vertical (charge) transfer parts 212-1 to 212-4 is possible without causing a drop of the detection sensitivity while maintaining progressive reading as it is. Further, according to the first example of the configuration, pluralities of columns (four in this example) are defined as groups and single conversion/output parts 220L (through-vias (TSV) 140L) are formed by bundling the columns in units of groups, therefore the number of conversion/output parts and through-vias can be decreased. This is advantageous in layout as well. That is, according to the first example of the configuration, provision of a sensor executing progressive reading from the pixel portions 211 at a high speed becomes possible, and the conversion/output part, the connecting part comprised of the through-via (TSV), etc. are formed at a repetition pitch larger than that for the vertical transfer part (vertical CCD) 212, therefore the formation of the conversion/output part and the connecting part comprised of the through-via (TSV) etc. becomes easy.

Figure 25:
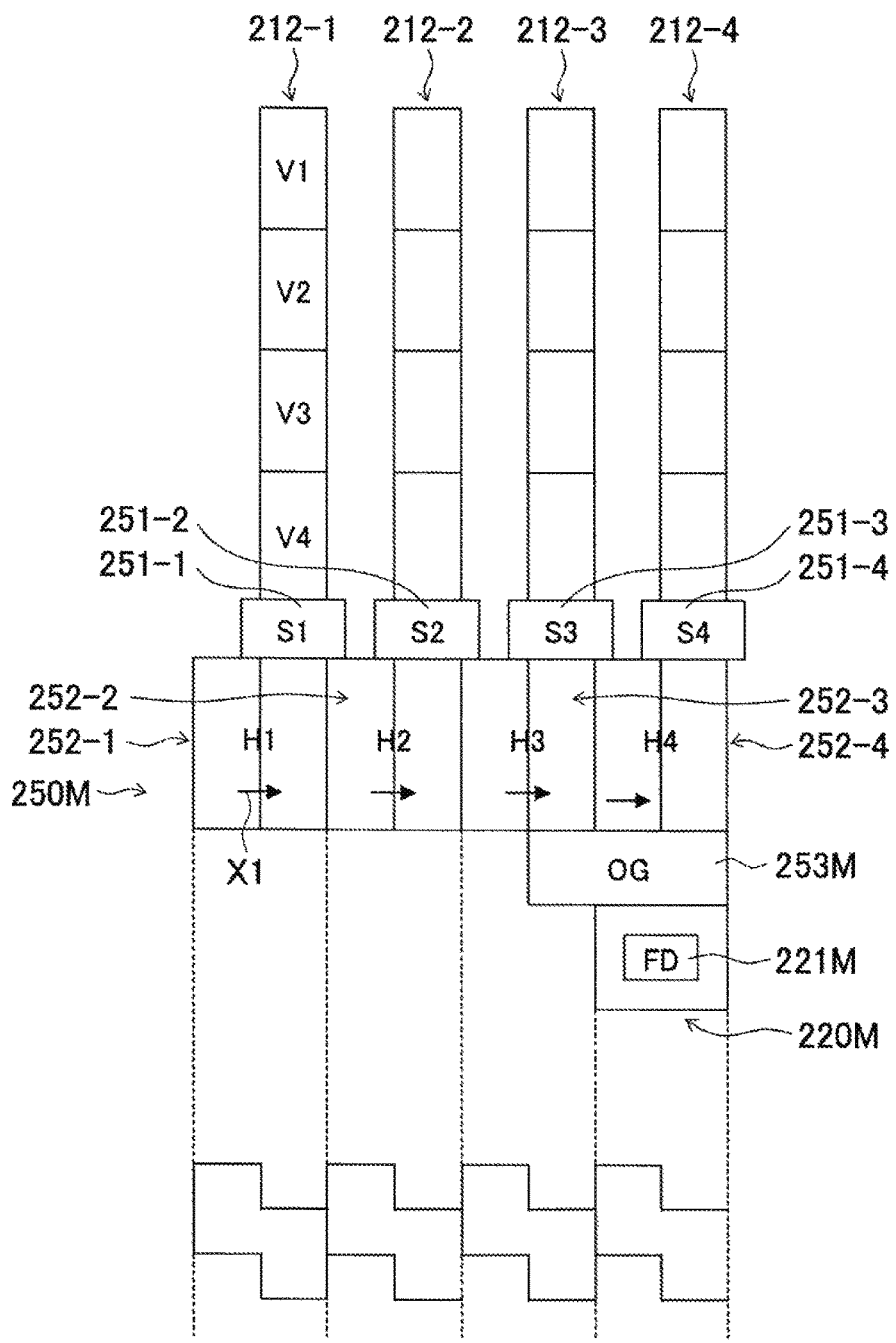
FIG. 25 is a view showing a second example of the configuration of a relay selecting part on the first substrate side according to the second embodiment.

FIG. 25 is a view showing a second example of the configuration of the relay selecting part on the first substrate side according to the second embodiment. The difference of the relay selecting part 250M in FIG. 25 from the relay selecting part 250L in FIG. 24 resides in that the array position of the conversion/output part 220M (through-via (TSV)) is not in the central part of the arrangement of the four columns of the vertical transfer parts 212-1 to 212-4, but it is formed in the vicinity of the array position of the vertical transfer part 212-4 of the fourth column which at one end side of the X-direction (right end side in the example in FIG. 25).

In a relay selecting part 250M in FIG. 25, the horizontal transfer part 252-1 is driven by the driving pulse H1, transfers the signal charges by the vertical transfer part 212-1 toward the right direction in FIG. 25, that is, the horizontal direction X1, and further transfers the same to the adjoining horizontal transfer part 252-2.

The horizontal transfer part 252-2 is driven by the driving pulse H2, transfers the signal charges from the vertical transfer part 212-2 or the signal charges of the vertical transfer part 212-1 from the horizontal transfer part 252-1 toward the right direction in FIG. 25, that is, the horizontal direction X1, and further transfers the same to the adjoining horizontal transfer part 252-3.

The horizontal transfer part 252-3 is driven by the driving pulse 113, transfers the signal charges from the vertical transfer part 212-3 or the signal charges of the vertical transfer parts 212-1 and 212-2 from the horizontal transfer part 252-2 toward the right direction in FIG. 25, that is, the horizontal direction X1, and further transfers the same to the adjoining horizontal transfer part 252-4.

The horizontal transfer part 252-4 is driven by the driving pulse 114, transfers the signal charges from the vertical transfer part 212-4 toward the right direction in FIG. 25, that is, the horizontal direction X1, and supplies the signal charges of the vertical transfer part 212-4 or the signal charges of the vertical transfer parts 212-1, 212-2, and 212-3 by the horizontal transfer part 252-3 to the OG 253M which is connected to its own stage.

The OG 253M is arranged between the signal charge supply portion of the horizontal transfer part 252-4 and the floating diffusion (FD) 221M of the conversion/output part 220M and is controlled to the conductive state to thereby transfer the signal charges which are selected by the selection electrodes 251-1 (S1) to 251-4 (S4) and are transferred through the horizontal transfer parts 252-1 to 252-4 to the floating diffusion (FD) 221M.

According to the second example of the configuration, the same effects as those by the first example of the configuration explained above can be obtained.

Figure 26:
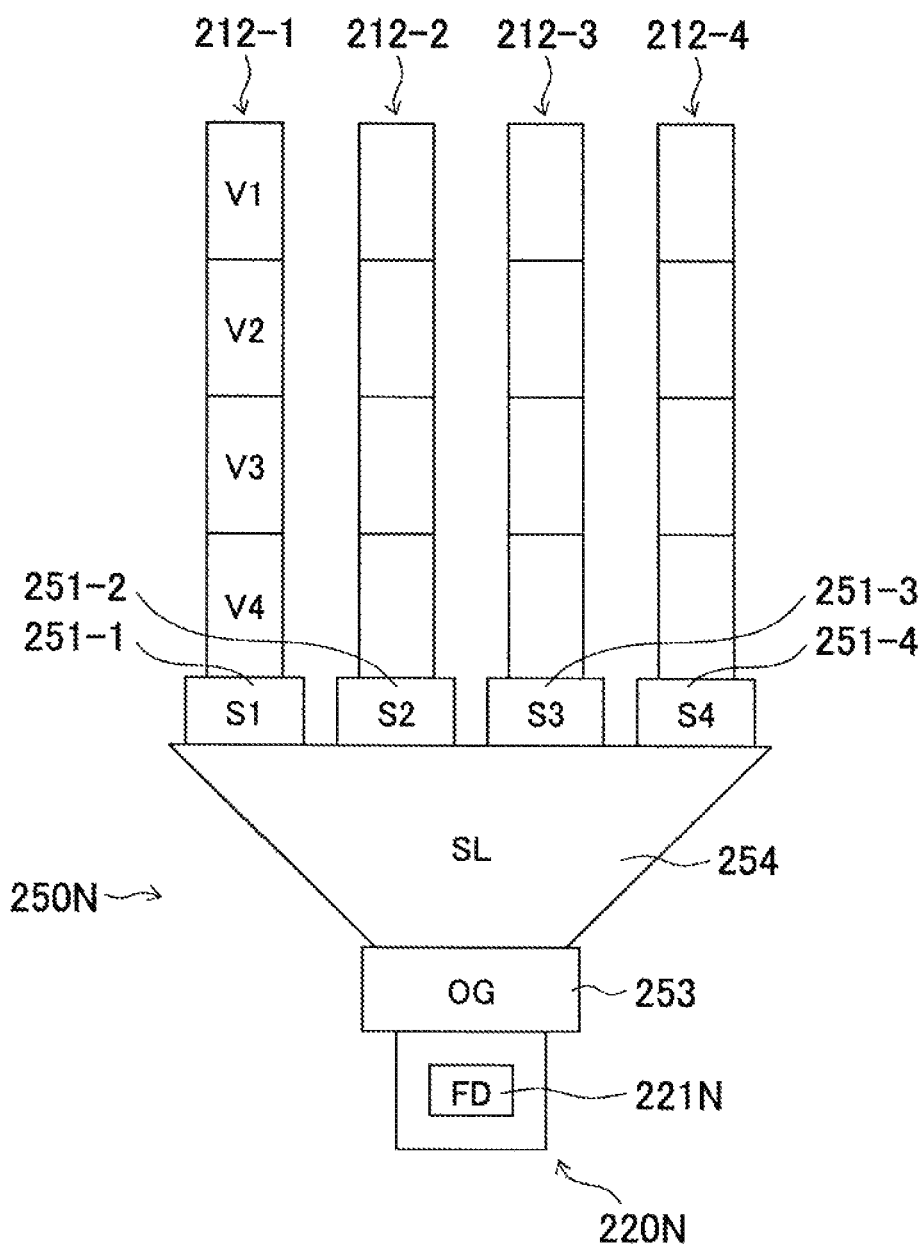
FIG. 26 is a view showing a third example of the configuration of the relay selecting part on the first substrate side according to the second embodiment.

FIG. 26 is a view showing a third example of the configuration of the relay selecting part on the first substrate side according to the second embodiment.

The difference of a relay selecting part 250N in FIG. 26 from the relay selecting part 250L in FIG. 24 resides in that a potential slope portion (SL) 254 is provided in place of the horizontal transfer part. In this relay selecting part 250N, the signal charges of the vertical transfer parts 212-1 to 212-4 selected by the selection electrodes 251-1 (S1) to 251-4 (S4) pass through the potential slope portion 254 and are further transferred through the OG 253 to the floating diffusion (FD) 221N.

According to the third example of the configuration, the same effects as those by the first example of the configuration explained above can be obtained.

Third Embodiment

FIG. 27 is a view for explaining an example of the configuration of a solid-state imaging device according to a third embodiment of the present invention.

The difference of a solid-state imaging device 100O according to the third embodiment from the solid-state imaging device 100 in the first embodiment explained above is as follows. In the solid-state imaging device 100O according to the third embodiment, on the second substrate 120O, the ADC 341, serializer 342, memory 343, and timing generator (TG) 344 of the signal processing system comprised of the peripheral circuit part 300O are formed. The timing generator (TG) 344 includes a CCD pulse driving part and level shift etc.

Here, using a CMOS image sensor as a comparative example, the chip sizes of a CCD image sensor and a CMOS image sensor used as the solid-state imaging device 100O according to the third embodiment mounting the signal processing system on the second substrate 120O will be considered.

Figure 29A:
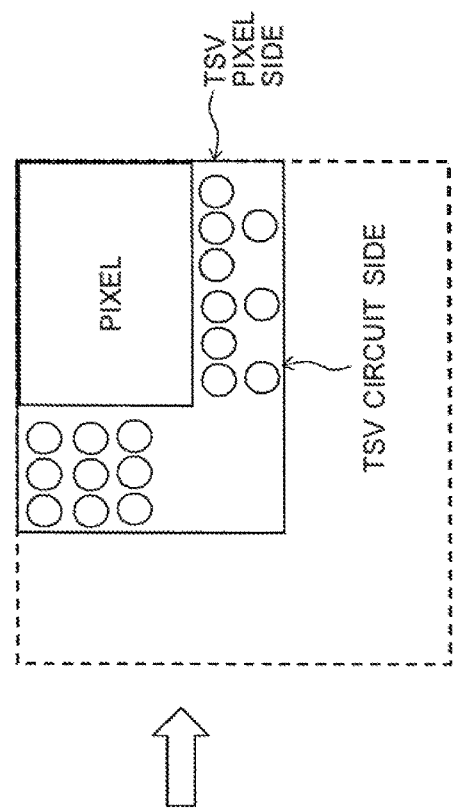
FIGS. 29A and 29B are views for explaining an example of chip reduction according to the stacked structure of the CMOS image sensor.
Figure 29B:
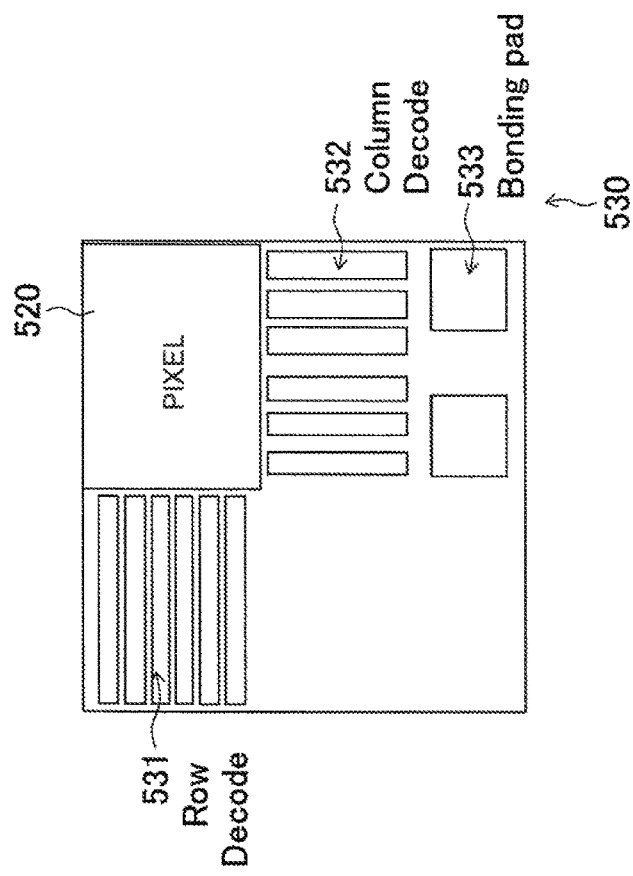
Figures 30A, 30B, 30C:
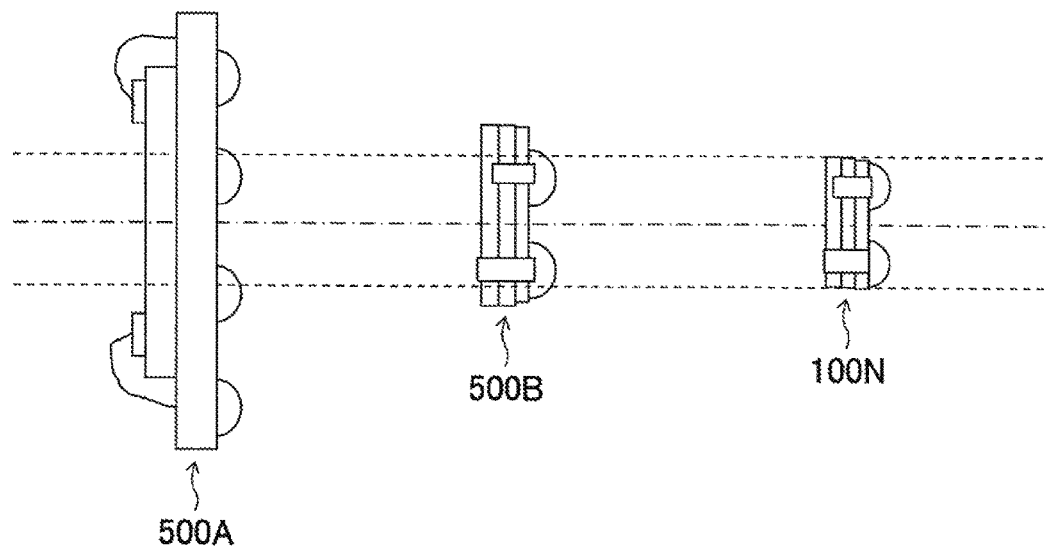
FIG. 30A to FIG. 30C are views showing simplified cross-sections of a CMOS image sensor chip which does not have a stacked structure, a CMOS image sensor chip having a stacked structure, and a CCD image sensor chip according to the present embodiment.

FIGS. 28A and 28B are views showing examples of the stacked structure of a comparative example comprised of a back surface irradiation type CMOS image sensor. FIG. 28A shows a first example of the configuration of the CMOS image sensor, and FIG. 28B shows a second example of the configuration of the CMOS image sensor stacked. FIGS. 29A and 29B are views for explaining an example of chip reduction using a stacked structure of the CMOS image sensor. FIG. 29A shows a pixel portion and peripheral circuit in the case where there is no stacked structure, and FIG. 29B shows an example where reduction is achieved by a stacked structure. FIGS. 30A to 30C are views showing simplified cross-sections of a CMOS image sensor chip which does not have a stacked structure, a CMOS image sensor chip having a stacked structure, and a CCD image sensor chip according to the present embodiment. FIG. 30A shows a CMOS image sensor chip which does not have a stacked structure, FIG. 30B shows an CMOS image sensor chip having a stacked structure, and FIG. 30C shows a CCD image sensor chip according to the present embodiment.

In general, a CMOS image sensor 500A, as shown in FIG. 28A, is configured by a supporting substrate 510 and a chip 540 on which a pixel portion 520 and signal processing circuit 530 are formed. The stacked type structure, as shown in FIG. 28B, uses a chip 550 on which the signal processing circuit 530 is formed in place of the supporting substrate, and the pixel portion 520 is superimposed on that. By employing this stacked structure, reduction of size can be realized.

In such a CMOS image sensor, the peripheral circuit comprised of the signal processing circuit 530, as shown in FIG. 29A, is configured by a row decoder (ROW decode) 531, column decoder (column decode) 532, or row (column) selection circuit, bonding pads 533, and so on. By arranging the peripheral circuit comprised of the signal processing circuit 530 in the second layer, according to certain configurations, for example, as shown in FIG. 29B, the peripheral circuit region can be deleted. However, in order to make the pixel driving signal-use signal from the row decoder 531 pass through the through-via (TSV) for each row, the TSV region newly becomes necessary for each row or column.

As a result, by employing a stacked structure, as shown in FIGS. 30A and 30B, the CMOS image sensor chip can reduce a chip size of about a half compared with the case where the stacked structure is not employed. However, as shown in FIGS. 30B and 30C, even when the CMOS image sensor chip uses the stacked structure as explained above, since the TSV region newly becomes necessary for each row and column or the like, according to certain configurations, for example, the size becomes about 1.5 times larger than the CCD image sensor chip according to the present embodiment.

In other words, in the CCD image sensor according to the present embodiment, interlayer connection through a connecting part comprised of a through-via (TSV) becomes possible, therefore wire bonding becomes unnecessary, so a small-sized package of a die size level becomes possible, thus by connection of for example BGA, compact camera module mounting becomes possible. In this way, by mounting of the present stacked CCD package, an ultra-small sized camera module can be realized.

Further, a plurality of structures providing a global shutter in a CMOS image sensor have been proposed in NPLT 1 etc. However, in each example, it is necessary to add a special circuit in the pixel array causing the demerits that a drop of the sensitivity and increase of noise are caused. Further, in the example of improvement in the conventional CMOS, there were the defects that, when selecting a structure performing signal addition, the SN ratio deteriorates due to an increase of the parasitic capacitance, and the simultaneity of signals is degraded. Contrary to this in the CCD image sensor according to the present embodiment, high speed driving with global reading becomes Possible without forming a special structure in the pixel array, that is, without causing deterioration of the SN ratio. Further, a die size package using inter-chip connection of the through-vias (TSV) becomes possible. Further, by decreasing the number of drive pins by mounting of the peripheral circuit on the second substrate, it becomes possible to provide a camera system having a high performance, small size, and low cost.

Fourth Embodiment

Figure 31:
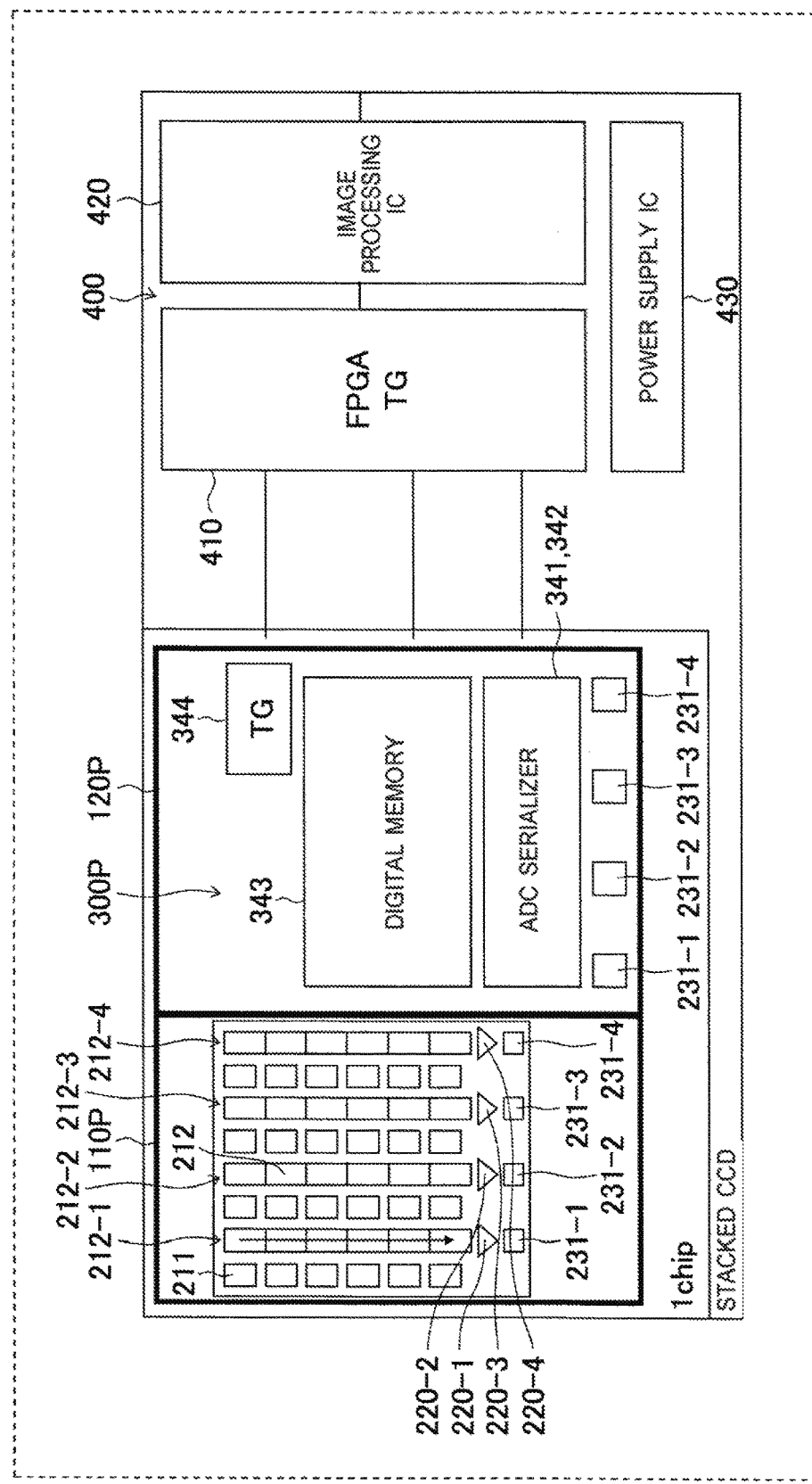
FIG. 31 is a view for explaining an example of the configuration of a solid-state imaging device according to a fourth embodiment of the present invention.

FIG. 31 is a view for explaining an example of the configuration of a solid-state imaging device according to a fourth embodiment of the present invention.

The difference of a solid-state imaging device 100P according to the fourth embodiment from the solid-state imaging device 100O in the third embodiment explained above is as follows. In the solid-state imaging device 100P according to the fourth embodiment, a signal processing part 400 including a timing generator 410, image processing circuit (image processing IC) 420, and power supply circuit (power supply IC) 430 is mounted on the same package as that for the first substrate 110P and second substrate 120P.

By configuring the device in this way, it also becomes possible to incorporate a small-sized camera system in a single package.

Fifth Embodiment

Figure 32:
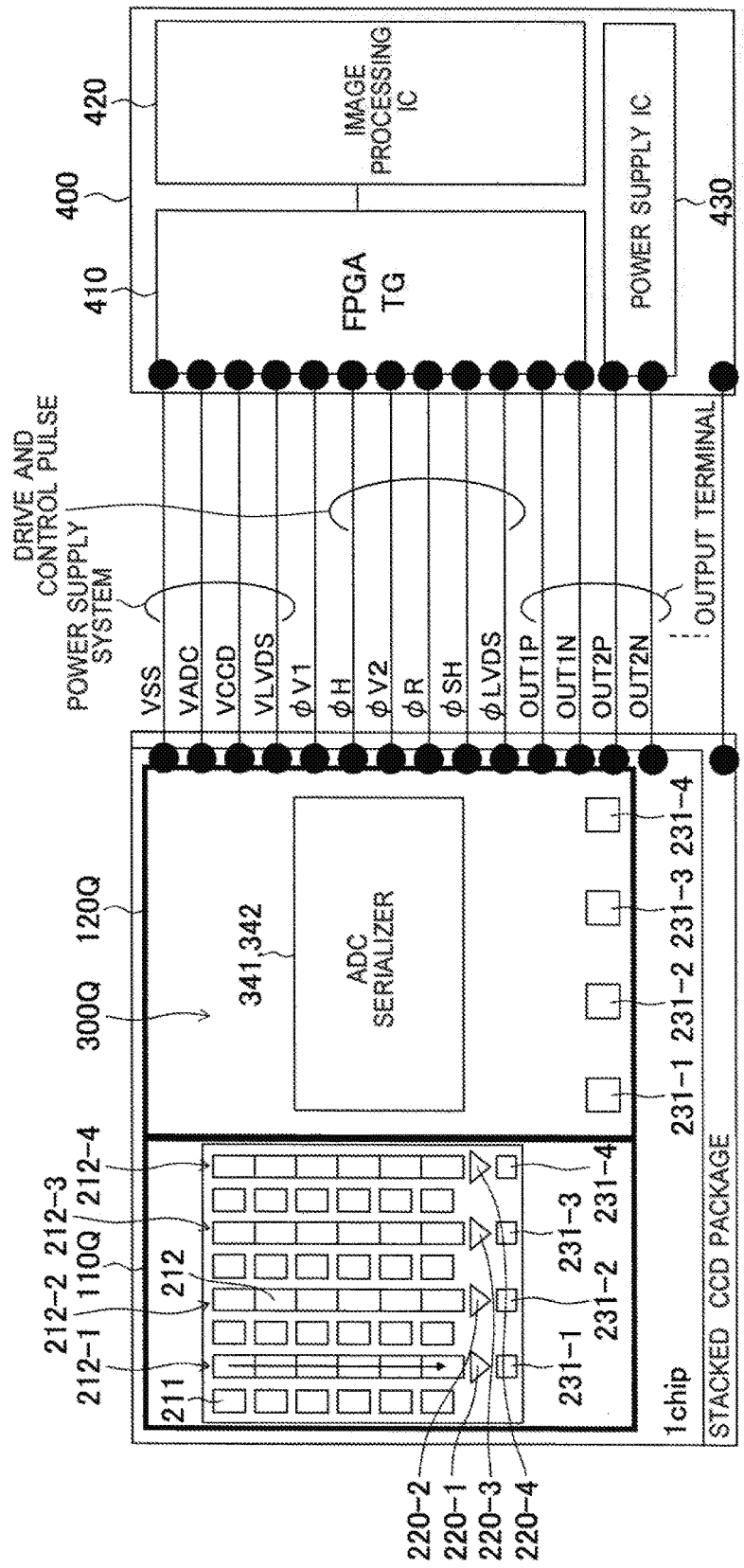
FIG. 32 is a view for explaining an example of the configuration of a solid-state imaging device according to a fifth embodiment of the present invention.

FIG. 32 is a view for explaining an example of the configuration of a solid-state imaging device according to a fifth embodiment of the present invention.

The difference of a solid-state imaging device 100Q according to the fifth embodiment from the solid-state imaging device 100O of the third embodiment explained above is as follows. In the solid-state imaging device 100Q according to the fifth embodiment, on a second substrate 120Q, the ADC 341 and serializer 342 of the signal processing system comprised of the peripheral circuit part 300Q are formed and mixed. The rest of the configuration is the same as that in the third embodiment.

FIG. 32 shows transmission lines of a power supply system, a drive and driving pulse system, and an output terminal system for transmission and reception between the signal processing part 400 and the stacked chip. The driving pulse and power supply which are necessary for the driving are for example the reference power supply VSS (GND) CCD-use power supply VCCD, ADC-use power supply VADC, serial output-use power supply VLVDS, vertical transfer pulses φV1 and φV2, horizontal transfer pulse φH, readout pulse ΦR from the pixel to the vertical transfer part, serial output-use reference clock φLVDS, CCD output-use sample/hold pulse φSH, and serial signal output signal. To the transmission lines of these signals, an external substrate (external board) on which the signal processing part 400 configured by an FPGA etc. is mounted is connected to the pins.

Note that, in the solid-state imaging device 100Q in the present embodiment, the horizontal transfer is not carried out, but horizontal transfer is locally carried out in a case where the horizontal transfer parts are employed in the relay selecting part 250 and output selecting part, therefore a function of generating a horizontal transfer pulse φH as the driving pulse is given.

Figure 33:
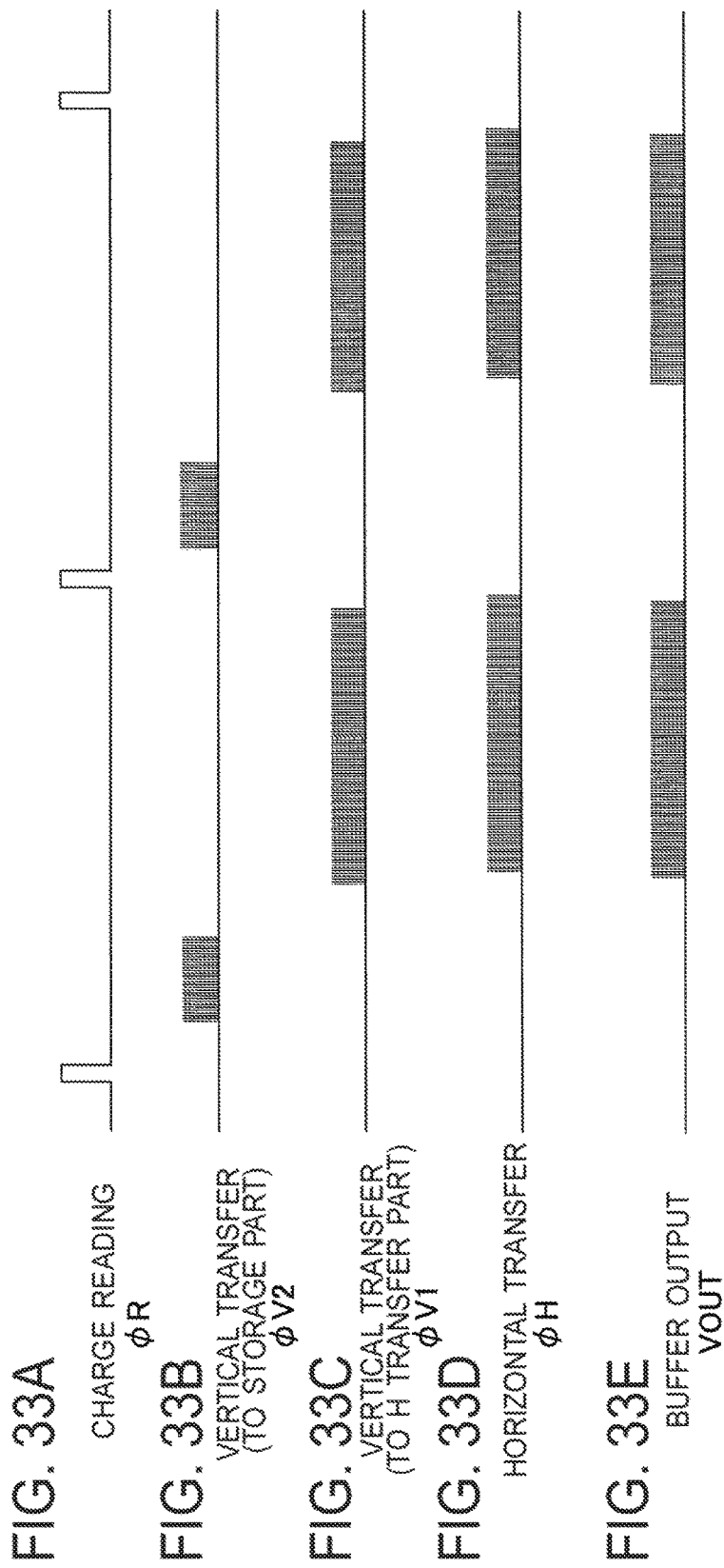
FIG. 33A to 33E are views showing an example of timing of drive signal of the solid-state imaging device as the stacked type CCD image sensor according to the fifth embodiment.

FIGS. 33A to 33E are views showing an example of timing of a drive signal of the solid-state imaging device used as a stacked type CCD image sensor according to the fifth embodiment. FIG. 33A shows the charge readout pulse φR, FIG. 33B shows the vertical transfer pulse φV2, FIG. 33C shows the vertical transfer pulse φV1, FIG. 33D shows the horizontal transfer pulse φH, and FIG. 33E shows the buffer output VOUT.

Figure 1:
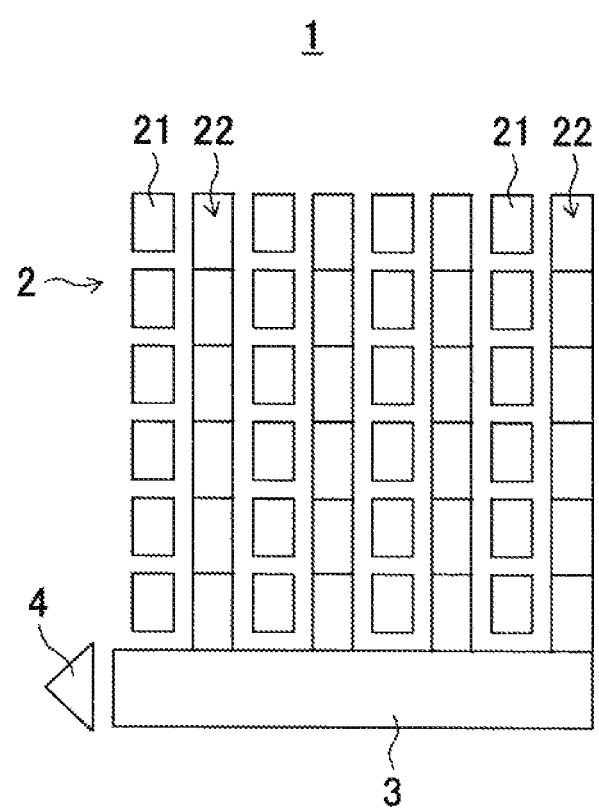
FIG. 1 is a view showing a basic configuration of an IT type CCD image sensor.
Figure 2:
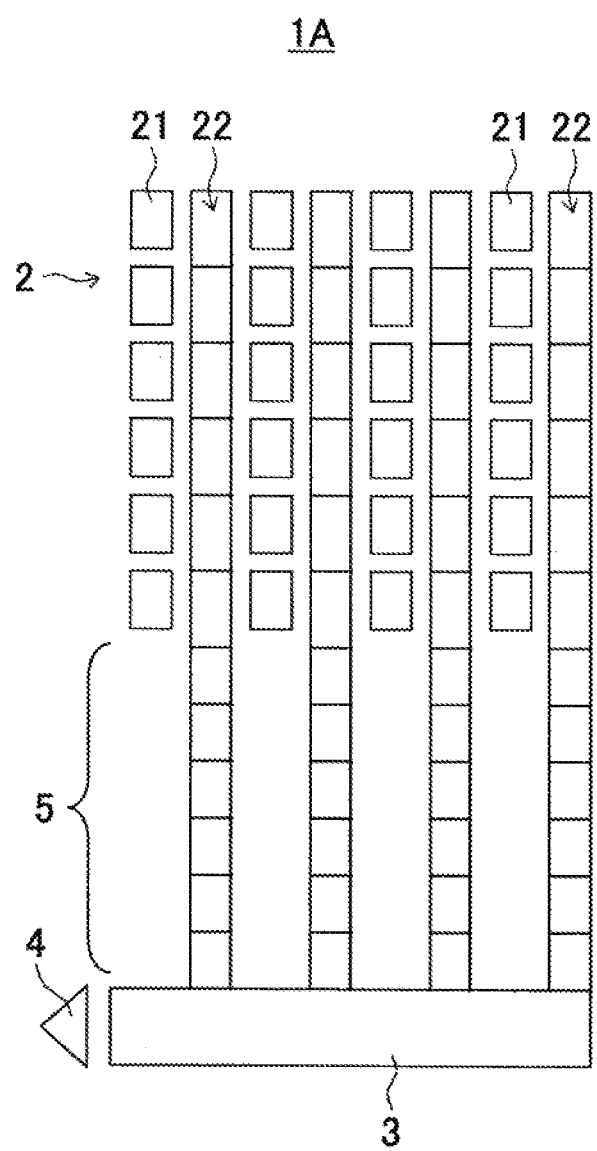
FIG. 2 is a view showing a basic configuration of an FIT type CCD image sensor.
Figure 3:
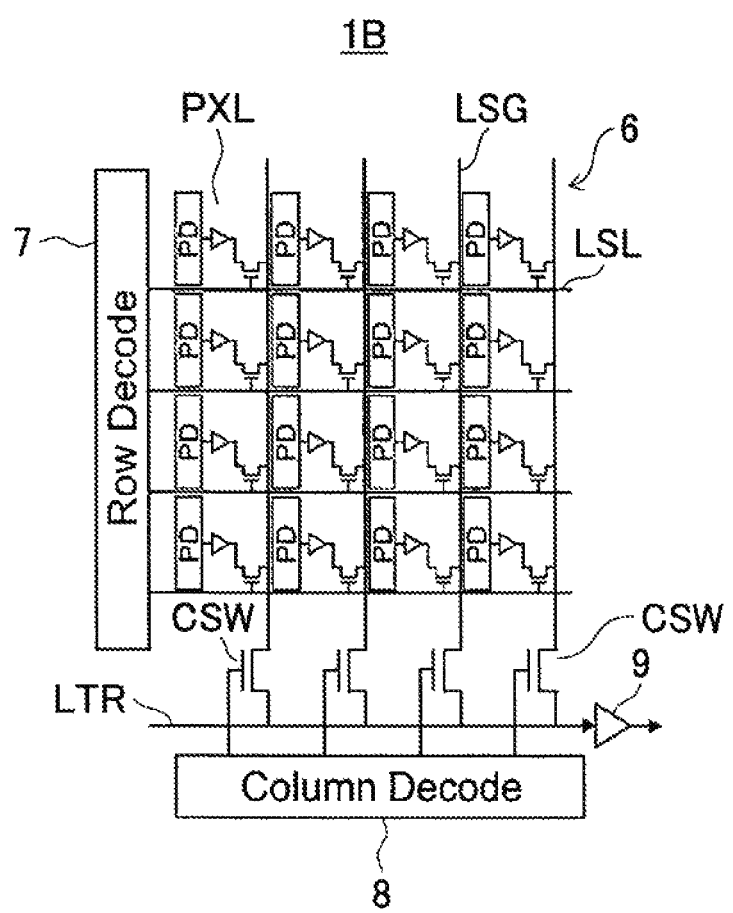
FIG. 3 is a view showing a basic configuration of a CMOS image sensor.
Figure 4:
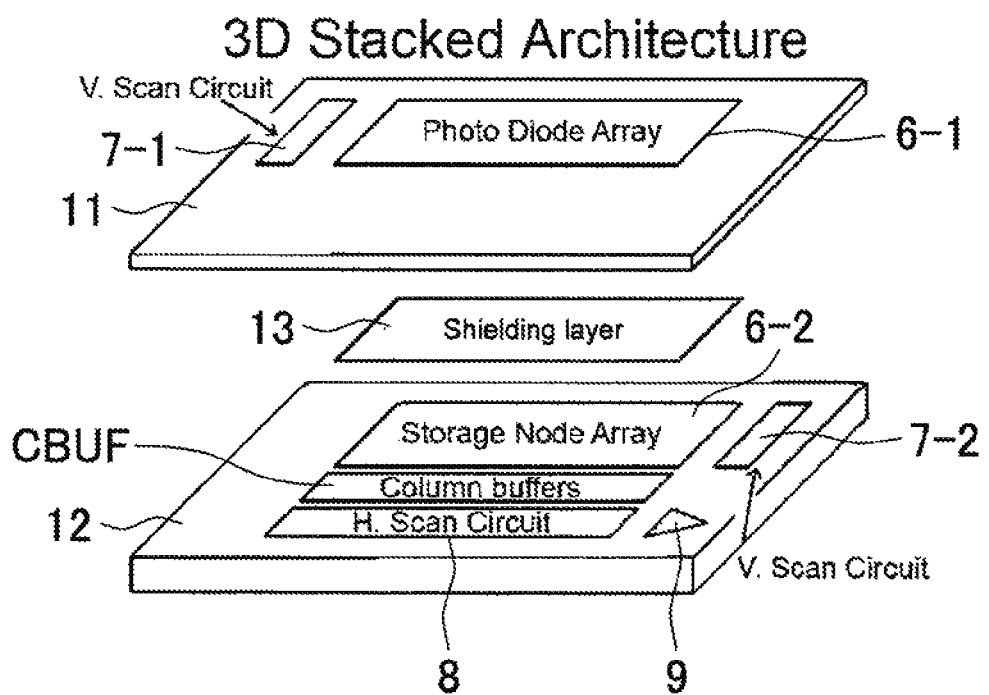
FIG. 4 is a view showing an example of the configuration of a CMOS image sensor employing a stacked architecture.

In the solid-state imaging device 100Q in FIG. 2, the CCD driving pulses φV1 and φV2 are input as external signals. The synchronized image data is converted to serial digital output and output by the built-in ADC 41 and serializer 342, is taken into for example the FPGA 410 on another substrate, and is processed as video signals.

According to the fifth embodiment, the same effects as the effects by the third embodiment explained above can be obtained. Further, in the solid-state imaging device 100Q of the fifth embodiment, on the first substrate 110Q, the vertical transfer parts (vertical CCD) are adjacent to the pixel portions 211, therefore progressive reading is possible. The pixel portions are CCDs. Therefore, the through-vias (TSV) which are connected to the second substrate 120O (second layer) can be greatly reduced compared with the case where the through-vias are stacked on the second layer which is mainly configured as the peripheral circuit of the CMOS image sensor so that they are connected for each row. For example, the through-vias can be arranged only vertically at the chip, therefore it becomes possible to reduce the package size.

Sixth Embodiment

Figure 34:
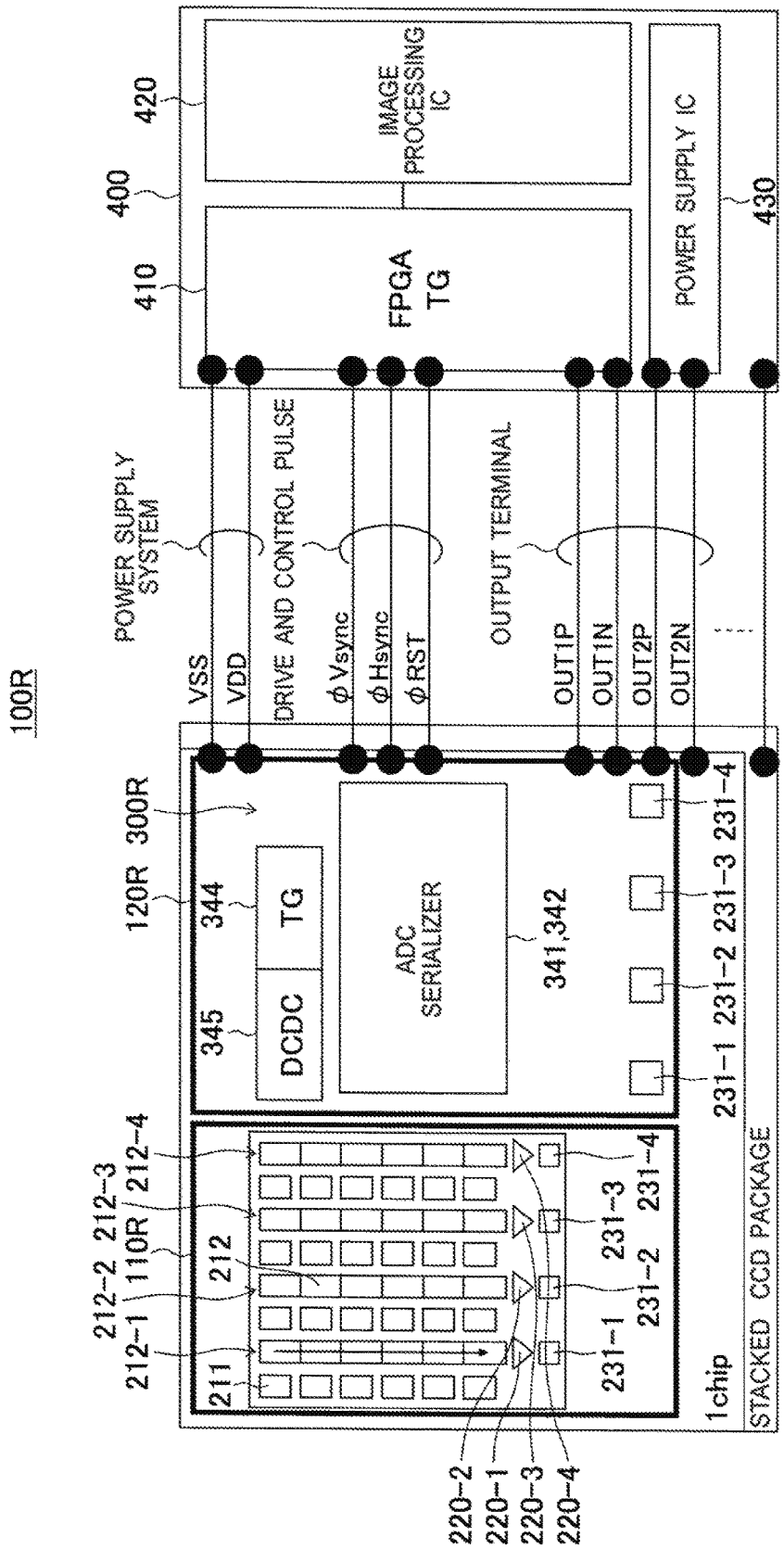
FIG. 34 is a view for explaining an example of the configuration of a solid-state imaging device according to a sixth embodiment of the present invention.

FIG. 34 is a view for explaining an example of the configuration of a solid-state imaging device according to a sixth embodiment of the present invention.

The difference of a solid-state imaging device 100R according to the sixth embodiment from the solid-state imaging device 100Q in the fifth embodiment explained above is as follows. In the solid-state imaging device 100R according to the sixth embodiment, on a second substrate 120R, in addition to the ADC 341 and serializer 342 of the signal processing system comprised of the peripheral circuit part 300R, a driving pulse generator comprised of a timing generator (TG) 344 and a voltage generation circuit comprised of a DCDC converter (DCDC) 345 are mounted.

In the solid-state imaging device 100R according to the sixth embodiment, by mounting the timing generator (TG) 344 and DCDC converter (DCDC) 345, it becomes possible to decrease the pins which are necessary for connection by for example defining the external driving pulses as φVsync (V trigger pulse), φHsync (H trigger pulse), and φRST (reset pulse) and setting VDD and VSS as the power supply.

According to the sixth embodiment, in addition to the same effects as the effects by the fifth embodiment explained above, the following effects can be obtained. That is, according to the sixth embodiment, the number of drive pins can be decreased. Therefore, by arranging the peripheral circuit on the second substrate 120R, there is the advantage that this embodiment can be applied to an electronic apparatus which is used for an application restricted as to mounting size, number of connectable cables, cable lengths, installation heights, and so on in view of requirements for installation of the camera such as, for example, a monitoring camera, medical endoscope-use camera, or the like.

Seventh Embodiment

Figure 35:
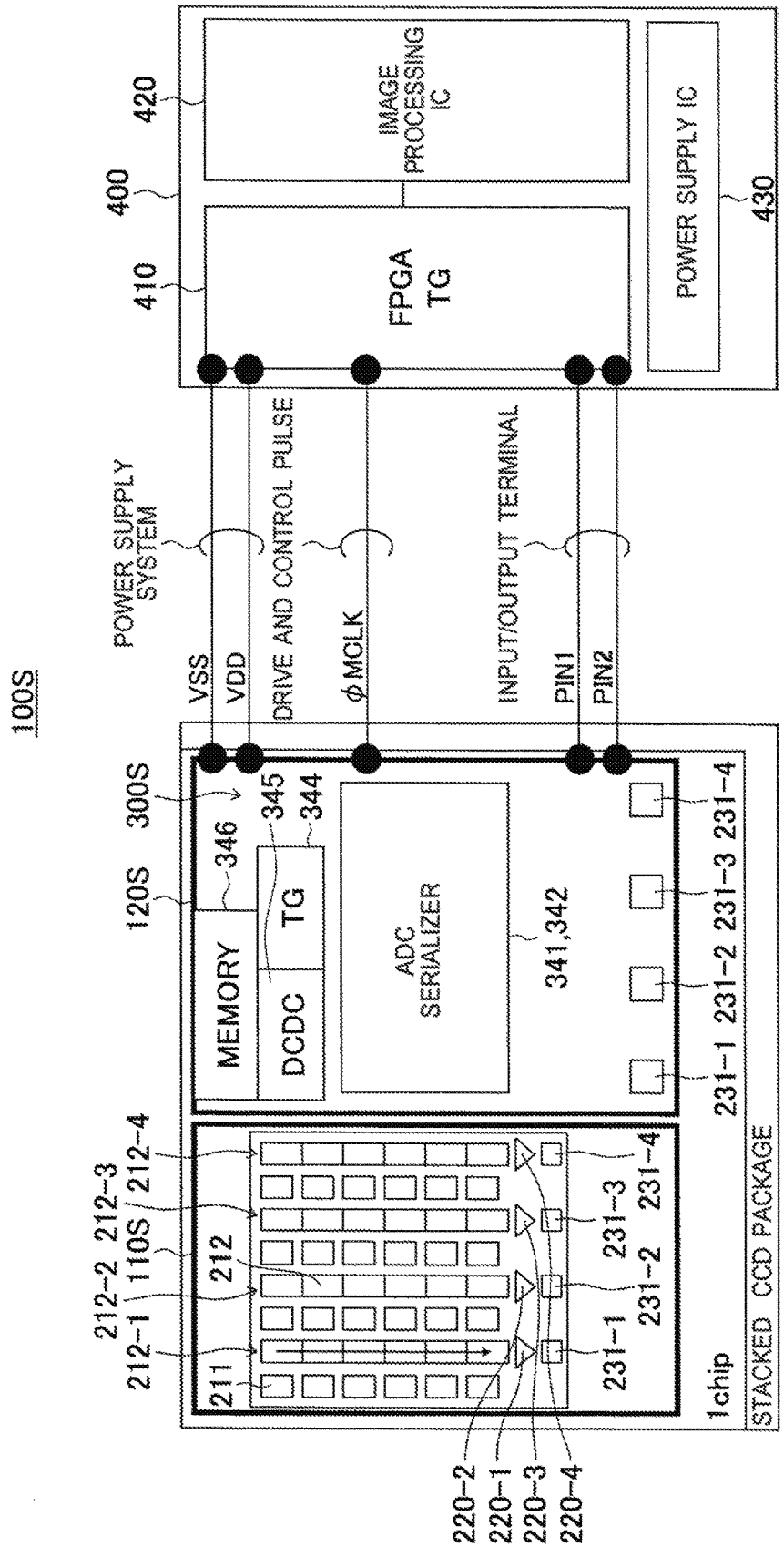
FIG. 35 is a view for explaining an example of the configuration of a solid-state imaging device according to a seventh embodiment of the present invention.

FIG. 35 is a view for explaining an example of the configuration of a solid-state imaging device according to a seventh embodiment of the present invention.

The difference of a solid-state imaging device 100S according to the seventh embodiment from the solid-state imaging device 100R in the sixth embodiment explained above is as follows. In the solid-state imaging device 100S according to the seventh embodiment, on a second substrate 120S, in addition to the ADC 341, serializer 342, timing generator (TG) 344, and DCDC converter (DCDC) 345 of the signal processing system of the peripheral circuit part 300S, a memory 346 is mounted. Further, in the solid-state imaging device 100S according to the seventh embodiment, by making the power supply function by a switch, the terminals PIN1 and PIN2 for the driving pulse and output signal pulse are shared.

Figure 36:
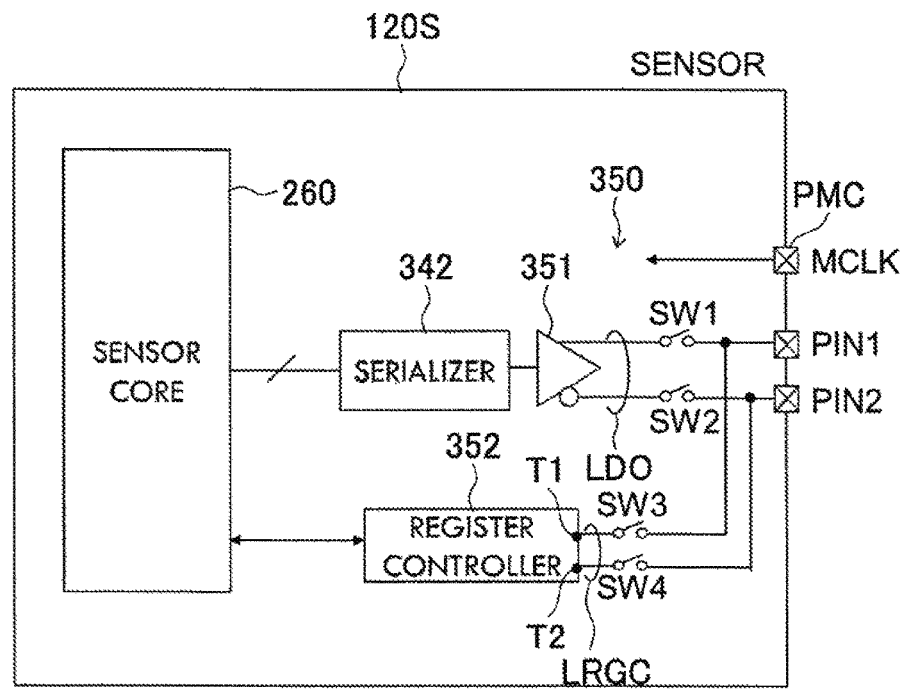
FIG. 36 is a view showing an example of the configuration for realizing sharing of terminals for a drive pulse and output signal pulse in the solid-state imaging device according to the seventh embodiment.

Example of Configuration for Realizing Sharing of Terminals for Driving Pulse and Output Signal Pulse Here, an explanation will be given of the example of configuration of a solid-state imaging device 100S according to the seventh embodiment for realizing sharing of the terminals PIN1 and PIN2 for the driving pulse and output signal pulse. FIG. 36 is a view showing an example of the configuration for sharing of the terminals for the driving pulse and output signal pulse in the solid-state imaging device 100S according to the seventh embodiment.

In FIG. 36, a sharing circuit 350 of the terminals for the driving pulse and output signal pulse on the second substrate 120S is extracted and shown. Further, a sensor core 260 including the output part of the imaging element part 200S and a not shown driving system etc. is shown.

On the second substrate 120S in FIG. 36, a master clock-use terminal PMC and incident input/output terminals PIN1 and PIN2 are formed. The sharing circuit 350 in FIG. 36 has a differential output circuit 351, register controller 352, and switches SW1 to SW4. In this sharing circuit 350, the input/output terminals PIN1 and PIN2 are shared by the register control line LRGC and data output line LDO. The sharing circuit 350 switches them by the switches SW1 to SW4.

In the sharing circuit 350, the input part of the differential output circuit 351 is connected to the output part of the serializer 342, the positive side output part of the differential output circuit 351 is connected through the switch SW1 to the input/output terminal PIN1, and the negative side output part is connected through the switch SW2 to the input/output terminal PIN2. A first input/output terminal T1 of the register controller 352 is connected through the switch SW3 to the input/output terminal PIN1, and a second input/output terminal T2 is connected through the switch SW4 to the input/output terminal PIN2.

Figure 37:
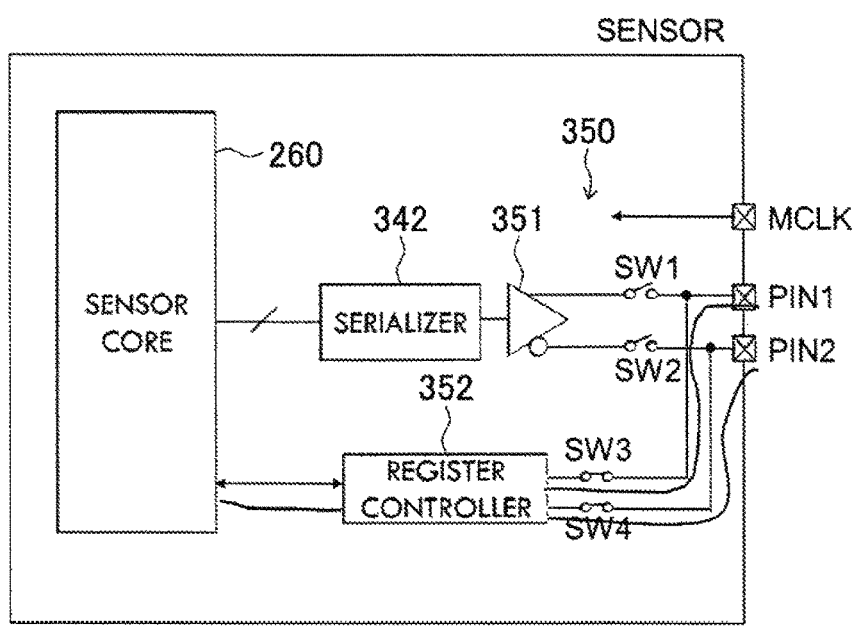
FIG. 37 is a view for explaining an operation at the time of a register control mode of the sharing circuit according to the seventh embodiment.
Figure 38:
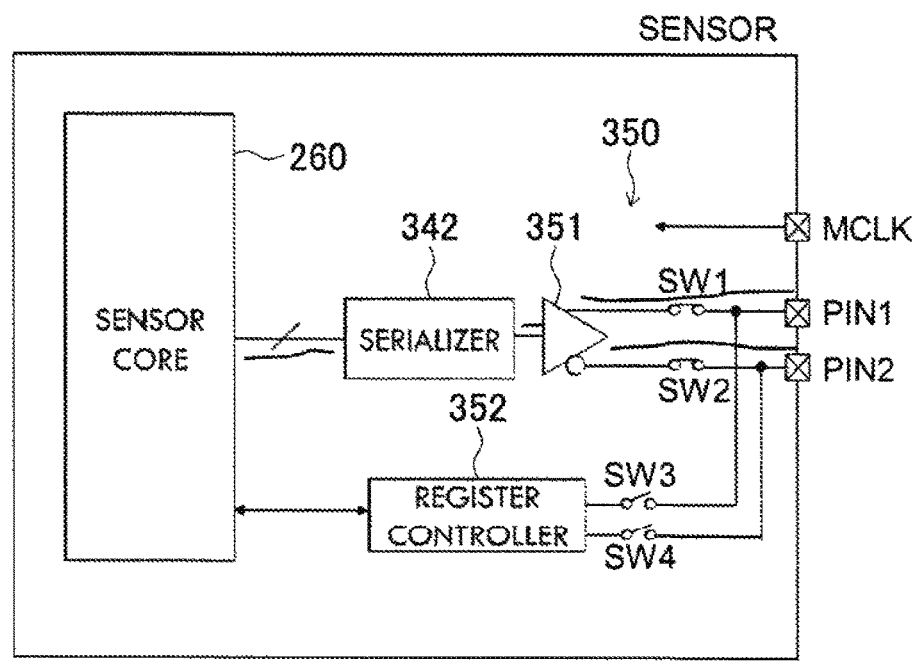
FIG. 38 is a view for explaining the operation at the time of an image data streaming mode of the sharing circuit according to the seventh embodiment.
Figure 39:
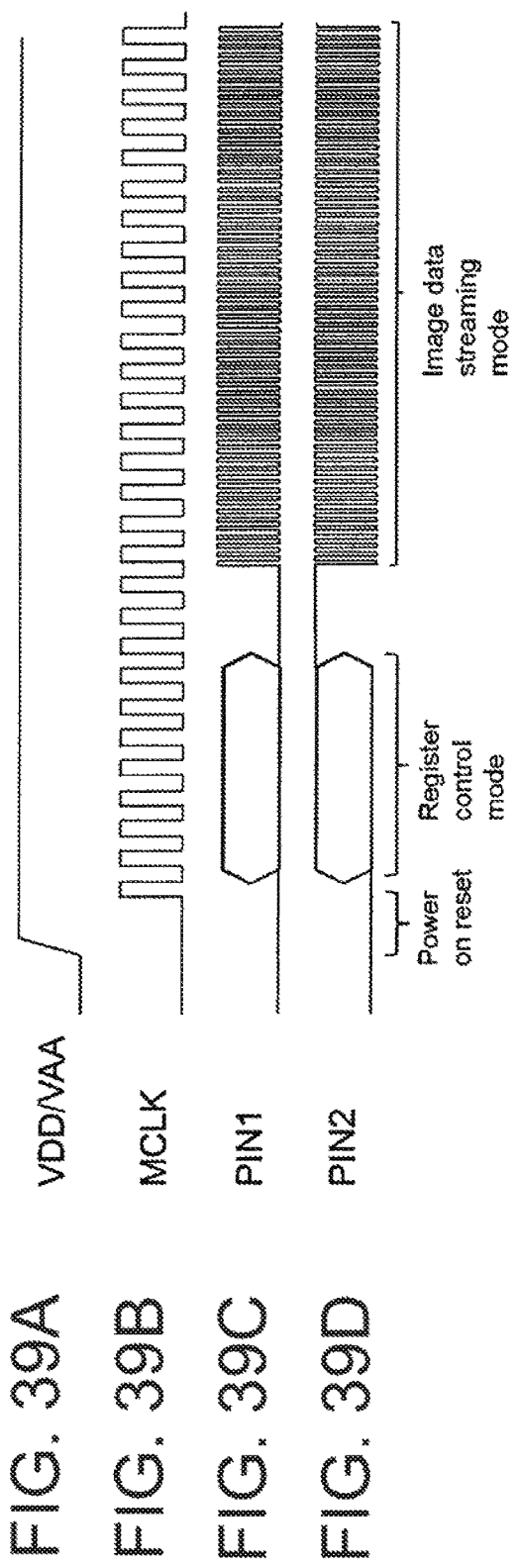
FIGS. 39A to 39D are timing charts for explaining operations at the time of a register control mode and the time of an image data streaming Mode of the sharing circuit according to the seventh embodiment.

Next, an example of operations of the sharing circuit will be explained with reference to FIG. 37 to FIG. 39. FIG. 37 is a view for explaining the operation of the sharing circuit according to the seventh embodiment at the time of a register control mode. FIG. 38 is a view for explaining the operation of the sharing circuit according to the seventh embodiment at the time of an image data streaming mode. FIGS. 39A to 39D are timing charts for explaining the operations of the sharing circuit according to the seventh embodiment at the time of a register control mode and time of an image data streaming mode. FIG. 39A shows the power supply voltage VDD/VAA, FIG. 39B shows the reference clock (master clock) MCLK, FIG. 39C shows the signal of the input/output terminal PIN1, and FIG. 39D shows the signal of the input/output terminal PIN2.

After turning on the power, after the power on reset, as shown in FIG. 37, the switches SW3 and sW4 become ON, and the operation enters into the register control mode. In this case, the register is rewritten by using the input/output terminals PIN1 and PIN2, and the sensor is set. After that, the register is set by switching the sensor to the image output mode. As shown in FIG. 34, the switches SW3 and SW4 are turned OFF and the switches SW1 and SW2 are turned ON, then the register control mode is ended.

In the image data streaming mode, as shown in FIG. 38, the switches SW1 and SW2 are ON and the switches SW3 and SW4 are OFF. The data which are obtained by parallel-to-serial conversion of the image data comprised of a plurality of bits by the serializer are driven by the differential output circuit 351 and are output from the input/output terminals PIN1 and PIN2.

In the solid-state imaging device 100Q, as shown in FIG. 39, the system after turning on the power is reset by the power-on reset, whereby the operation enters into the register control mode. Phase adjustment etc. of the internal pulses are executed from the outside until the mode ends. After receiving a mode ending command, the operation enters the image data streaming mode. The data obtained by parallel-to-serial conversion for converting the image data comprised of a plurality of bits from parallel data to serial data at the serializer 342 are driven by the differential output circuit 351 and are output from the input/output terminals (control pins) PIN1 and PIN2.

In this way, in the seventh embodiment, for example, the parallel output signal pins are combined to form a single system of output pins. Further, it becomes possible to further decrease the pins which are necessary for driving by sharing the pin driving pulse input pin and output signal-use pin, by setting the external driving pulse as φMCLK (reference clock), and by using them as output and control-use pins (PIN1 and PIN2).

According to the seventh embodiment, in addition to the same effects as the effects by the sixth embodiment explained above, the following effects can be obtained. That is, according to the seventh embodiment, the number of drive pins can be further decreased. Therefore, by arranging the peripheral circuit on the second substrate 120S, there is the advantage that the imaging device can be applied to an electronic apparatus which is used for an application restricted as to mounting size, number of connectable cables, cable lengths, installation heights, and so on in view of requirements for installation of the camera such as, for example, a monitoring camera, medical endoscope-use camera, or the like.

Eighth Embodiment

Figure 40:
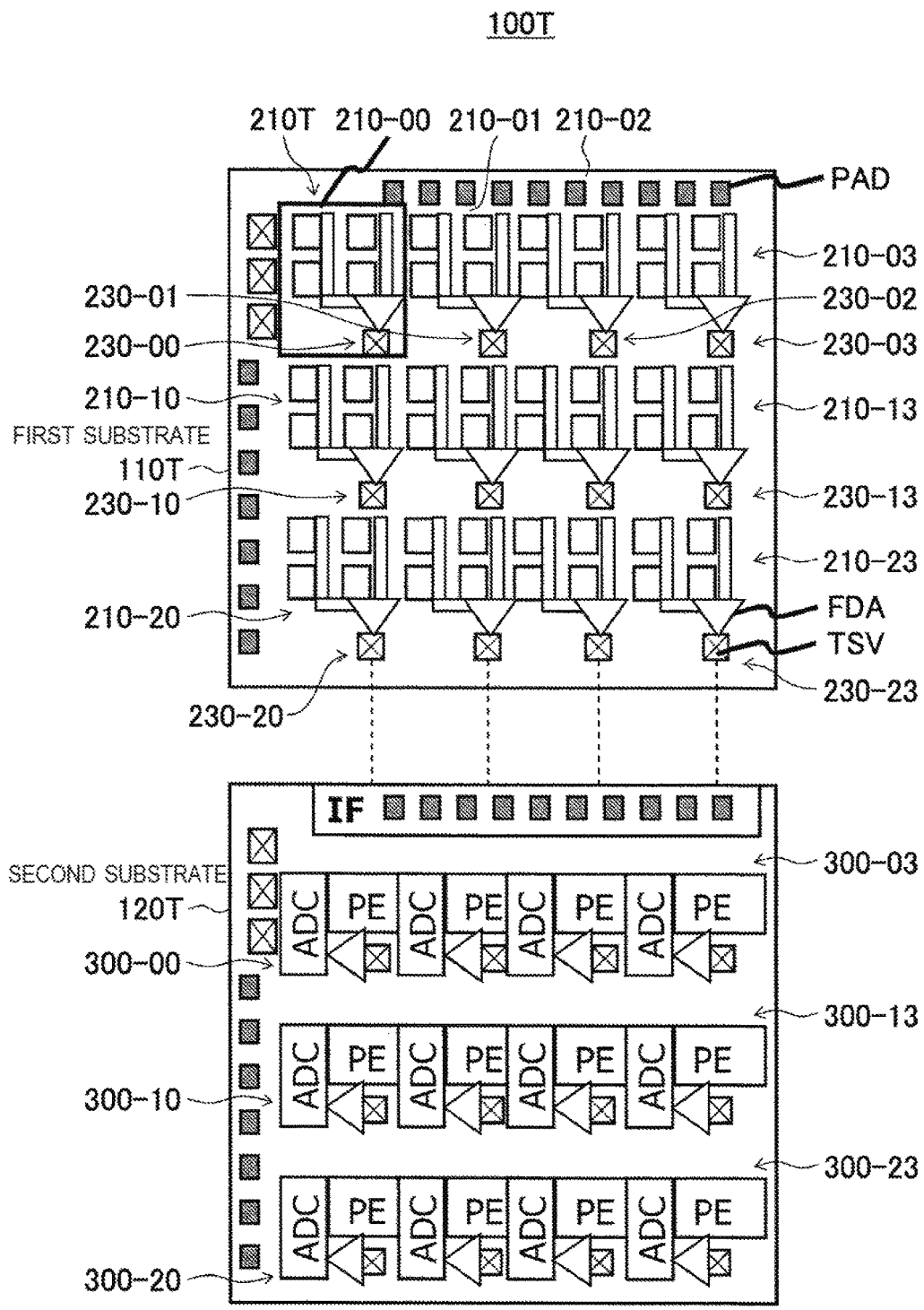
FIG. 40 is a view for explaining an example of the configuration of a solid-state imaging device according to an eighth embodiment of the present invention.

FIG. 40 is a view for explaining an example of the configuration of a solid-state imaging device according to an eighth embodiment of the present invention.

The difference of a solid-state imaging device 100T according to the eighth embodiment from the solid-state imaging devices 100 and 100A to 100S in the first to seventh embodiments explained above is as follows. In the solid-state imaging device 100T according to the eighth embodiment, a photosensitive part 210T which is arranged on a first substrate 110T is divided into a plurality of sections. The units of divided photosensitive sections 210-00 to 210-03, 210-10 to 210-13, and 210-20 to 210-23 are connected through divided relay sections 230-00 to 230-03, 230-10 to 230-13, and 230-20 to 230-23 to corresponding peripheral circuit sections 300-00 to 300-03, 300-10 to 300-13, and 300-20 to 300-23 which are arranged in a divided manner on the second substrate 120T.

Note that, FIG. 40 exemplifies a case where the divided photosensitive sections and the peripheral circuit sections corresponding to the former are arranged in a matrix comprised of 3 rows and 4 columns, but this is shown simplified in order to facilitate understanding. The present invention is not limited to this configuration.

According to the solid-state imaging device 100 of the eighth embodiment having such a configuration, not only are the same effects as those by the solid-state imaging devices 100 and 100A to 100S in the first to seventh embodiments explained above obtained, but also an ultra-thin type multi-camera module can be realized.

The solid-state imaging devices 100 and 100A to 100T explained above can be applied as imaging devices to digital cameras and video cameras, mobile terminals, or monitoring cameras, medical endoscope-use cameras or other electronic apparatuses.

Ninth Embodiment

Figure 41:
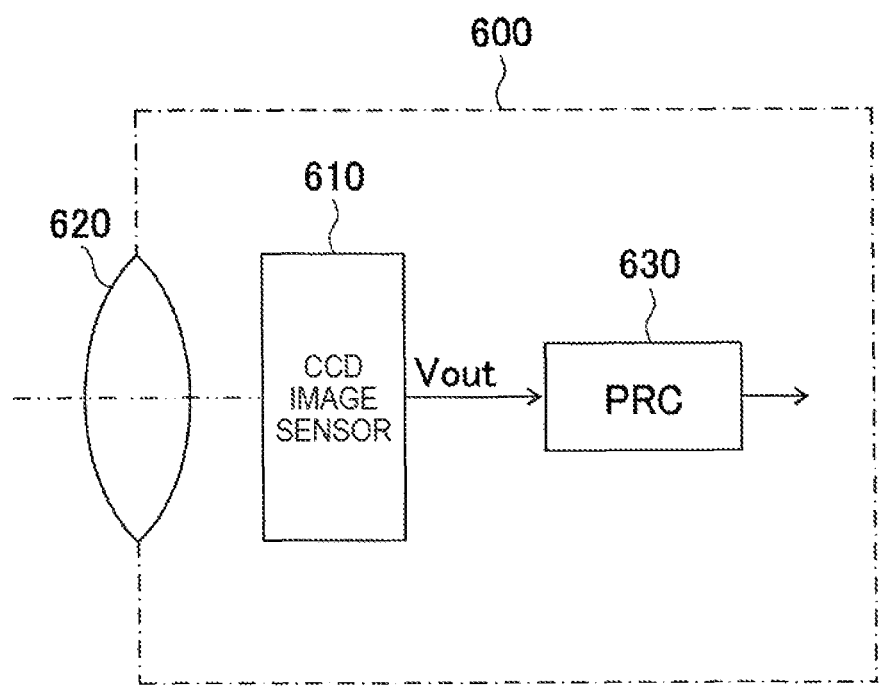
FIG. 41 is a view showing an example of the configuration of an electronic apparatus having a camera system mounted thereon to which a solid-state imaging device according to an embodiment of the present invention is applied.

FIG. 41 is a view showing an example of the configuration of an electronic apparatus mounting a camera system in which the solid-state imaging device according to an embodiment of the present invention is applied to the camera system.

The present electronic apparatus 600, as shown in FIG. 41, has a CCD/CMOS stacked type solid-state imaging device 610 according to the present invention to which the solid-state imaging devices 100 and 100A to 100T according to the present embodiment can be applied. Further, the electronic apparatus 600 has an optical system (lens etc.) 620 for guiding the incident light (forming the subject image) into the pixel region of this CCD/CMOS stacked type solid-state imaging device 610. The electronic apparatus 600 has a signal processing circuit (PRC) 630 for processing the output signal of the CCD/CMOS stacked type solid-state imaging device 610.

The signal processing circuit 630 applies predetermined signal processing with respect to the output signal of the CCD/CMOS stacked type solid-state imaging device 610. The image signal Processed in the signal Processing circuit 630 is projected as a moving picture on a monitor configured by a liquid crystal display or the like or can be output to a printer. Further, for example, it may be directly stored in a memory card or another storage medium. Various embodiments are possible As explained above, by mounting the solid-state imaging devices 100 and 100A to 100T explained before as the CCD/CMOS stacked type solid-state imaging device 610, it becomes possible to provide a high performance, small-sized, and low cost camera system. Further, it is possible to realize an electronic apparatus which is used for an application restricted as to mounting size, number of connectable cables, cable lengths, installation heights, and so on in view of requirements for installation of the camera such as, for example, a monitoring camera, medical endoscope-use camera, or the like.

REFERENCE SIGNS LIST 100, 100A to 100T . . . solid-state imaging devices 110, 110A to 110T . . . first substrates, 120, 120A to 120T . . . second substrates, 140 . . . through-via (TSV), 200 . . . imaging element part, 210 . . . photosensitive part (imaging part), 211 . . . pixel portion, 212-1 to 212-4 . . . charge transfer parts (vertical transfer parts, VCCD) 213-1 to 213-4 . . . output end parts, 220, 220-1 to 220-4 . . . conversion/output parts, 230, 230A to 230I . . . relay parts, 231, 231-1 to 231-4 . . . connecting parts, 232 . . . buffer amplifying part, 233 . . . AC coupling portion, 234 . . . voltage (V)-to-current (I) conversion circuit, 235 . . . M-bit ADC, 236 . . . N-bit ADC, 237 . . . amplifier (second amplifying part), 238 . . . feedback type amplifier, 240 . . . source-follower circuit, 241 . . . amplifying part, 242 . . . current source part, TI240 . . . output end, TO240 . . . output end, 250 . . . relay selecting part, 260 . . . sensor core, 300 . . . peripheral circuit part, 310 . . . ADC, 320 . . . digital memory, 330 . . . logic circuit, 341 . . . ADC, 342 . . . serializer, 343 . . . memory, 344 . . . timing generator (TG), 345 . . . DCDC converter (DCDC), 346 . . . memory, 350 . . . sharing circuit, 351 . . . differential output circuit, 353 . . . register controller, S1 to SW4 . . . switches, 400 . . . signal processing part (signal processing and power supply portion) 410 . . . FPGA, TG, 420 . . . image processing circuit (image processing IC) 430 . . . power supply circuit (power supply IC) 600 . . . electronic apparatus, 610 . . . CCD/CMOS stacked type solid-state imaging device, 620 . . . optical system, and 630 . . . signal processing circuit (PRC).

The invention claimed is:

1. A solid-state imaging device comprising:
a photosensitive part including a plurality of photoelectric conversion elements which are arranged in a matrix and a plurality of charge transfer parts which transfer the signal charges of the plurality of photoelectric conversion elements in unit of columns or rows,
a conversion/output part, arranged in accordance with the number of columns or rows, which converts the signal charges transferred in the charge transfer parts to electrical signals and outputs the results,
a peripheral circuit part which performs predetermined processing with respect to the electrical signals from the conversion/output part,
a relay part which relays transfer of the electrical signals from the conversion/output part to the peripheral circuit part,
a first substrate on which the photosensitive part and the conversion/output part are formed, and
a second substrate on which the peripheral circuit part is formed, wherein
at least the first substrate and the second substrate are stacked,
the relay part electrically connects the conversion/output part formed on the first substrate and the peripheral circuit part formed on the second substrate by a connecting part which passes through the substrates outside of a photosensitive region in the photosensitive part,
wherein the conversion/output part is formed outside of the photosensitive region in the photosensitive part on the first substrate;
wherein: in the relay part, in at least one of the regions corresponding to the outside of the photosensitive regions of the first substrate and the second substrate, a source-follower portion for amplifying the electrical signals from the conversion/output part is formed;
wherein: the source-follower portion includes an amplifying part and a current source part which are connected in series, where the amplifying part and the current source part are formed on the first substrate, and the amplified signals are output from the output end side of the amplifying part connected to the current source part, and the relay part connects the conversion/output part formed on the first substrate and the input end of the amplifying part of the source-follower portion and connects the output end side of the amplifying part and the peripheral circuit part formed on the second substrate through the connecting part; and
wherein the relay part includes a feedback type amplifier which amplifies the electrical signals from the conversion/output part in a region corresponding to the outside of the photosensitive region of the first substrate.

2. The solid-state imaging device according to claim 1, wherein
on the first substrate, between the output end side of the amplifying part and the connecting part, a buffer part for buffering the electrical signals output by the source-follower portion is formed.

3. The solid-state imaging device according to claim 1, wherein
the connecting part and the peripheral circuit part formed on the second substrate are electrically connected by AC coupling.

4. The solid-state imaging device according to claim 1, wherein between the output end side of the amplifying part and the connecting part, a voltage-to-current conversion part for converting the voltage signal amplified by the source-follower portion to the current signal is formed.

5. The solid-state imaging device according to claim 1, wherein
on the first substrate, a first analog-to-digital converter (ADC) which converts the output signal of the source-follower portion from an analog signal to a digital signal is formed on the output end side of the amplifying part, and
on the second substrate, a second ADC which converts the output signal of the source-follower portion transferred through the connecting part from an analog signal to a digital signal is formed in the input stage of the peripheral circuit part.

6. The solid-state imaging device according to claim 1, wherein:
on the first substrate, a second amplifying part for amplifying the electrical signals output by the source-follower portion is formed on the output end side of the amplifying part,
the connecting part includes a first connecting section to which the output end side of the amplifying part in the source-follower portion is connected and a second connecting section which is connected to the output end of the second amplifying part, and
on the second substrate, the first connecting section and the second connecting section are connected to the peripheral circuit part.

7. The solid-state imaging device according to claim 1, wherein
the conversion/output part includes a floating diffusion part for converting the signal charges to the voltage signals.

8. The solid-state imaging device according to claim 1, wherein
the conversion/output part includes
a floating diffusion part for converting the signal charges to the voltage signals and
a buffer part which outputs the voltage signals of the floating diffusion part as electrical signals.

9. The solid-state imaging device according to claim 1, which includes a relay selecting means for selectively connecting the plurality of charge transfer parts and the connecting part.

10. The solid-state imaging device according to claim 9, wherein
the relay selecting means can add or thin signal charges of the plurality of parallel-arranged charge transfer parts.

11. The solid-state imaging device according to claim 1, wherein:
the first substrate is formed by a first conductivity type substrate, and
the second substrate is formed by a second conductivity type substrate.

12. The solid-state imaging device according to claim 1, wherein
the first substrate is formed by an n-type substrate or n-well and has a vertical type overflow drain structure.

13. The solid-state imaging device according to claim 1, wherein
on the second substrate, at least an analog-to-digital converter (ADC) for processing the output signals of the conversion/output part and a serializer for converting the image data comprised of a plurality of bits from parallel data to serial data are formed.

14. The solid-state imaging device according to claim 13, wherein
on the second substrate, a voltage generation circuit and drive pulse generator are formed.

15. The solid-state imaging device according to claim 13, wherein
on the second substrate, a means for sharing terminals for drive pulses/output signal pulses is formed.

16. A method for producing a solid-state imaging device comprising:
a step of forming, on a first substrate, a photosensitive part including a plurality of photoelectric conversion elements which are arranged in a matrix and a plurality of charge transfer parts which transfer signal charges of the plurality of photoelectric conversion elements in unit of columns or rows and a conversion/output part, arranged in accordance with the number of columns or rows, which converts the signal charges transferred in the charge transfer parts to electrical signals and outputs the results,
a step of forming, on a second substrate, at least a peripheral circuit part which performs predetermined processing with respect to the electrical signals from the conversion/output part, and
a step of, in a state where at least the first substrate and the second substrate are stacked, electrically connecting the conversion/output part formed on the first substrate and the peripheral circuit part formed on the second substrate by a connecting part which passes through the substrates outside of a photosensitive region in the photosensitive part, wherein
the conversion/output part is formed outside of the photosensitive region in the photosensitive part on the first substrate;
wherein in a relay part, in at least one of the regions corresponding to the outside of the photosensitive regions of the first substrate and the second substrate, a source-follower portion for amplifying the electrical signals from the conversion/output part is formed;
wherein the source-follower portion includes an amplifying part and a current source part which are connected in series, where the amplifying part and the current source part are formed on the first substrate, and the amplified signals are output from the output end side of the amplifying part connected to the current source part, and the relay part connects the conversion/output part formed on the first substrate and the input end of the amplifying part of the source-follower portion and connects the output end side of the amplifying part and the peripheral circuit part formed on the second substrate through the connecting part; and
wherein the relay part includes a feedback type amplifier which amplifies the electrical signals from the conversion/output part in a region corresponding to the outside of the photosensitive region of the first substrate.

17. An electronic apparatus comprising:
a solid-state imaging device,
an optical system forming an image in a photosensitive part in the solid-state imaging device, and
a signal processing part for processing output signals of the solid-state imaging device, wherein
the solid-state imaging device has
a photosensitive part including a plurality of photoelectric conversion elements which are arranged in a matrix and a plurality of charge transfer parts which transfer signal charges of the plurality of photoelectric conversion elements in unit of columns or rows, a conversion/output part, arranged in accordance with the number of columns or rows, which converts the signal charges transferred in the charge transfer parts to electrical signals and outputs the results, a peripheral circuit part which performs predetermined processing with respect to the electrical signals from the conversion/output part, a relay part which relays transfer of the electrical signals from the conversion/output part to the peripheral circuit part, a first substrate on which the photosensitive part and the conversion/output part are formed, and a second substrate on which the peripheral circuit part is formed, wherein at least the first substrate and the second substrate are stacked, the relay part electrically connects the conversion/output part formed on the first substrate and the peripheral circuit part formed on the second substrate by a connecting part which passes through the substrates outside of a photosensitive region in the photosensitive part, wherein the conversion/output part is formed outside of the photosensitive region in the photosensitive part on the first substrate;

wherein in the relay part, in at least one of the regions corresponding to the outside of the photosensitive regions of the first substrate and the second substrate, a source-follower portion for amplifying the electrical signals from the conversion/output part is formed;

wherein the source-follower portion includes an amplifying part and a current source part which are connected in series, where the amplifying part and the current source part are formed on the first substrate, and the amplified signals are output from the output end side of the amplifying part connected to the current source part, and the relay part connects the conversion/output part formed on the first substrate and the input end of the amplifying part of the source-follower portion and connects the output end side of the amplifying part and the peripheral circuit part formed on the second substrate through the connecting part; and wherein the relay part includes a feedback type amplifier which amplifies the electrical signals from the conversion/output part in a region corresponding to the outside of the photosensitive region of the first substrate.

* * * * *